United States Patent [19]

Underwood et al.

[11] Patent Number: 5,600,787
[45] Date of Patent: Feb. 4, 1997

[54] METHOD AND DATA PROCESSING SYSTEM FOR VERIFYING CIRCUIT TEST VECTORS

[75] Inventors: Wilburn C. Underwood, Austin; Haluk Konuk, Capitola; Wai-on Law; Sungho Kang, both of Austin, all of Tex.

[73] Assignee: Motorola, Inc., Schaumburg, Ill.

[21] Appl. No.: 251,068

[22] Filed: May 31, 1994

[51] Int. Cl.⁶ .................................................. G06F 11/00
[52] U.S. Cl. ........................... 395/183.06; 395/183.09; 371/27
[58] Field of Search .................. 395/183.06, 183.08, 395/183.09, 183.1, 183.13; 371/27, 28.1; 324/73.1

[56] References Cited

U.S. PATENT DOCUMENTS 5,056,094 10/1991 Whetsel .................................. 371/25.1
5,291,495 3/1994 Udell, Jr. ................................ 371/22.3

*Primary Examiner*—Vincent P. Canney
*Attorney, Agent, or Firm*—Keith E. Witek

[57] ABSTRACT

A test vector system (157) and method for generating and verifying test vectors for testing integrated circuit speed paths involves accessing a circuit model (160), a list of circuit paths (162) and a test vector verifier (165). A single circuit path, referred to as a selected path, is selected from the paths (162). Once logical constraints are set, hazard-free logical values and logical values for both the second test clock cycle and the first test clock cycle are justified. Test vectors are generated in response to the justified values and the test vectors are used as input to the test vector verifier. The test verifier produces patterns that provide robust delay path fault tests for the given path. The test patterns are serially shifted and double-clocked in an integrated circuit or electrical circuit manufactured in accordance with circuit model (160) to determine time delay path faults.

25 Claims, 37 Drawing Sheets

METHOD AND DATA PROCESSING SYSTEM FOR VERIFYING CIRCUIT TEST VECTORS

FIELD OF THE INVENTION

The present invention relates generally to data processing systems, and more particularly, verification of circuit test vectors for circuit path delay testing.

BACKGROUND OF THE INVENTION

The prior art in path-delay testing dates to 1985, with the definition of a delay model based on path delay faults. This delay model based on path delay faults taught algorithms to generate tests for path-delay faults in combinational logic circuits. Due to the fact that nobody actually produces purely combinational circuits any more, the only way for these algorithms to be applied to a real circuit is essentially to double each memory device in the circuit so that it can store the two patterns (first clock cycle pattern and second clock cycle pattern) required for the path-delay test as completely independent patterns. This would roughly double the size of the memory portion of the circuit (the section 12 of FIG. 1), which no price-competitive manufacturer is willing to do. As a consequence, all these prior combinational logic approaches to path-delay testing remain largely academic exercises which cannot be used in modern integrated circuit design.

Test generation methods that could be applied to path-delay faults in standard scan sequential circuits first began to appear in 1991. These methods were the first to make feasible the path-delay testing of real circuits. Unfortunately, the methods described in all known papers/publications/patents that target standard scan sequential circuits used a simplified logic algebra that did not include hazard-free values. A hazard-free being a logic value that is to remain at the same logic level and is free of any timing glitches. As a consequence, the methods are unable to target robust tests, which means that any tests they generate may be invalidated or incorrect due to timing problems or voltage glitches in other parts of the circuit. In other words, by not using hazard-free values, a time delay fault may be inaccurately detected when a time delay fault really didn't occur or vice versa, an actual time delay fault could go unreported due to a static timing hazard or glitch. A recent testing method claims to be able to generate robust tests for general sequential circuitry, including standard scan sequential circuits. The absence of certain necessary logic values, however, means that this algorithm is defective and may declare a path untestable even when a robust test exists. None of the prior art provides an error-free method for generating robust tests for standard scan sequential circuitry.

Also in the modern integrated circuit industry, the use of the Boolean difference has not been possible in the generation of robust path-delay tests through custom logic blocks whose structure is not specified, due to the fact that any data structure used for Boolean differences requires huge amount of physical memory to represent the Boolean difference data.

Furthermore, in the modern integrated circuit industry, a stuck-at fault simulation methodology is based on the (PPSFP) Parallel-Pattern Single-Fault Propagation method. The PPSFP method has not been applied to general sequential circuits, due to the intrinsic inefficiencies encountered in simulating sequential devices and feedback loops across multiple clock cycles in such circuits. Thus, when applying the PPSFP method for fault simulation testing, combinational circuits are used for the test simulation.

However, the usual PPSFP method cannot be used for delay fault testing, due to the fact that the PPSFP method assumes the independence of each pattern and that circuit activity ceases when a single pattern has been processed. Since all delay tests are multi-pattern tests, any application of the standard PPSFP method to the simulation of such tests would be non-functional. Furthermore, in a standard scan path testing environment, a second test vector comes from the functionality of the circuit rather than being directly and independently loaded from an external source.

Current simulators for delay faults are built on either a PPSFP with the added assumption of an enhanced scan design methodology, rendering them incapable of being used for a standard scan design environment, or concurrent fault simulators for general sequential logic, which renders them very inefficient compared to PPSFP methods. Furthermore, current simulators lack the ability to support multiple clock cycles and hazard free value testing, thus a path-delay test verification process in a standard scan design environment cannot be accomplished.

Also, the generation of test vectors to circuit path delay testing can be a complex matter. Therefore, the code used to generate the test vector may have a "bug" or be erroneous and generate a vector which may not function properly to test a path. Therefore, a need exists to both generate a test vector using a first method and verify the correctness of the test vector using a second method wherein errors in the first method are not likely to occur again in the second method.

SUMMARY OF THE INVENTION

The previously mentioned disadvantages are overcome and other advantages achieved with the present invention. The invention comprises a method for verifying a test vector for a logic circuit. The method begins by providing the test vector to a test verifier wherein the test vector is generated to test a specific circuit path within an electrical circuit. The test of the specific circuit path giving electrical propagation time delay information for the specific circuit path. The test vector defining input values which logically affect the specific circuit path for a first test clock cycle and identifying input values which logically affect the specific circuit path for a second test clock cycle. Providing to the test verifier a circuit model which models the operation of the electrical circuit. Generating input values and output values for all circuit elements along the specific circuit path for both the first test clock cycle and the second test clock cycle by accessing the circuit model and the test vector. Performing logical operations on the input and output values of the circuit elements along the specific circuit path to determine whether the test vector, as input to the test verifier, correctly tests the specific speed path.

In another form, the invention comprises a test system for generating and verifying the functionality of a speed path test vector. The test system comprising a medium for modeling, a medium for providing, and a medium for verifying. The medium for modeling being used to model the operation of an electrical circuit having a circuit path. The medium for providing being used to provide a test vector for testing a propagation speed of the circuit path. The test vector defining input values and output values along the circuit path defined via the medium for modeling. The input and output values having a first set of values defined for a first test clock cycle and a second set of values defined for a second test clock cycle. The test vector being generated by a first process within the medium for providing. The medium for verifying being used to verify the test vector receiving the test vector from the medium for providing. The medium for verifying accessing the circuit model and simulating the test vector within a portion of the circuit model to verify that the test vector correctly tests the circuit path for the propagation speed. The verification using a second process which is different from the first process.

The present invention will be more clearly understood from the detailed description below in conjunction with the accompanying drawings.

Figure 1:
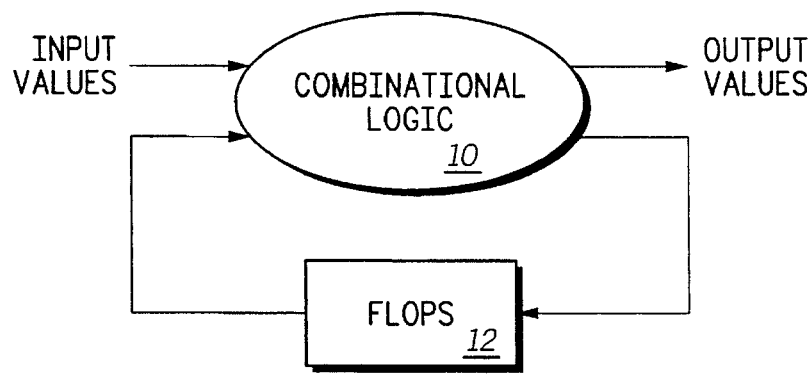
FIG. 1 illustrates, in a block diagram, a circuit which can be path delay tested in accordance with the present invention.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention provides both a method and an apparatus to perform robust path-delay test verification of an integrated circuit. A circuit path refers to a connected series of elements of an integrated circuit, with the first element in the series referred to as the head of the path and the last element in the series referred to as the tail of the path. A path delay refers to the time required for a logic value change on the head of the path to cause a logic value change on all other elements in the circuit path up to the tail of the path. The speed at which an integrated circuit can work is determined by the largest of the path delays (most time consuming) in the entire integrated circuit. A timing error for such a circuit path is said to have occurred when a path delay exceeds the system clock cycle, which is the amount of time required for the system clock for the integrated circuit to go through one complete period. When a circuit path shows such a timing error, the circuit path is said to possess a path delay fault. A robust test for a path delay fault is a test that guarantees that the circuit response will differ from the expected/passing response whenever the path possesses a path delay fault, regardless of the presence or absence of path delay faults on other circuit paths.

For example, assume that a circuit path comprises a first scannable flip-flop which has an output coupled to an input of an AND gate wherein the AND gate has an output coupled to an input of a second scannable flip-flop. The first and second scannable flip-flops (and any clocked component/circuit in the integrated circuit which contains the first and second scannable flip-flops) are clocked at a predetermined speed by applying a clock signal to the integrated circuit. In order to test this example circuit path, an initial logic value is scanned into a flip-flop preceding the first scannable flip-flop or is provided to an input pin to allow a logic value A to appear on the input of the first scannable flip-flop. This logic value A will not propagate to the output until the first scannable flip-flop is clocked. Also, an initial logic value B is provided at the output of the second scannable flip-flop. Assume for the sake of example that A=0 and B=1, although any combination of values may occur for any type of circuit path.

Various signals are set or predetermined (as discussed herein) along the circuit path to ensure that when A=0 is clocked into the first scannable flip flop via a first clock cycle that the value A=0, when applied down the circuit path, results in B=1 changing to B=0 at a second clock cycle. Therefore, the A=0 has just one clock cycle from the time it is latched into the first scannable flip-flop to propagate down the circuit path and change B from a logic '1' to a logic '0'. If B stays a logic '1' after assertion of the second clock cycle, then the A=0 signal did not propagate through the circuit path in time to affect the second scannable flip-flop. This indicates that the clock speed is too fast for this circuit path (i.e. signals are not arriving at critical clocked inputs before the clocking is occurring). If the signal B is changed to a '0' from a '1' then the circuit path can properly operate at the current clock cycle and under current conditions.

Therefore, for every circuit path in an electrical circuit or integrated circuit, one can determine that a path X is operable up to 47 MHz, path Y is operable up to 113 MHz, and Z is operable up to 80 MHz. This information can then be used to determine what clock speed is maximal for a given circuit or may be used to determine which exact circuit paths need to be redesigned to achieve a higher clock speed for a circuit. For example, if the circuit described above was to run at 60 MHz, path X would be a problem and most likely would require redesign, a new layout, or different manufacturing/processing.

The method of the present invention operates on a circuit model of an integrated circuit (usually a computer simulated model of an integrated circuit) and a database which identifies various circuit paths of this circuit model. The circuit model must be a circuit model in which all circuit memory elements are scannable flip-flops. A circuit path is selected from the set of circuit paths and a set of logic value constraints for elements of the circuit model that are required to achieve a path-delay test are determined. Some of these logic value constraints, referred to as hazard-free logic values, may be required to be free of timing hazards. Logic values which cause these hazard-free logic values to be produced in the circuit model are determined first. Next, logic values to cause logic value constraints for the second clock cycle to be produced in the circuit model are determined. Finally, logic values to cause logic value constraints for the first clock cycle to be produced in the circuit model are determined. A test vector comprises the logic values on input terminals for the integrated circuit and on the scannable flip-flops for both the first clock cycle and the second clock cycle is generated after all logical values have been set for both clock cycles one and two.

The present invention overcomes many of the disadvantages stated in the background and can be more fully understood with reference to the FIGS. 1–42 herein. In summary, the present invention is a method of verifying a plurality of test vectors. The number of patterns needed for path-delay testing in a standard scan environment is known in advance to be exactly two. Therefore, the internal data structure of a test vector verifier is a two-item bit word array allowing the storage of circuit values for both clock cycles needed for a single test. This allows each bit in a machine word, where the machine word is the maximum amount of bits a system can process at a time, to store a separate test pattern. The input values of the test vector are loaded into the internal data structure for the test vector verifier for the first test clock cycle and the second test clock cycle. The test vector verifier proceeds by loading the values for clock cycle one on the scan flip-flops, and loading the values for both clock cycle one and clock cycle two on circuit inputs. Next, the test vector verifier generates input values and output values for all circuit elements along the specific circuit path for both the first test clock cycle and the second test clock cycle by accessing the circuit model, which is a model of the circuit being tested, and the internal data structure of the test vector verifier. In addition to the standard techniques for element evaluation, the fault simulation method computes a hazard-free-value flag during processing of the second clock cycle, thus enabling simulation of robust and hazard-free path delay tests. Finally, the paths under test are simulated in a serial fashion. For each path simulated, a resulting output is produced indicating which pattern or plurality of patterns provide robust tests for the given path.

FIG. 1 generally illustrates a portion of an integrated circuit having a set of scannable flip-flops 12 (i.e., storage devices) and a combinational logic section 10. FIG. 1 also illustrates input values which may come from other storage devices (i.e. scannable flip-flops) or integrated circuit input terminals (input pins). Output values are provided to storage devices or to external terminals (output pins) of the integrated circuit. A circuit path to be tested in this portion of an integrated circuit could consist of: (1) a connected series of circuit elements beginning with a circuit input terminal, containing at least one of the logic devices in the combinational logic section 10, and ending with an external terminal of the integrated circuit, (2) a connected series of circuit elements beginning with a storage device, containing at least one of the logic devices in the combinational logic section 10, and ending with an external terminal of the integrated circuit, (3) a connected series of circuit elements beginning with a circuit input terminal, containing at least one of the logic devices in the combinational logic section 10, and ending with a storage device, or (4) a connected series of circuit elements beginning with a storage device, containing at least one of the logic devices in the combinational logic section 10, and ending with a storage device.

Figure 2:
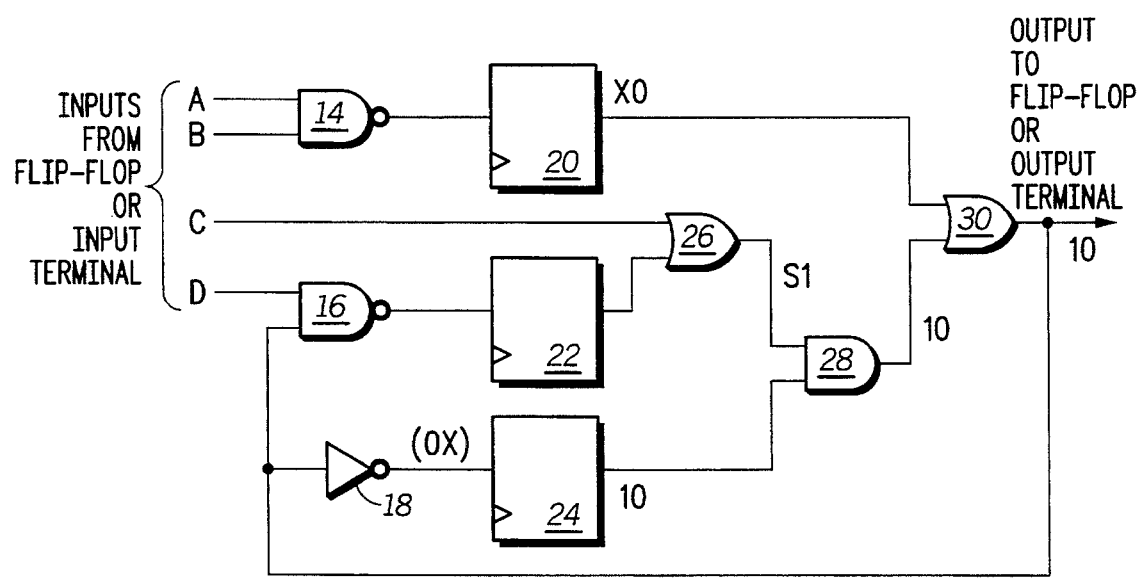
FIGS. 2–5 illustrate, in block diagrams, a specific circuit which may be path delay tested and how test logic values are determined within the specific circuit in accordance with the present invention.

Although FIG. 1 illustrates a generic type of circuit which may be tested a specific example is most useful in understanding the path delay method discussed herein. FIGS. 2 through 5 illustrate a specific circuit which may be used to determine path delays. The scannable flip-flops 20, 22, and 24 correspond to the set of scannable flip-flops 12 of FIG. 1. The combinational logic devices 14, 16, 18, 26, 28, and 30 correspond to the combinational logic section 10 of FIG. 1. The example of a circuit path to be tested in this circuit is the path beginning with scannable flip-flop 24, the head of the path, containing combinational logic devices 28 and 30, and ending at the output to a scannable flip-flop or output terminal, the tail of the path. A test for a path delay fault on this circuit path must first establish the initial value on the head of the path, scannable flip-flop 24 (an initial value being output from flip-flop 24 which may be serially scanned into 24). After a first clock cycle, the first time interval in which the system clock for the integrated circuit goes through one complete period following the establishment of the initial value on the head of the path, the second value for the head of the path has been clocked into the storage element from the input (from inverter 18). After a second clock cycle, the second time interval in which the system clock for the integrated circuit goes through one complete period following the establishment of the initial value on the head of the path, the response value for the tail of the path has either been clocked into a storage element flip-flop or simply provided to the output terminal as indicated in FIG. 1. FIG. 2 illustrates the logic values that are necessary on the inputs and outputs of circuit devices on the example path in order to achieve a robust test of the example circuit path. These logic values are selected from the logic value set that has been designed to be used for test generation for path delay faults. This logic value set is given in TABLE 1 below.

TABLE 1

| LOGIC VALUE | LOGIC VALUE FOR FIRST CLOCK CYCLE | LOGIC VALUE FOR SECOND CLOCK CYCLE | ADDITIONAL INFORMATION |
| --- | --- | --- | --- |
| 00 | 0 | 0 | Not guaranteed hazard-free but can be made into S0 |
| 01 | 0 | 1 | Rising transition for path test |
| 0Y | 0 | Y | Y represents both Z and signals constrained to X |
| 0X | 0 | X | Can be made into S0 |
| 10 | 1 | 0 | Failing transition for path test |
| 11 | 1 | 1 | Not guaranteed hazard-free but can be made into S1 |
| 1Y | 1 | Y | Y represents both Z and signals constrained to X |
| 1X | 1 | X | Can be made into S1 |
| Y0 | Y | 0 | Y represents both Z and signals constrained to X |
| Y1 | Y | 1 | Y represents both Z and signals constrained to X |
| YY | Y | Y | Y represents both Z and signals constrained to X |
| YX | Y | X | Y represents both Z and signals constrained to X |
| X0 | X | 0 | Can be made into S0 |
| X1 | X | 1 | Can be made into S1 |
| XY | X | Y | Y represents both Z and signals constrained to X |
| XX | X | X | Can be made into S0 or S1 |
| S0 | 0 | 0 | Guaranteed hazard-free |
| S1 | 1 | 1 | Guaranteed hazard-free |
| SZ | z | z | Guaranteed hazard-free |
| 00T | 0 | 0 | Cannot be made into S0 |
| 0XT | 0 | X | Cannot be made into S0 |
| X0T | X | 0 | Cannot be made into S0 |
| XT0 | X | X | Cannot be made into S0 |
| 11T | 1 | 1 | Cannot be made into S1 |
| 1XT | 1 | X | Cannot be made into S1 |
| X1T | X | 1 | Cannot be made into S1 |
| XT1 | X | X | Cannot be made into S1 |
| XTB | X | X | Cannot be made into S0 or S1 |

For example, a logic value 10 (see the Output of FIG. 2) represents a value that is logic 1 during the first clock cycle and logic 0 during the second clock cycle, the logic value S1 represents a value that is logic 1 for both the first and second clock cycles and is free of any static timing hazard during these two clock cycles, logic value X0 represents a value that is logic 0 for the second clock cycle but whose logic value is not specified (a don't care) for the first clock cycle, and logic value 0X represents a value that is logic 0 for the first clock cycle but whose logic value is not specified for the second clock cycle. Since scannable flip-flop 24 has a value of logic '0' during the second clock cycle, the INVERTER 18 must input a value of logic '0' to the flip-flop 24 during the first clock cycle so that the system clock will cause this logic value '0' to be latched into the scannable flip-flop 24 during the second clock cycle, which is the reason that the logic value 0X has been listed as a required logic value for the INVERTER 18. If the path is functional at the operating speed, the Output of FIG. 2 will be initially '1' on the first clock cycle and latched as a '0' on the second clock cycle as indicated by the 10 label on the Output in FIG. 2.

Figure 3:
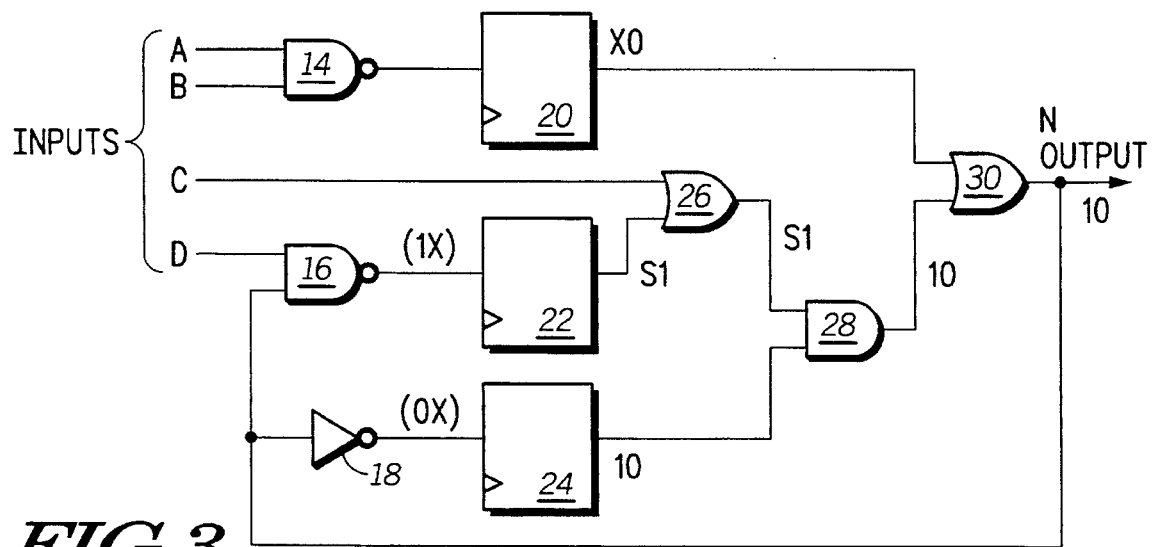

FIG. 3 illustrates the state of the circuit after justifying all the hazard-free logic values from FIG. 2. Justifying a logic value refers to the process of determining logic values in the circuit model, the determined logic values being assigned to circuit input terminals and to scannable flip-flops in such a way as to cause the logic value to be justified to occur in the circuit model and in the integrated circuit manufactured from the model. The only hazard-free value in FIG. 2 is the S1 that is placed on the OR gate 26, so FIG. 3 represents the changes made in the logic values of the circuit as a result of justifying this single hazard-free value. The output of OR 26 must be hazard-free due to the fact that the input from flip-flop 24 is a logical 10.

For example, if one input of the AND gate 28 is 10 (one in the first clock cycle and zero in the second clock cycle), then the output of OR 26 must be one in the first clock cycle to ensure that the output of AND 28 is a one in the first clock cycle. Furthermore, in the second clock cycle the output of OR 26 must be a one to ensure that the one to zero transition of the output of flip-flop 24 is the only input that alters the output of AND 28 in order to properly measure the selected circuit path. In other words, if the output of OR 26 is ever allowed to be zero even for a timing hazard's short time frame, the path under test is adversely affected and may not result in a proper determination of a path delay fault. The selected path (from flip-flop 24 to the Output) may be incorrectly deemed path delay functional at the given frequency because of a static hazard through gate 26.

In general, a static timing hazard is said to occur when a signal is to remain at the same logic level for some time period but changes to the opposite logic level on a transient basis before returning to its final value. For example, a signal that is to remain at logic 0 for two clock cycles may change briefly (i.e., "spike") to logic 1 at the start of the second clock cycle before settling back to its final value of logic 0.

In order to produce a hazard-free logic 1 (S1 in the logic value set used in this invention) on the output of an OR gate, it is only necessary to have S1 on at least one of the inputs of the OR gate. In this example circuit, we may choose either of two input devices to produce this hazard-free logic 1 and the choice has been arbitrarily made to assign S1 to the scannable flip-flop 22. Since the scannable flip-flop 22 must have logic value 1 during the second clock cycle as a consequence of the definition of the S1 value, the NAND gate 16 must have a value of logic 1 during the first clock cycle so that the system clock will cause this logic value to be latched into the scannable flip-flop 22 for the second clock cycle, which is the reason that the logic value 1X has been listed as a required logic value for the NAND gate 16.

Figure 4:
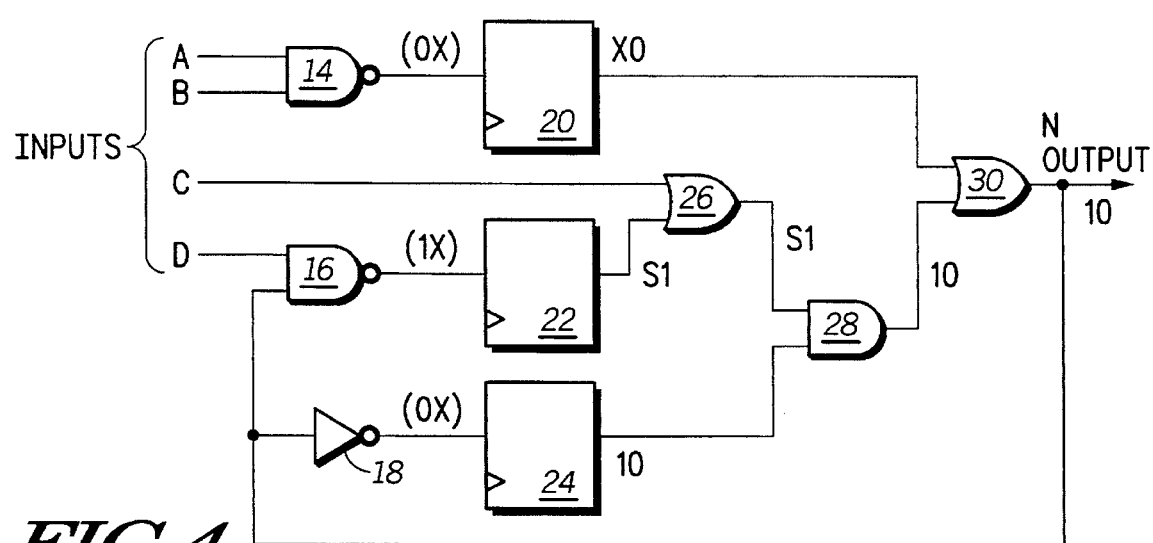

FIG. 4 illustrates the state of the circuit after justifying all the logic values for the second clock cycle from FIG. 3. The only value in FIG. 3 for the second clock cycle is the X0 that is placed on the scannable flip-flop 20, so FIG. 4 represents the changes made in the logic values of the circuit as a result of justifying this single value for the second clock cycle. Since the scannable flip-flop 20 must have logic value 0 during the second clock cycle, the NAND gate 14 must have a value of logic 0 during the first clock cycle so that the system clock will cause this logic value to be latched into the scannable flip-flop 22 for the second clock cycle, which is the reason that the logic value 0X has been listed as a required logic value for the NAND gate 14 in FIG. 4.

Figure 5:
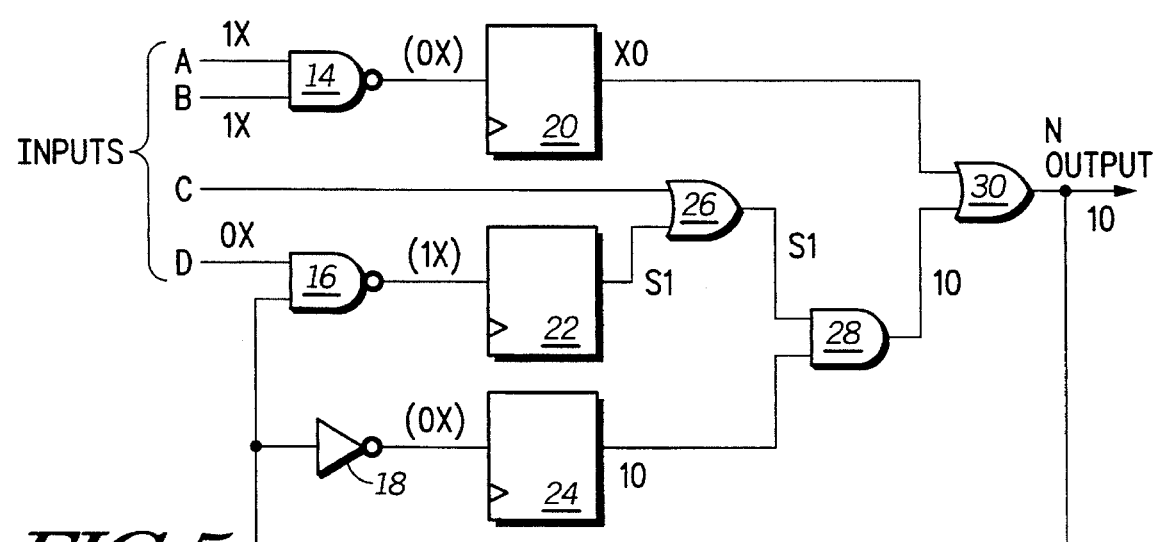

FIG. 5 illustrates the state of the circuit after justifying all the logic values for the first clock cycle from FIG. 4. The values in FIG. 4 for the first clock cycle are the 0X on the output of the NAND gate 14, the 1X on the output of the NAND gate 16, and the 0X on the output of the INVERTER 18. Therefore, FIG. 5 represents the changes made in the logic values of the circuit as a result of justifying these values for the first clock cycle. In order to produce a value of 0X on the NAND gate 14, it is necessary that all its input devices have a value of logic I in the first clock cycle, so the two circuit input terminals that are connected to the NAND gate 14 have both been assigned values of 1X. To produce a value of 1X on the NAND gate 16, it is only necessary that one of its input devices have a value of logic 0 for the first clock cycle. Since the input that comes from the OR gate 30 has value 10, it is necessary to assign the 0X value to the circuit input terminal that provides the other input to the NAND gate 16. Finally, to produce a 0X on the INVERTER 18, it is necessary that its input device have a value of logic 1 during the first clock cycle and the OR gate 30, which is the input device for the INVERTER 18, already has a value of logic 1 during the first clock cycle due to the requirement that its output change from logic 1 to logic 0 because it is on the circuit path to be tested. At this point the test vector for the example circuit and example path has been completely generated. The test vector consists of logic I during the first clock cycle on the circuit input terminals (both of them) that are connected to the NAND gate 14, logic 0 during the first clock cycle on the circuit input terminal that is connected to the NAND gate 16, logic 1 to be serially shifted into the scannable flip-flop 22 (since the first clock cycle value of logic value S1 is a logic 1) and logic 1 to be serially shifted into the scannable flip-flop 24 (since the first clock cycle value of logic value 10 is a logic 1).

Note that all circuit logic devices on the circuit path to be tested have undergone a transition from logic 1 in the first clock cycle to logic 0 in the second clock cycle, which is called a falling transition. This will not always be the case. One reason for this is that the specification of the test to be produced may require that the head of the path undergo a transition from logic 0 in the first clock cycle to logic 1 in the second clock cycle, which is called a rising transition. A second reason is that some combinational logic devices on the path to be tested may be inverting devices, such as an INVERTER, a NAND gate or a NOR gate. A rising transition on an input to an inverting device will produce a falling transition on the output and a falling transition on the input will produce a rising transition on the output, so some combinational logic devices on the path to be tested may undergo one type of transition while other combinational logic devices on the path undergo the opposite type of transition. Finally, some of the combinational logic devices on the path to be tested may be either inverting or non-inverting, depending on the value of other inputs. For example, a two-input EXCLUSIVE-OR gate will invert an input transition if its other input is S1 but will not invert the transition if its other input is S0. The particular type of transition to be undergone by each of the combinational logic devices on the path to be tested will change the input logic values that are required to achieve a robust test of the path.

Given the example illustrated via FIGS. 2–5, FIG. 6 illustrates a flowchart which describes how a robust speed path test vector is generated for any circuit. In a step 32, a path is selected from the list of paths for which path-delay tests are to be generated. In a step 34, certain required logic values for the path-delay test are determined from the description of the path and the circuit model, and these required values are set as constraints on the state of the circuit model that must be satisfied if a test is to be generated. If a path is found to be untestable in the step 34, then the path is declared untestable in a step 44. The logic value constraints from the step 34 are then justified, in a particular order depending on the type of constraint that is required. The first logic value constraints to be justified are the hazard-free values that are required to be free of timing hazards, which is accomplished in a step 36. If a path is found to be untestable in the step 36, then the path is declared untestable in the step 44. Next, the logic value constraints for the second clock cycle are justified in a step 38, and finally the logic value constraints for the first clock cycle are justified in a step 40. In a step 42, the test generation result is checked to see if values have been successfully determined to justify all the required logic value constraints, and if they have been successfully generated then a test vector is declared to have been generated and is saved as an output result vector in a step 46. If all possible values are tried (implicitly) and it proves impossible to justify all the required logic value constraints, then the selected path is declared to be untestable in the step 44. Only two clock cycles are required for this test because the integrated circuit is required to have scannable flip-flops as memory elements. This means that the first set of values required for the test vector can be serially shifted into the memory elements rather than having to be produced by the functionality of the integrated circuit.

Figure 6:
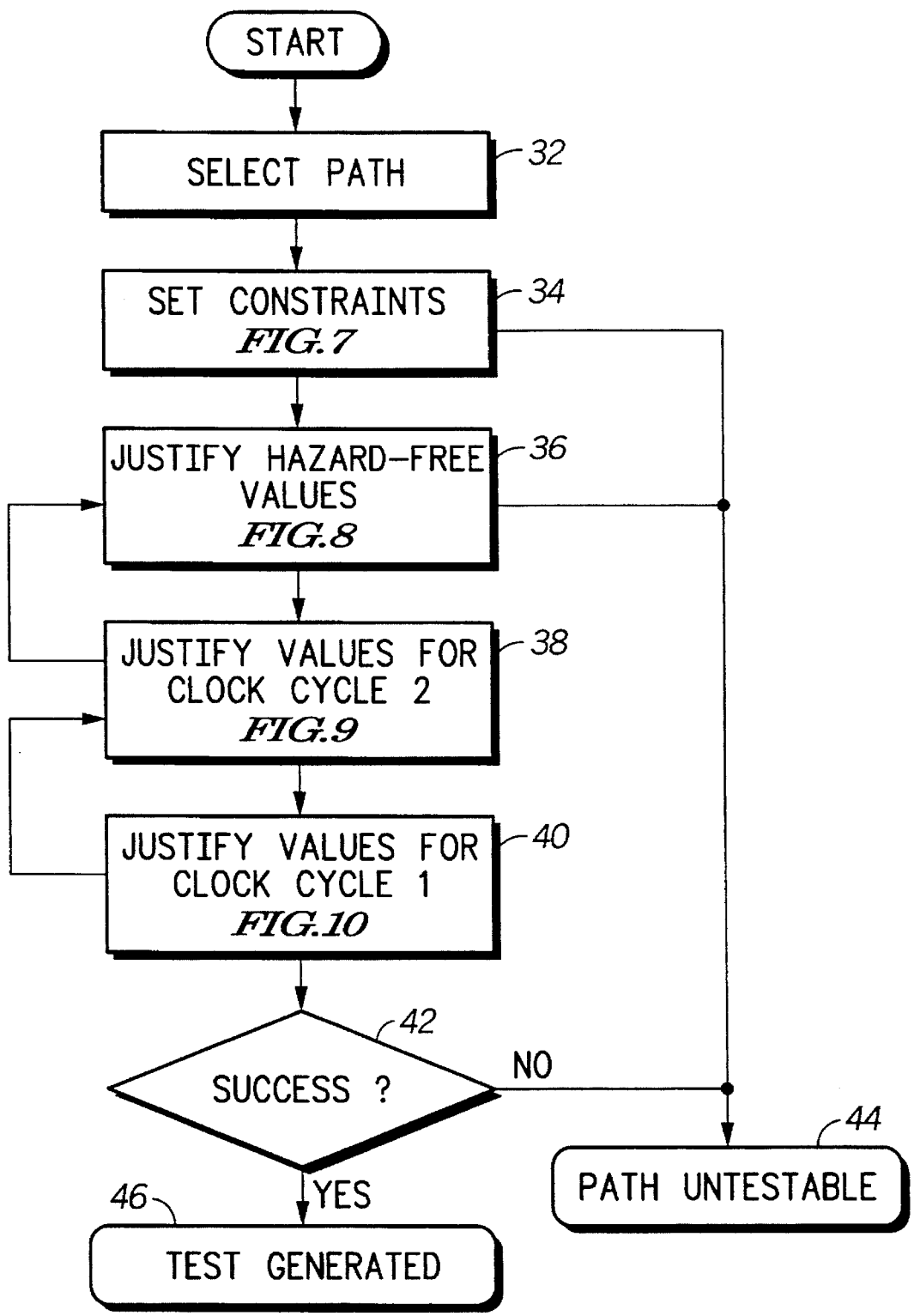
FIG. 6 illustrates, in a flowchart, a method for generating a test vector which is used to test a delay path in an electrical circuit in accordance with the present invention.
Figure 7:
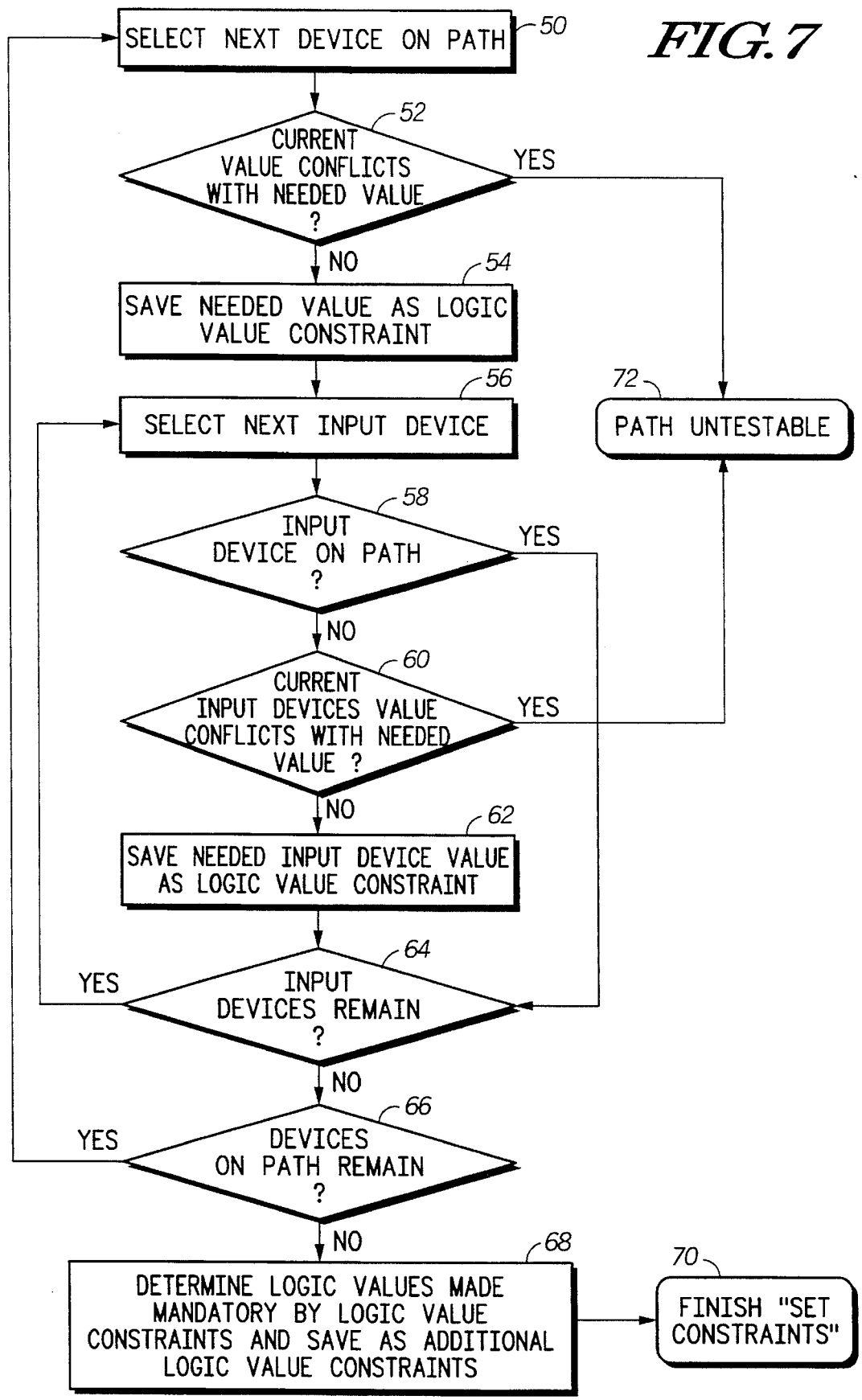
FIG. 7 illustrates, in a flowchart, several specific steps involved when setting logic constraints as illustrated in FIG. 6 in accordance with the present invention.

FIGS. 7–10 illustrate flowcharts wherein each flowchart further explains a step in FIG. 6. FIG. 7 illustrates the flowchart for the step 34 in FIG. 6. First, the next device on the circuit path to be tested is selected in a step 50. The current logic value on this circuit device is checked against the required logic value constraint for the device in a step 52. If the current logic value conflicts with the required logic value constraint, then it is not possible to satisfy the required logic value constraints and the path is declared to be untestable in a step 72. If the current logic value on the circuit device does not conflict with the required logic value constraint, then the required logic value constraint is saved as part of the record for the selected circuit device in a step 54. The next circuit device that is connected to the input pins of the selected circuit device is examined in a step 56. This input device is checked to see if it is on the circuit path to be tested in a step 58. If it is, then no further action is taken on the input device since it will previously have been a selected circuit device in the step 50 and its logic value constraints will already have been saved in the step 54, so flow moves to the step 64.

If the input device is not on the circuit path to be tested, then the current logic value of the input device is checked to see if it conflicts with the required logic value constraints for the input device in a step 60. If the current logic value of the input device does conflict with the required logic value constraint for the input device, then it is not possible to satisfy the required logic value constraints and the path is declared to be untestable in the step 72. If the current logic value of the input device does not conflict with the required logic value constraint for the input device, then in a step 62 the required logic value constraint is saved as part of the record for the input device. In a step 64, the selected circuit device is checked to see if there are other input devices that have not yet been examined and if there are, then the flow returns to the step 56. If there are no more unexamined input devices for the selected circuit device, then in a step 66 the path description is checked to see if there are more circuit devices on the path to be tested that have not yet been selected and if there are, then the flow returns to the step 50.

If there are no more circuit devices on the path to be tested that have not yet been selected, then a step 68 checks the circuit devices with logic value constraints to determine if there are other logic values made mandatory by these logic value constraints and if so, these other mandatory logic values are saved as additional logic value constraints for the circuit model. The step 68 is accomplished by a technique, known as backward implication, which is common to test generation procedures. For example, a value of logic 1 for an AND gate implies (requires) that all input devices for the AND gate also have a value of logic 1. Another example, is that an OR gate having a zero output requires that all inputs have a zero value. Following the step 68, the Set Constraints procedure is exited in a step 70.

Figure 8:
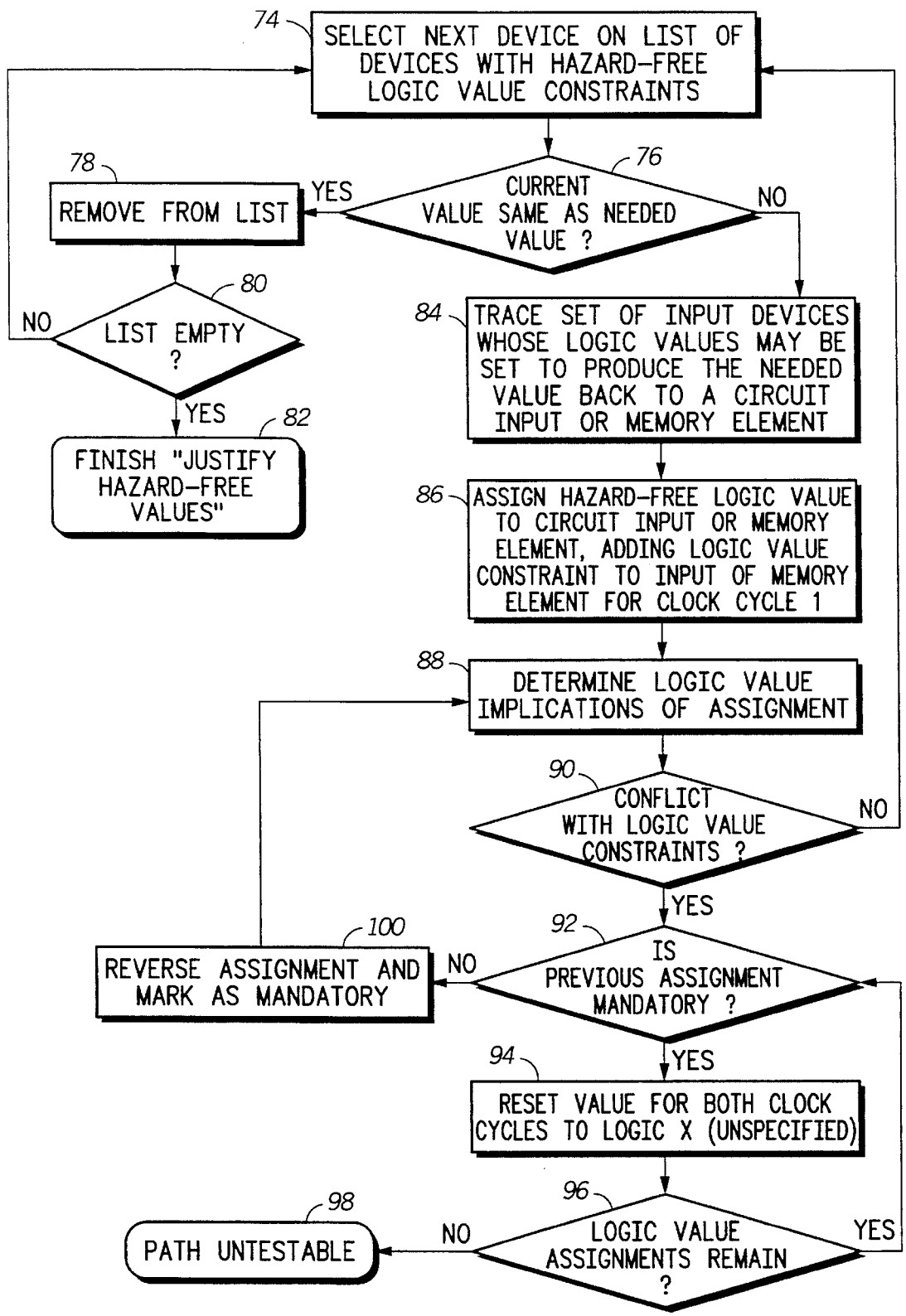
FIG. 8 illustrates, in a flowchart, several specific steps which are involved when justifying hazard-free logic values as illustrated in FIG. 6 in accordance with the present invention.

FIG. 8 illustrates the flowchart for the step 36 in FIG. 6. In a step 74 the next circuit device on the list of devices with hazard-free logic value constraints is selected. The selected circuit device is examined to see if its current logic value is the same as the logic value required by the logic value constraint in a step 76. If the current logic value is not the same as the logic value required by the logic value constraint, then in a step 84 a process of backtracing from the input devices of the selected circuit device is initiated. This process of backtracing consists of selecting an input device whose current logic value (and logic value constraint, if any such exists for this input device) is compatible with the input logic value needed to produce the hazard-free logic value specified by the logic value constraint on the selected logic device. When such an input device is identified, then the backtracing process is applied to the identified input device and this continues iteratively until a circuit input terminal or a scannable flip-flop is encountered. At this point, the hazard-free logic value that is needed to assist in producing the hazard-free logic value on the initially selected circuit device is assigned to the circuit input terminal or scannable flip-flop in a step 86. A step 88 performs a logic simulation to determine the logic value implications of the logic value assignment made in the step 86.

Circuit devices that are simulated are checked for conflict with their logic value constraints in a step 90. If no conflict is determined in the step 90, the flow returns to the step 74. If there is conflict between the current logic value and the logic value constraint for some circuit element in the step 90, then a step 92 examines the previous logic value assignment to see if it is a mandatory assignment, i.e., an assignment that is either required to have its present value by some logic value constraint in the circuit model, or has already had the inverse hazard-free value simulated and found to cause conflict. If the previous assignment is not mandatory, then in a step 100 its hazard-free logic value assignment is inverted and marked as mandatory and flow returns to the step 88. If the previous assignment is mandatory, then in a step 94 the circuit input terminal or scannable flip-flop to which the assignment had been made is returned to an unspecified state (logic value X) and the record of the previous logic value assignment is removed from the list of such records.

A step 96 examines the list of records of logic value assignments to see if more records remain on the list. If there are more records on the list, flow returns to the step 92. If there are no more records of logic value assignments on the list, then all possible logic value assignments have been tried and found to produce conflict with required logic value constraints, so the path is declared untestable in a step 98. If the examination in the step 76 reveals that the current logic value is the same as the logic value required by the logic value constraint, then the selected logic device is simply removed from the list of devices with hazard-free logic value constraints in a step 78. A step 80 examines the list of circuit devices with hazard-free logic value constraints to see if the list is empty. If the step 80 reveals that the list is not empty, then flow returns to the step 74. If the step 80 reveals that the list is empty, then the Justify Hazard-free Values procedure is exited in a step 82.

Figure 9:
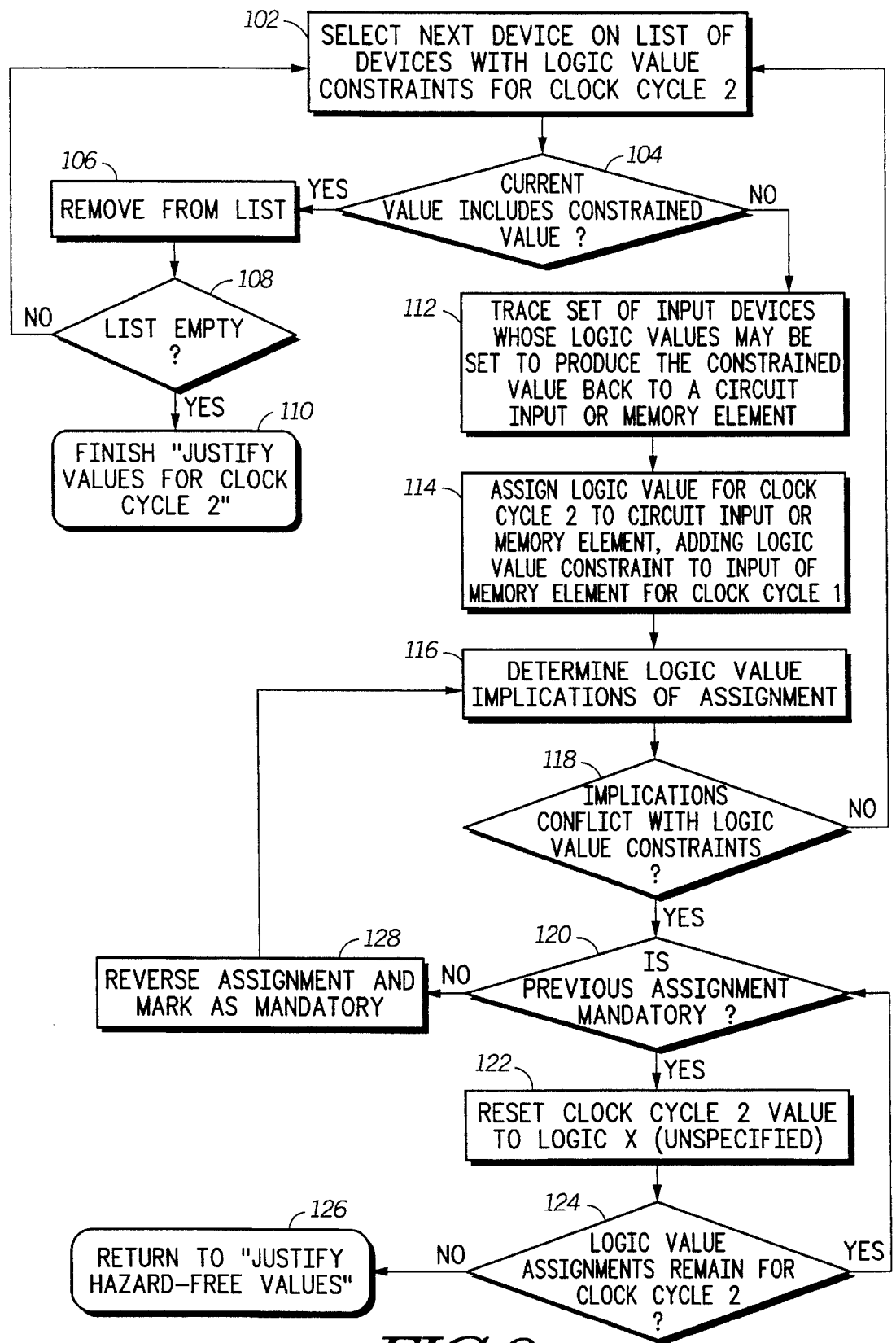
FIG. 9 illustrates, in a flowchart, several specific steps which are involved when justifying values for a second clock cycle as illustrated in FIG. 6 in accordance with the present invention.

FIG. 9 illustrates the flowchart for the step 38 in FIG. 6. A step 102 selects the next circuit device on the list of devices with logic value constraints for the second clock cycle. A step 104 examines the selected circuit device to see if its current logic value includes the logic value required by the logic value constraint. A first logic value is said to include a second logic value if all the requirements for the second logic value are also met by the first logic value. If the current logic value does not include the logic value required by the logic value constraint, then a step 112 initiates a process of backtracing from the input devices of the selected circuit device. This consists of selecting an input device whose current logic value (and logic value constraint, if any such exists for this input device) is compatible with the input logic value needed to produce the value required by the logic value constraint for the second clock cycle on the selected logic device. When such an input device is identified, then the backtracing process is applied to the identified input device and this continues iteratively until a circuit input terminal or a scannable flip-flop is encountered. At this point, the logic value that is needed to assist in producing the value required by the logic value constraint for the second clock cycle on the initially selected circuit device is assigned to the circuit input terminal or scannable flip-flop in a step 114.

A step 116 performs a logic simulation to determine the logic value implications of the logic value assignment made in the step 114. Circuit devices that are simulated are checked for conflict with their logic value constraints in a step 118. If no conflict is determined in the step 118, the flow returns to the step 102. If there is conflict between the current logic value and the logic value constraint for some circuit element in the step 118, a step 120 examines the previous logic value assignment to see if it is a mandatory assignment, i.e., an assignment that is either required to have its present value by some logic value constraint in the circuit model or has already had the inverse value for the second clock cycle simulated and found to cause conflict. If the previous assignment is not mandatory, then its logic value assignment is inverted and marked as mandatory in a step 128 and flow returns to the step 116. If the previous assignment is mandatory, a step 122 returns the circuit input terminal or scannable flip-flop to which the previous logic value assignment had been made to an unspecified state (logic value X) for the second clock cycle and the record of the previous logic value assignment is removed from the list of such records.

A step 124 examines the list of records of logic value assignments to see if more records remain on the list. If there are more records on the list, flow returns to the step 120. If there are no more records of logic value assignments on the list, then all possible logic value assignments for the second clock cycle have been tried and found to produce conflict with required logic value constraints, so some of the hazard-free assignments made in the step 36 of FIG. 6 have made it impossible to complete the generation of the test vector, so a step 126 returns to the step 36 of FIG. 6 to attempt to find a different assignment of hazard-free values that will allow the successful generation of a test vector. If the step 104 reveals that the current logic value does include the logic value required by the logic value constraint, a step 106 removes the selected logic device from the list of devices with logic value constraints for the second clock cycle. A step 108 examines the list of circuit devices with logic value constraints for the second clock cycle to see if the list is empty. If the step 108 reveals that the list is not empty, then flow returns to the step 102. If the step 108 reveals that the list is empty, then the Justify Values For Clock Cycle 2 procedure is exited in a step 110.

Figure 10:
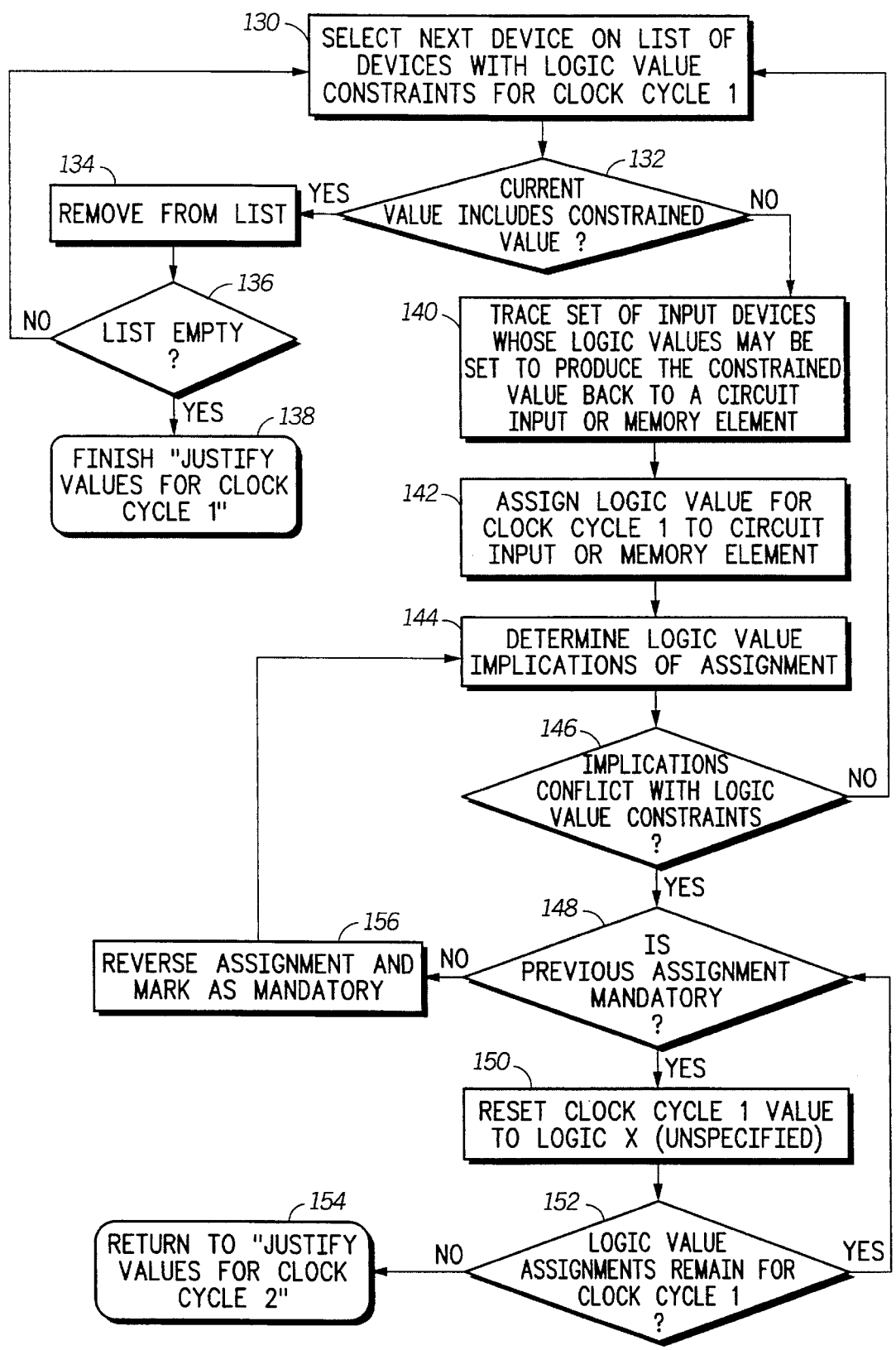
FIG. 10 illustrates, in a flowchart, several specific steps which are involved when justifying values for a first clock cycle as illustrated in FIG. 6 in accordance with the present invention.

FIG. 10 illustrates the flowchart for the step 40 in FIG. 6. A step 130 selects the next circuit device on the list of devices with logic value constraints for the first clock cycle. A step 132 examines the selected circuit device to see if its current logic value includes the logic value required by the logic value constraint. If the current logic value does not include the logic value required by the logic value constraint, then a step 140 initiates a process of backtracing from the input devices of the selected circuit device. This process of backtracing consists of selecting an input device whose current logic value (and logic value constraint, if any such exists for this input device) is compatible with the input logic value needed to produce the value required by the logic value constraint for the first clock cycle on the selected logic device. When such an input device is identified, then the backtracing process is applied to the identified input device and this continues iteratively until a circuit input terminal or a scannable flip-flop is encountered. At this point, the logic value that is needed to assist in producing the logic value required by the logic value constraint for the first clock cycle on the initially selected circuit device is assigned to the circuit input terminal or scannable flip-flop in a step 142. A step 144 performs a logic simulation to determine the logic value implications of the logic value assignment made in the step 142.

Circuit devices that are simulated are checked for conflict with their logic value constraints in a step 146. If no conflict is determined in the step 146, the flow returns to the step 130. If there is conflict between the current logic value and the logic value constraint for some circuit element in the step 146, a step 148 examines the previous logic value assignment to see if it is a mandatory assignment, i.e., an assignment that is either required to have its present value by some logic value constraint in the circuit model or has already had the inverse logic value for the first clock cycle simulated and found to cause conflict. If the previous assignment is not mandatory, then its logic value assignment for the first clock cycle is inverted and marked as mandatory in a step 156 and flow returns to the step 144. If the previous assignment is mandatory, then the circuit input terminal or scannable flip-flop to which the previous assignment had been made is returned to an unspecified state (logic value X) for the first clock cycle and the record of the previous logic value assignment is removed from the list of such records in a step 150.

A step 152 examines the list of records of logic value assignments to see if more records remain on the list. If there are more records on the list, flow returns to the step 148. If there are no more records of logic value assignments on the list, then all possible logic value assignments for the first clock cycle have been tried and found to produce conflict with requires logic value constraints, so some of the assignments for the second clock cycle made in the step 38 of FIG. 6 have made it impossible to complete the generation of the test vector and a step 154 returns to the step 38 of FIG. 6 to attempt to find a different assignment of values for the second clock cycle that will allow the successful generation of a test vector. If the examination in the step 132 reveals that the current logic value does include the logic value required by the logic value constraint, a step 134 removes the selected logic device from the list of devices with logic value constraints for the first clock cycle. A step 136 examines the list of circuit devices with logic value constraints for the first clock cycle to see if the list is empty. If the step 136 reveals that the list is not empty, then flow returns to the step 130. If the step 136 reveals that the list is empty, then the Justify Values For Clock Cycle 1 procedure is exited in a step 138.

Figure 11:
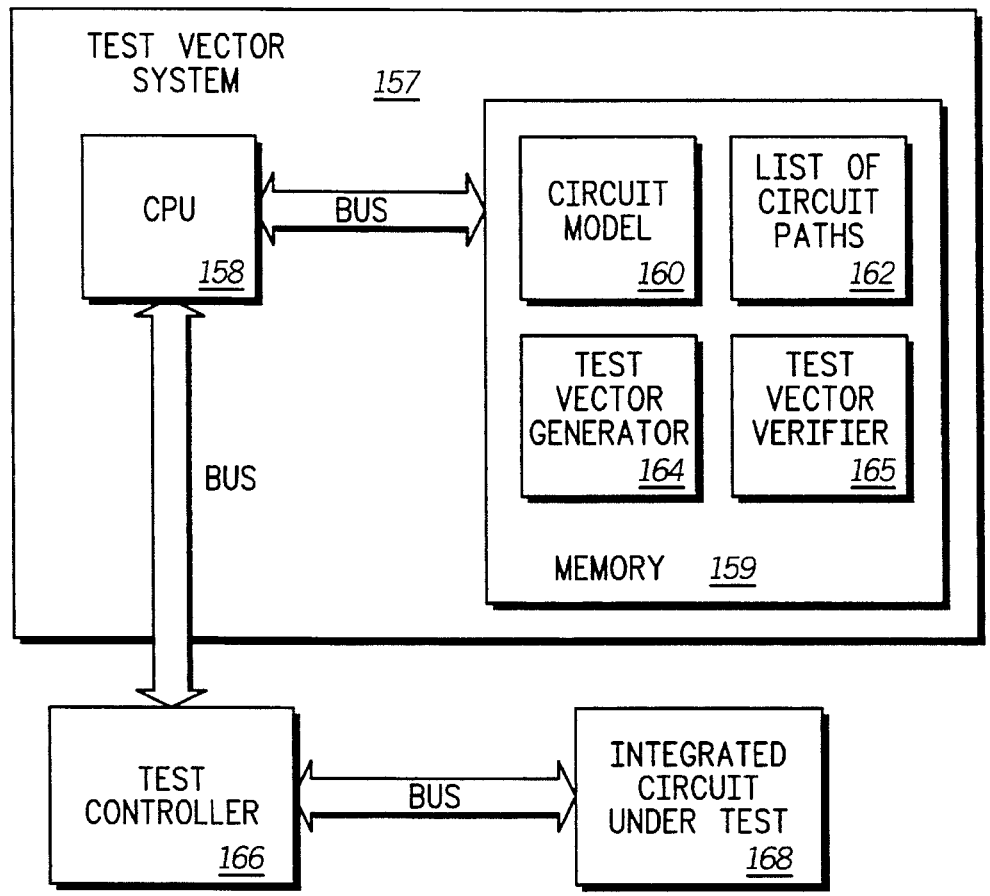
FIG. 11 illustrates, in a block diagram, a data processing system which may be used to both path delay test an integrated circuit and verify a path delay test for an integrated circuit in accordance with the present invention.

FIG. 11 illustrates a system which may be used to both generate and verify speed path test vectors and then speed path test an integrated circuit using the generated test vectors and a test apparatus. FIG. 11 illustrates a central processing unit (CPU) 158, which is coupled to a memory system 159 via a bus. The memory 159 stores a circuit model 160, a list of circuit paths 162, a test vector generator 164, and a test vector verifier 165. The CPU 158 executes the generator 164 which accesses the circuit model 160 and the list of circuit paths 162 to generate test vectors, as taught herein, for every testable path in the list of circuit paths 162. These test vectors are then communicated to the test vector verifier 165 so that the test vectors may be verified for correct operation by another method which is different from the method used to generate the vectors in generator 164. These test vectors, after verification and any correction resulting from verification, are then communicated to a test controller 166 which is used to clock and/or provide the test vectors to the integrated circuit under test 168. The test verification process performed by verifier 165 is described in detail below and illustrated in FIGS. 25–42.

The test controller 166 and the link between the test controller 166 and the circuit under test 168 comprise the test apparatus. This providing of test vectors and reading of results by the controller 166 is used to derive delay path and speed path information from the actual integrated circuit 168, and may be performed multiple times with varying clock rates in order to derive more precise speed path information. The test controller to be used here may be any one of several types of devices. One example of a test controller is a production electronic digital tester, such as a Teradyne J971. A second example of a test controller is a laboratory tester such as a Hewlett-Packard 82000. Still another example of a test controller would be a specialized logic device that could be constructed especially to link the Test Vector Generator System 157 to the Integrated Circuit Under Test 168. The Test Vector Generator System 157 could also be any one of several types of systems, such as an engineering workstation, a personal computer, a large mainframe computer, or a multiprocessing supercomputer.

Figure 12:
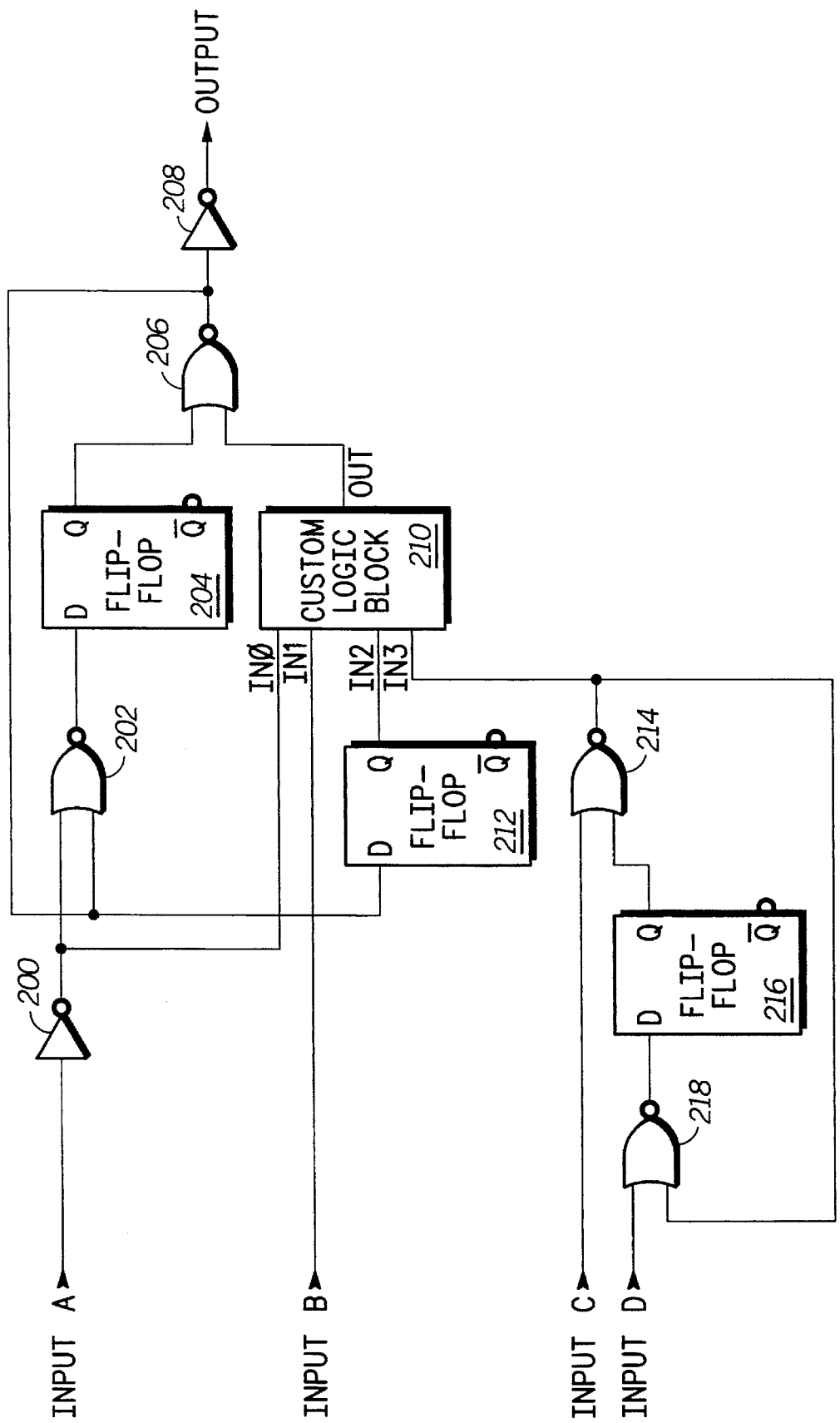
FIG. 12 illustrates, in a block diagram, a circuit that contains a custom logic block, which is a block of elements that is described by its functional equation in accordance with the present invention.

FIG. 12 generally illustrates a portion of an integrated circuit having four inputs A, B, C and D. FIG. 12 also illustrates an inverter 200 having an input A and an output. A NOR gate 202 having an input coupled to the output of inverter 200, a second input, and an output. A scannable flip-flop 204 has an input coupled to the output of the NOR gate 202 and an output. A NOR gate 206 has an input coupled to the output of the scannable flip-flop 204, a second input, and an output. An inverter 208 has an input coupled to the output of a NOR gate 206 and inverter 208 has an output labeled OUTPUT. A custom logic block has one input (IN0) coupled to the output of inverter 200, a second input B (IN1), a third input (IN2), a fourth input (IN3), and an output (OUT) coupled to the second input of NOR gate 206. A scannable flip-flop 212 has an input coupled to the output of inverter 206 and an output coupled to the third input (IN2) of custom logic block 210. A NOR gate 214 has an input C, a second input and an output coupled to the fourth input (IN3) of custom logic block 210. A NOR 218 has an input D, a second input coupled to the fourth input (IN3) of custom logic block, and an output. A scannable flip-flop 216 has an input coupled to the output of NOR gate 218 and an output coupled to the second input of NOR gate 214. The circuit of FIG. 12 will be processed by the Boolean difference algorithm taught herein to provide test vectors to test the circuit of FIG. 12.

Figure 13:
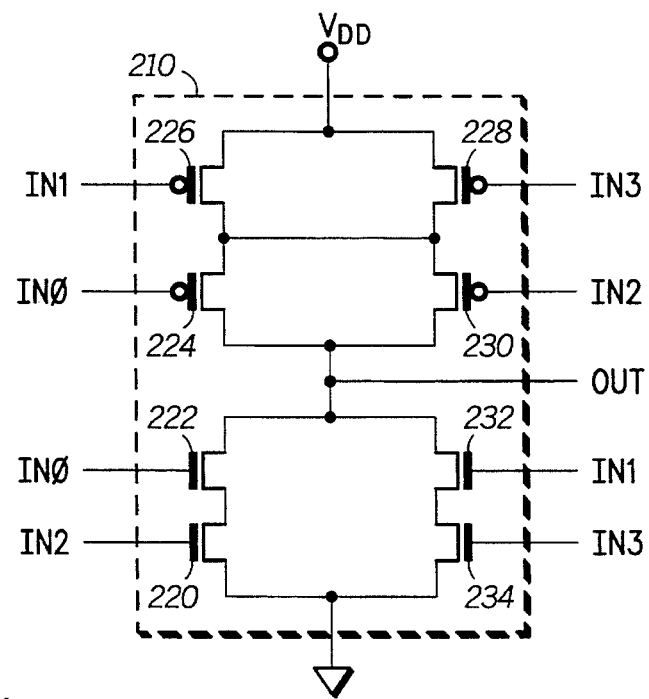
FIG. 13 illustrates, in a block diagram, a circuit diagram describing the custom logic block 210 of FIG. 12 in further detail in accordance with the present invention.

FIG. 13 illustrates the custom logic block 210 which has logic elements, a power supply terminal $V_{dd}$, an output terminal (out), and inputs in0 (coupled to the gates of transistors 224 and 222), in1 (coupled to the gates of transistors 226 and 232), in2 (coupled to the gates of transistors 220 and 230), and in3 (coupled to the gates of transistors 228 and 234) correspond to the inputs in FIG. 12. The circuit of FIG. 13 is a custom logic block because conventional logic gates such as AND, NAND, OR, NOR, inverters, XOR, and the like cannot directly describe the implementation of circuit 13 accurately. Instead, a function F is used to describe the input-to-output relationship of FIG. 13.

Figure 14:
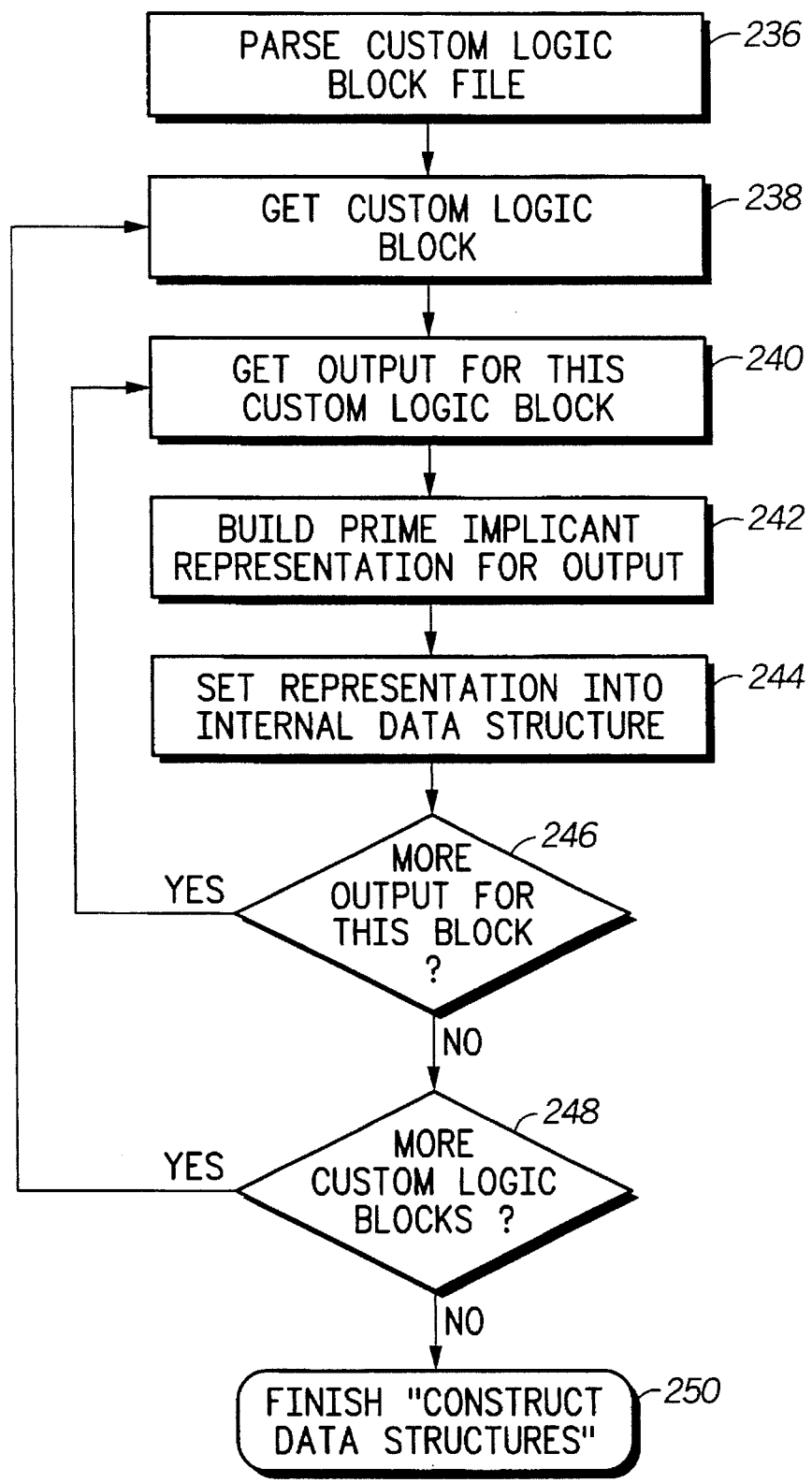
FIG. 14 illustrates, in a flow chart, several specific steps that describe the process in building the internal data structure to describe or represent the control logic block 210 of FIG. 12 in accordance with the present invention.

FIG. 14 illustrates a method for building an internal data structure to represent the custom logic block 210. A step 236 takes, as input, a custom logic block file (stored in memory), which is described in the following manner (the following code example will be termed Code Example A):

```
/* Code Example A */
module CLB (in0,in1,in2,in3,out);
  input in0;
  input in1;
  input in2;
  input in3;
  output out;
  assign out=(~in0 & ~in1) | (~in0 & ~in3) | (~in2 & ~in1) |
    (~in2 & ~in3);
endmodule
```

In the above Code Example A, the symbol "~" stands for negation. Code Example A is all legal code in the Verilog programming language. As stated above, code Example A is a Verilog program that contains one module that describes the custom logic block 210 in the custom logic block file. It can also be mentioned that Code Example A can be written in any high level language program (such as a C program or PASCAL program). Code Example A can contain a plurality of outputs or one output, and Code Example A can contain a plurality of modules which collectively define a custom logic block file. A step 236 in FIG. 14 opens the custom logic block file for parsing. A step 238 in FIG. 14 parses the custom logic block file for a custom logic block module that contains the Boolean logic which describes the custom logic block 210. A step 240 parses the custom logic block module looking for a Boolean algebra output statement in the custom logic block module and reads the output Boolean logic function "assign out" of code Example A (i.e., function F). A step 242 takes the Boolean logic output function "assign out" and builds the prime implicant representation of that output data. The prime implicant representation of the custom logic block 210 in FIG. 13 is described in the following manner (the following example will be termed Example B):

Example B

Function: F=a'b'+a'd'+c'b'+c'd'

Inverse Function: F'=ac+bd

Wherein the function F is analogous to the function "assign out" of Code Example A.

In the above Example B, the symbol '+' stands for the Boolean logic OR and the symbol "'" stands for inverse. Example B represents the custom logic block's output function F and the function's inverse F'. In Example B, the variables a, b, c and d all respectively correspond to the variables in0, in1, in2 and in3 in Example A. Each of the product terms in both functions represents a prime implicant. For example, in Example B the output function F has four prime implicants, which are: a'b', a'd', c'b', and c'd'. Also, in Example B the output function F' has two prime implicants, which are ac and bd. A step 244 of FIG. 14 sets the prime implicant representation into an internal data structure as described in the following manner (the following example will be termed Example C):

Example C

| | | F | | | | | | F | | | |
|---|---|---|---|---|---|---|---|---|---|---|---|
| | | d | c | b | a | | | | d | c | b | a |
| PT1: | 0... | 0 | 0 | 0 | 0 | non-inverted inputs | PT1: | 0... | 0 | 1 | 0 | 1 |
| | 0... | 0 | 0 | 1 | 1 | inverted inputs | | 0... | 0 | 0 | 0 | 0 |
| PT2: | 0... | 0 | 0 | 0 | 0 | | PT2: | 0... | 1 | 0 | 1 | 0 |
| | 0... | 1 | 0 | 0 | 1 | | | 0... | 0 | 0 | 0 | 0 |
| PT3: | 0... | 0 | 0 | 0 | 0 | | | | | | | |
| | 0... | 0 | 1 | 1 | 0 | | | | | | | |
| PT4: | 0... | 0 | 0 | 0 | 0 | | | | | | | |
| | 0... | 1 | 1 | 0 | 0 | | | | | | | |

In the above Example C each of the prime implicants, PT1 is prime implicant one, PT2 is prime implicant two, PT3 is prime implicant three, and PT4 is prime implicant four, represent a machine word bit array whose input data is read from right to left; the first word representing non-inverted inputs and the second word representing inverted inputs. For example, in Example C, PT1 has a first row of "0 . . . 0 0 0 0" and a second row of "0 . . . 0 0 11". The first row is the non-inverted inputs d, c, b, and a and row two represents the inverted inputs d', c', b', and a'. Therefore, in Example C, the PT1 in the non-inverted function has all zeroes for the non-inverted inputs since non-inverted values d, c, b, or a are not present in the first product term (which is logically equal to a'b') of function F in Example B. However, since the first prime implicant in the non-inverted function F of Example B is a'b', the PT1 in the non-inverted function F of Example C sets the value of the a and b bit in row two to a one to indicate that it has been selected.

Step 246 in FIG. 14 checks for more output Boolean logic statements in the custom logic block module and if another output Boolean logic statement is found, then the step 240 is performed, else a step 248 is performed which checks for more custom logic block modules. If the step 248 finds another custom logic block module, then step the 238 is performed, else a step 250 is performed which indicates that the prime implicant data structure is constructed.

Figure 15:
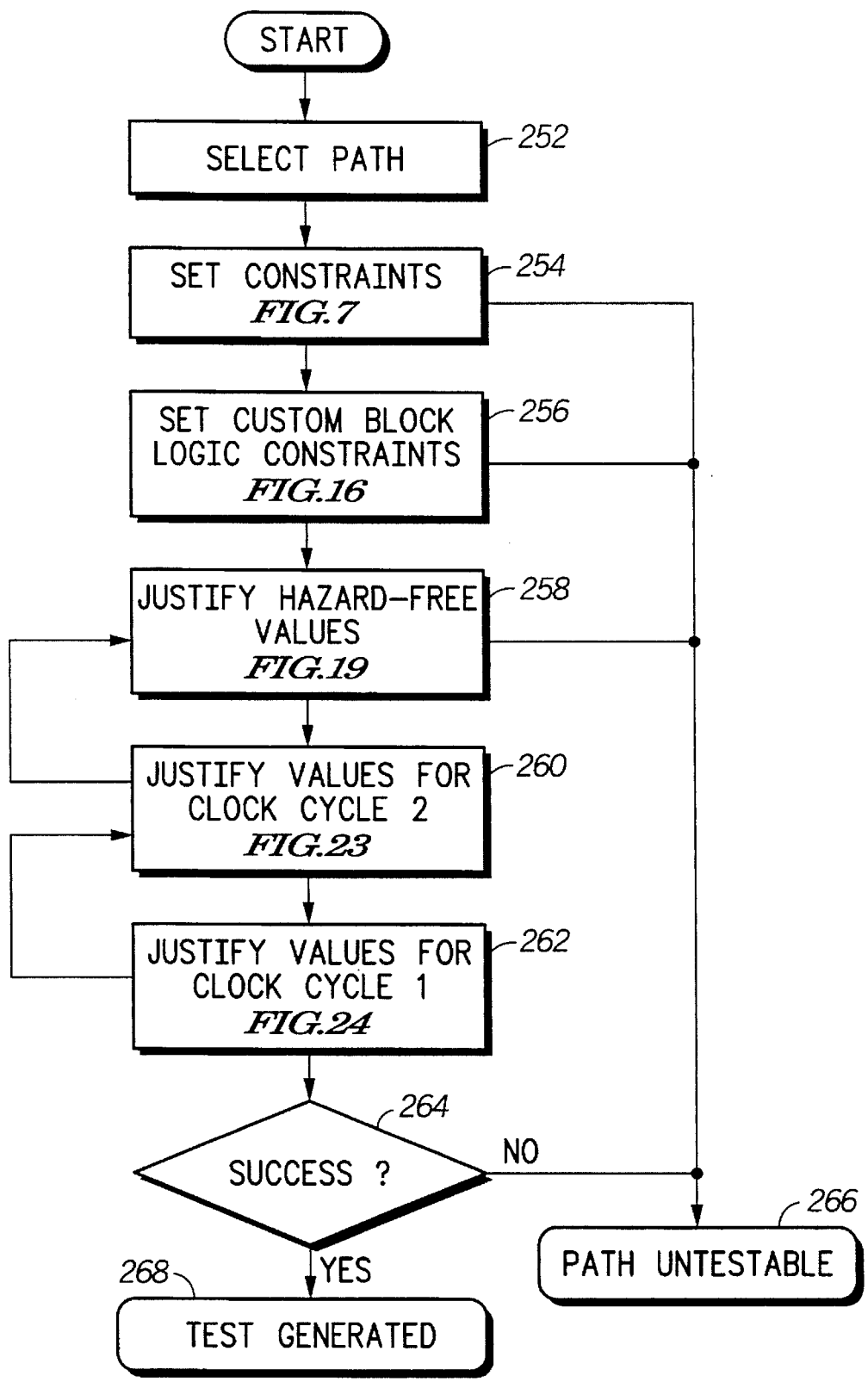
FIG. 15 illustrates, in a flowchart, a method for generating a test vector which is used to test a delay path in an electrical circuit in accordance with the present invention.

Once FIG. 14 is executed and the prime implicant data structure is formed, then FIG. 15 illustrates a flowchart which describes how a robust speed path test vector is generated for any circuit that may have a custom logic block or several custom logic blocks. In a step 252, a path is selected from a list of paths (stored in memory) for which path-delay tests are to be generated. In a step 254, the standard logic device's logic value constraints for the path-delay test are determined from the description of the path and the circuit model (see FIG. 7). If a path is found to be untestable in the step 254, then the path is declared untestable in a step 266. In a step 256, the custom logic block's logic value constraints for the path-delay test are determined from the description of the path, the circuit model, and the data structure for the custom logic block (see FIG. 16). If a path is found to be untestable in the step 256, then the path is declared untestable in the step 266. These logic value constraints are then justified, in a particular order depending on the type of constraint that is required.

In a step 258, the first logic value constraints to be justified are the hazard-free values that are required to be free of timing hazards. If a path is found to be untestable in the step 258, then the path is declared untestable in the step 266. Next, the logic value constraints for the second clock cycle are justified in a step 260. Finally, the logic value constraints for the first clock cycle are justified in a step 262. In a step 264, the test generation result is checked to see if values have been successfully determined to justify all the required logic value constraints, and if they have been successfully generated, then a test vector is declared to have been generated and is saved as an output result vector in a step 268. If all possible values are tried (implicitly) and it proves impossible to justify all the required logic value constraints, then the selected path is declared to be untestable in a step 266. Only two clock cycles are required for this test because the integrated circuit is required to have scannable flip-flops as memory elements. This means that the first set of values required for the test vector can be serially shifted into the memory elements rather than having to be produced by the functionality of the integrated circuit.

Figure 16:
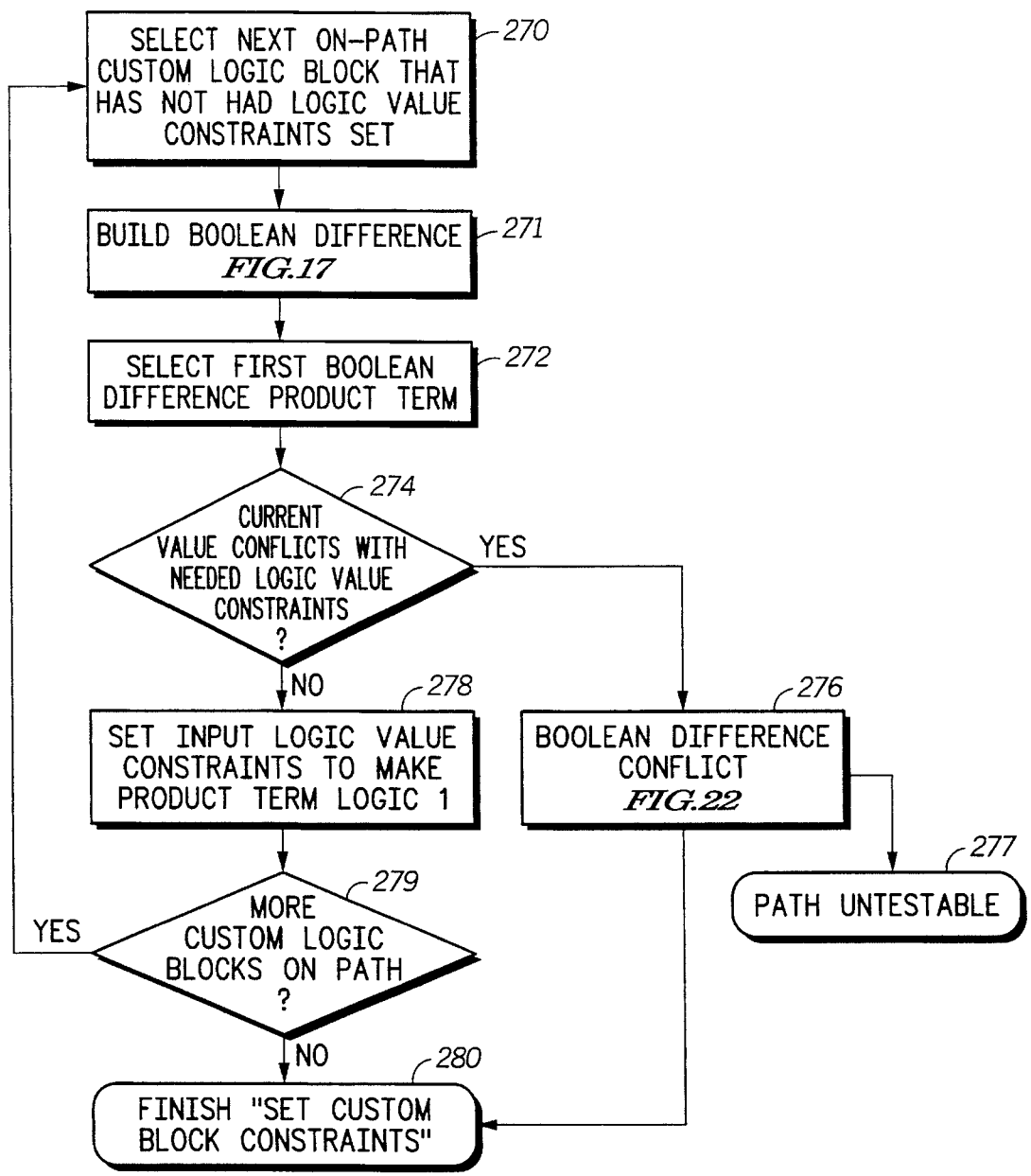
FIG. 16 illustrates, in a flowchart, several specific steps involved when setting logic constraints for custom logic blocks as illustrated in FIG. 15 in accordance with the present invention.

FIG. 16 illustrates the flowchart for the step 256 of FIG. 15. First, the next custom logic block on the circuit path that has not had logic values constraints set is selected in a step 270. A step 271 builds the Boolean difference data structure (discussed above), which is the result of all the product terms involving the specified input in the non-inverted function F being paired with all product terms involving the specified input in the inverted function F'. The Boolean difference building process is illustrated in more detail in FIG. 17. A step 272 selects the first Boolean difference product term. A step 274 checks if the current logic value constraints, set on the Boolean difference product term, conflicts with the needed logic value constraints. If there is a conflict with the current logic value constraints with the needed logic value constraints in the step 274, then flow continues to a step 276; else flow continues to a step 278. The step 276 calls the Boolean Difference Conflict procedure to try to find an unused Boolean difference product term and assign input logic value constraints in order to resolve the conflict, which is described in more detail in FIG. 22. If the path is found to be untestable in the step 276, then the path is declared untestable in a step 277; else the Set Custom Block Constraints procedure is exited in a step 280.

The step 278 sets input logic value constraints on the inputs to the custom logic block to make the product term logic one. For example, if logic values a and c were selected as the first product term (first product term=ac) in the Boolean difference set, then both a and c would have to be a logic value of one in order to make the product term ac a logic one as described in the following manner (the following example will be termed Example D):

Example D a·c=1
a=1
c=1

The custom logic block in the step 278 is added to a list of constrained custom logic blocks that have had constraints placed on their inputs, and a step 279 checks for more custom logic blocks on the path; if there are more custom logic blocks on the path, then go back to the step 270; if there are no more custom logic blocks on the path, then the flow continues to the step 280, which exits the Set Custom Block Constraints procedure.

Figures 17, 18:
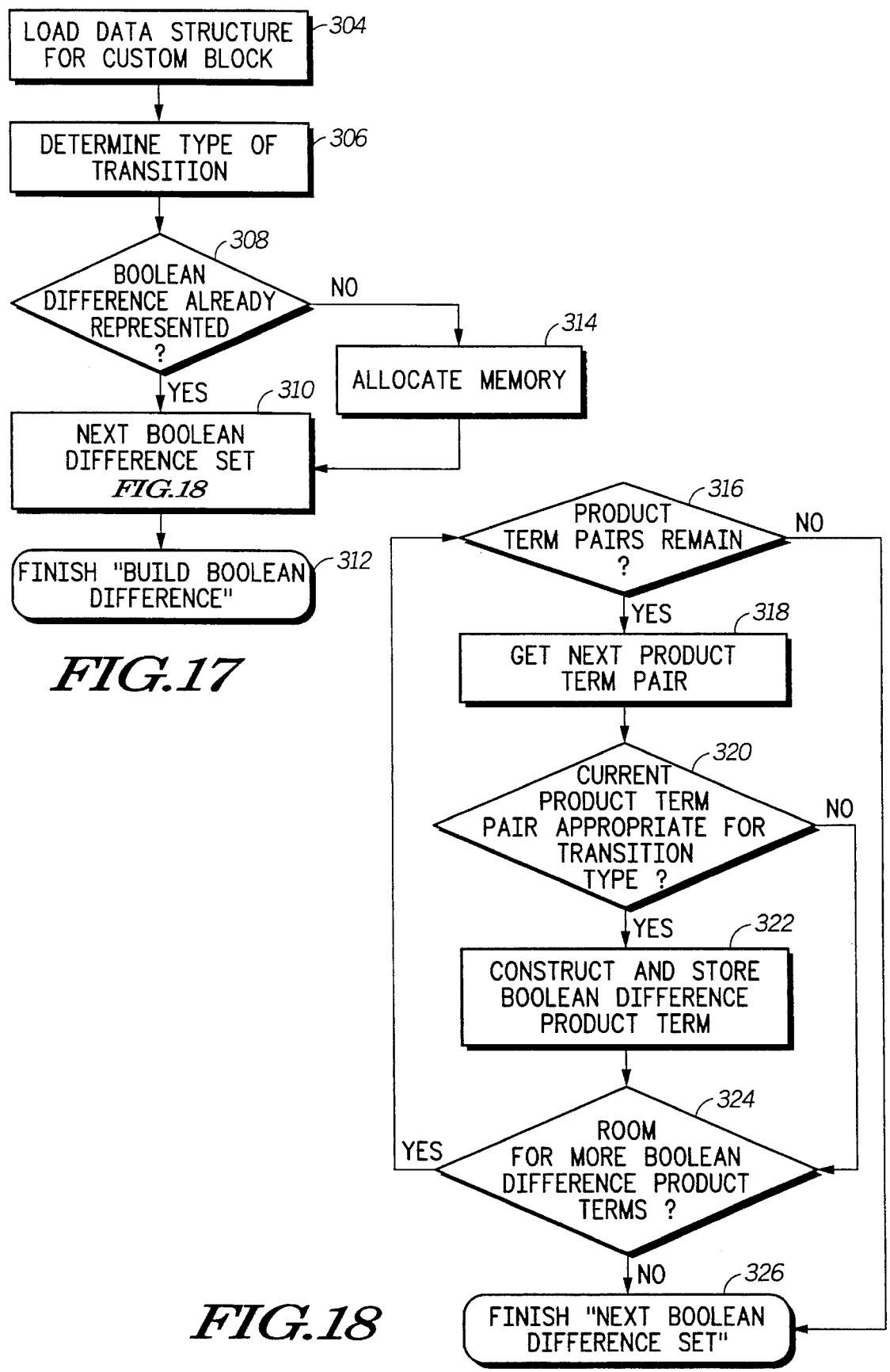
FIG. 17 illustrates, in a flowchart, several specific steps that describe building another part of the data structure that represents a custom logic block that is directly in the delay path in accordance with the present invention.
FIG. 18 illustrates, in a flowchart, several specific steps that describe the process for finding the next Boolean difference set in accordance with the present invention.

FIG. 17 illustrates a method for building another data structure from the data structure derived from FIG. 14. The data structure formed by FIG. 17 represents a custom logic block that lies on the selected circuit path. For example, in FIG. 12 a selected circuit path could comprise a first input B, which has an output coupled to a custom logic block 210, wherein the custom logic block 210 has an output coupled to a NOR gate 206, wherein the NOR gate 206 has output coupled to an inverter 208 gate, wherein the inverter gate 208 has an output coupled to an output terminal, represent a delay path that is directly affected by the custom logic block 210. A step 304 loads the prime implicant data structure as described above (see FIG. 14) and a step 306 determines which of the four types of custom logic block transitions as described in the following manner (the following example will be termed Example E):

Example E

Four Types of Transitions:

| | | |
|---|---|---|
| 1. | Input Rising | Output Rising |
| 2. | Input Rising | Output Falling |
| 3. | Input Falling | Output Falling |
| 4. | Input Falling | Output Rising |

A step 310 in FIG. 17 checks if a Boolean difference is already represented in the data structure, wherein a Boolean difference is a product term from F paired with a product term from F'. The Boolean differences are used to determine which values are to be hazard free as described in the following manner (the following example will be termed Example F):

Example F

Function: F=a'b' + a'd' +c'b' +c'd'
Inverse Function: F' = ac + bd

| | | Boolean Difference Set | | | | | Steady-Values Marks Hazard Free | | | | |
|---|---|---|---|---|---|---|---|---|---|---|---|
| | | d | c | b | a | | | d | c | b | a |
| PT1: | 0... | 0 | 1 | 0 | 0 | non inverted inputs | SPT1: 0... | 0 | 0 | 1 | 0 |
| | 0... | 0 | 0 | 1 | 0 | inverted inputs | | | | | |
| PT2: | 0... | 0 | 1 | 0 | 0 | non inverted inputs | SPT2: 0... | 1 | 0 | 0 | 0 |
| | 0... | 1 | 0 | 0 | 0 | inverted inputs | | | | | |

Example F is an example of the step 306 resulting in a transition of input "a" rising and output F falling (F→F'), which is transition number two in Example E. In Example F, the non-inverted function F first product term (which is logically a'b') is paired with the inverted function F' first product term (which is logically ac), and all on-path inputs (a, and a', these are directly on the path being tested) in this pairing are removed from these product terms resulting in modified product terms (b' and c). These modified product terms are logically ANDed, which will result in the product term b'c, which is depicted in Example F via product term PT1. Also, in Example F, the non-inverted function F second product term a'd' is paired (by modifying and ANDing as taught above) with the inverted function F' first product term ac, which will result in the product term d'c, which is depicted in Example F via product term PT2. The two product terms PT1 and PT2 are the only product terms that satisfy the input "a" rising and output F falling transition. All other modifying and ANDing of product terms results in another transition which is not the desired test transition of input "a" rising and output F falling.

A step 314 allocates memory to store the Boolean difference product terms. Therefore, only Boolean differences which result in the proper output transition (i.e., the input "a" rising and output F falling transition) are stored selectively, thereby reducing the memory required for this algorithm (unlike the prior art). It can also be mentioned that a fixed amount of memory can be assigned for the Boolean difference set. Once this Boolean difference set is completely allocated to Boolean differences via FIGS. 17 and 18, no more Boolean differences are calculated in FIGS. 17–18. At a later time (during justification), these Boolean differences in the set may create a conflict and require the generation of more Boolean differences via FIGS. 17–18.

In Example F, there are only two appropriate product terms in the Boolean difference set; however, any finite non-zero number of Boolean differences up to a maximum defined memory limit may be stored as a Boolean difference set, as long as the memory allocated does not exceed the physical memory of the machine as described in FIG. 2, memory 52. This maximum defined memory limit is set in software. For example, if the maximum possible stored product terms in the Boolean difference set were two, and the total number of Boolean difference product terms available were five, then a first Boolean difference set would have two terms, a second Boolean difference set would have two terms, and a third Boolean difference set would have only one term. Each of the three Boolean difference sets being derived by FIGS. 17–18. In other words, the algorithm of FIGS. 17–18 would have to be executed three times in order to exhaustively find all appropriate Boolean differences for the custom logic block. A step 310 finds the next Boolean difference set, which is described in more detail in FIG. 18.

A step 312 indicates that the Boolean difference structure is built.

FIG. 18 illustrates a flow chart that describes the process for finding the next Boolean difference set after executing steps in FIG. 17. A step 316 checks for remaining product terms in the prime implicant data structure. If no more product terms remain, a step 326 indicates that the last Boolean difference set was found. A step 318 gets the next product term pair and a step 324 determines if the current product term pair is appropriate for the transition type defined in the step 314 of FIG. 17. A step 322 constructs and stores the Boolean difference product term in a machine word bit array (as illustrated in Example F—Boolean Difference Set) if the Boolean difference term is appropriate. Example F also illustrates that the machine word bit array stores the hazard free values used to generate a test vector (these hazard free values and their generation are discussed in subsequent justification flowcharts). For example, in Example F both of the logic values b and d are found in subsequent flowcharts to have a steady or hazard free value of zero (meaning b' and d' are hazard free ones) during the "a" rising and F falling transition and variable "c" can either be a zero or one (i.e. a don't care) for the first test clock cycle; and the variable "c" has the value of one for the second clock cycle, as described in the following manner (the following example will be termed Example G):

Example G (1) b=S0, c=X1

(2) d=S0, c=X1

In Example G, the variable "c" is a don't care in the first clock cycle since the-terms a'b' and a'd' in Example F render the logical function F a logical 1 regardless of the value of "c", either 0 or 1. However, for the second clock cycle the variable "c" is a variable in the output transition and must have a logical value of one. For example, the product term PT1 in Example F is b'c' and since the variable "b" is a steady zero, the variable "c" must have a logic value of one to render the output a logical 1. Furthermore, since the transition in Example F is Input Rising and Output Falling (F→F'), the value of F is zero for the final clock cycle and F'=1 when F=0, therefore, the product term b'c must equal a logical value of one.

In Example F, the product term SPT1, which is a machine word bit array data structure, sets the value of the variable b' bit to a one to indicate that variable b is a steady or hazard free zero value (see right-hand side of Example F). The product term SPT2, which is a machine bit array data structure, sets the value of the d' bit to a one to indicate d is also a steady or hazard free zero value (see right-hand side of Example F). A step 324 checks if the memory allocated to store the Boolean difference in the step 314 FIG. 17 is full. If memory is not full, then go to the step 326. If memory is full, then go to the step 316.

Figure 19:
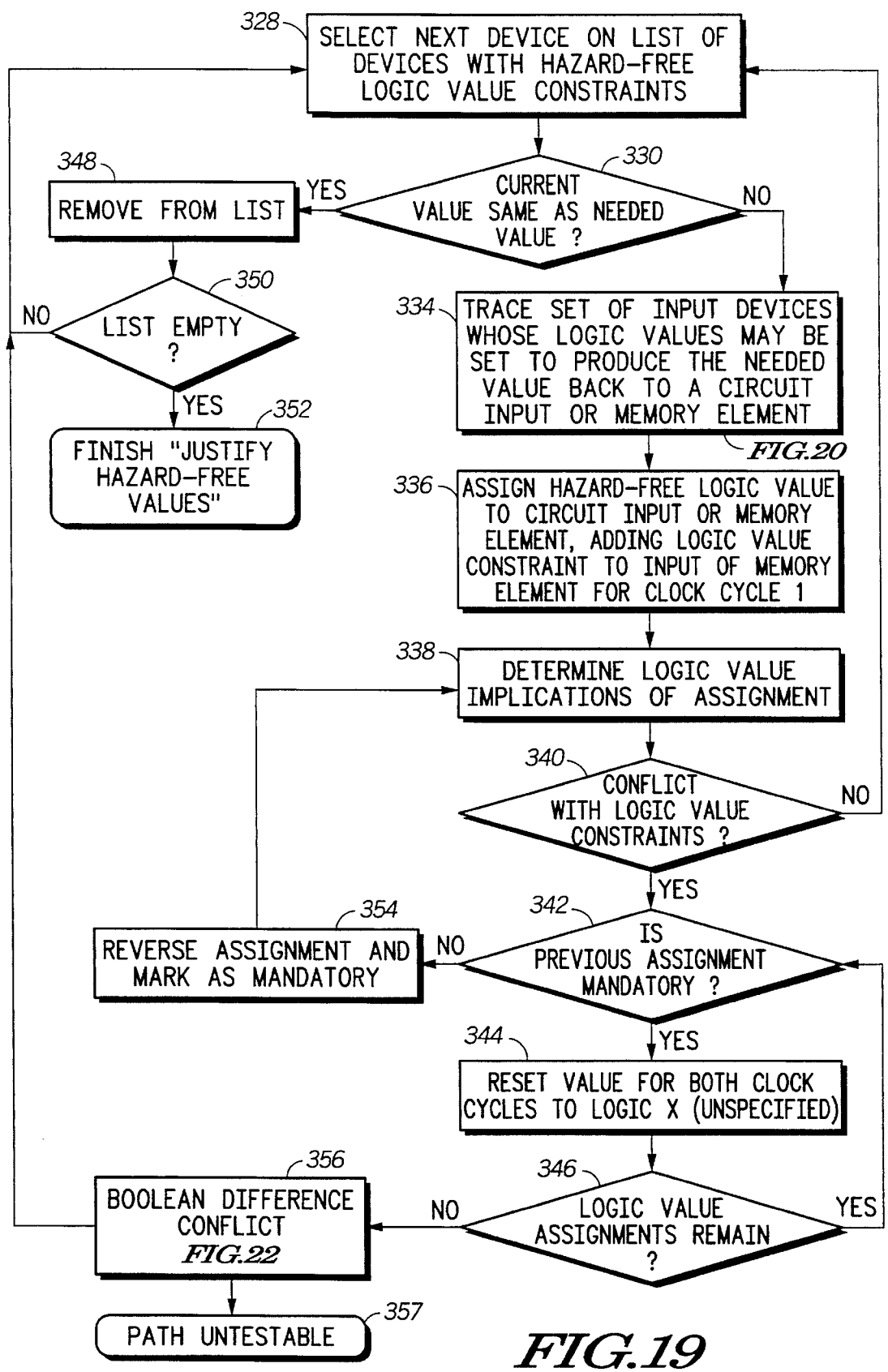
FIG. 19 illustrates, in a flowchart, several specific steps which are involved when justifying hazard-free logic values for standard logic devices and/or custom logic blocks as illustrated in FIG. 15 in accordance with the present invention.

FIG. 19 illustrates the flowchart for the step 258 in FIG. 15. In a step 328 the next circuit device on a list of devices with hazard-free logic value constraints is selected. The selected circuit device is examined to see if its current logic value is the same as the logic value required by the logic value constraint in a step 330. If the current logic value is not the same as the logic value required by the logic value constraint, then in a step 334 a process of backtracing from the input devices of the selected circuit device is initiated. The backtracing process in the step 334 is illustrated in more detail in FIG. 20. The hazard-free logic value that is needed to assist in producing the hazard-free logic value on the initially selected circuit device is assigned to the circuit input terminal or scannable flip-flop in a step 336. A step 338 performs a logic simulation to determine the logic value implications of the logic value assignment made in the step 336.

Circuit devices that are simulated are checked for conflict with their logic value constraints in a step 340. If no conflict is determined in the step 340, the flow returns to the step 328. If there is conflict between the current logic value and the logic value constraint for some circuit element in the step 340, then a step 342 examines the previous logic value assignment to see if it is a mandatory assignment, i.e., an assignment that is either required to have its present value by some logic value constraint in the circuit model, or has already had the inverse hazard-free value simulated and found to cause conflict. If the previous assignment is not mandatory, then in a step 354 its hazard-free logic value assignment is inverted and marked as mandatory and flow returns to the step 338. If the previous assignment is mandatory, then in a step 344 the circuit input terminal or scannable flip-flop to which the assignment had been made is returned to an unspecified state (logic value X) and the record of the previous logic value assignment is removed from the list of such records.

A step 346 examines the list of records of logic value assignments to see if more records remain on the list. If there are more records on the list of records of logic value assignments, flow returns to the step 342. If there are no more records of logic value assignments on the list, then all possible logic value assignments have been tried and found to produce conflict with required logic value constraints; however, if a custom logic block is in the path, then a step 356 calls the Boolean Difference Conflict procedure to try to find an unused Boolean difference product term and assign input logic value constraints in order to resolve the conflict, which is described in more detail in FIG. 22. If a path is found to be untestable in the step 356, then the path is declared untestable in a step 357. If the examination in the step 328 reveals that the current logic value is the same as the logic value required by the logic value constraint, then the selected logic device is simply removed from the list of devices with hazard-free logic value constraints in a step 348. A step 350 examines the list of circuit devices with hazard-free logic value constraints to see if the list is empty. If the step 350 reveals that the list of circuit devices with hazard-free logic value constraints is not empty, then flow returns to the step 328. If the step 350 reveals that the list is empty, then the Justify Hazard-free Values procedure is exited in a step 352.

Figure 20:
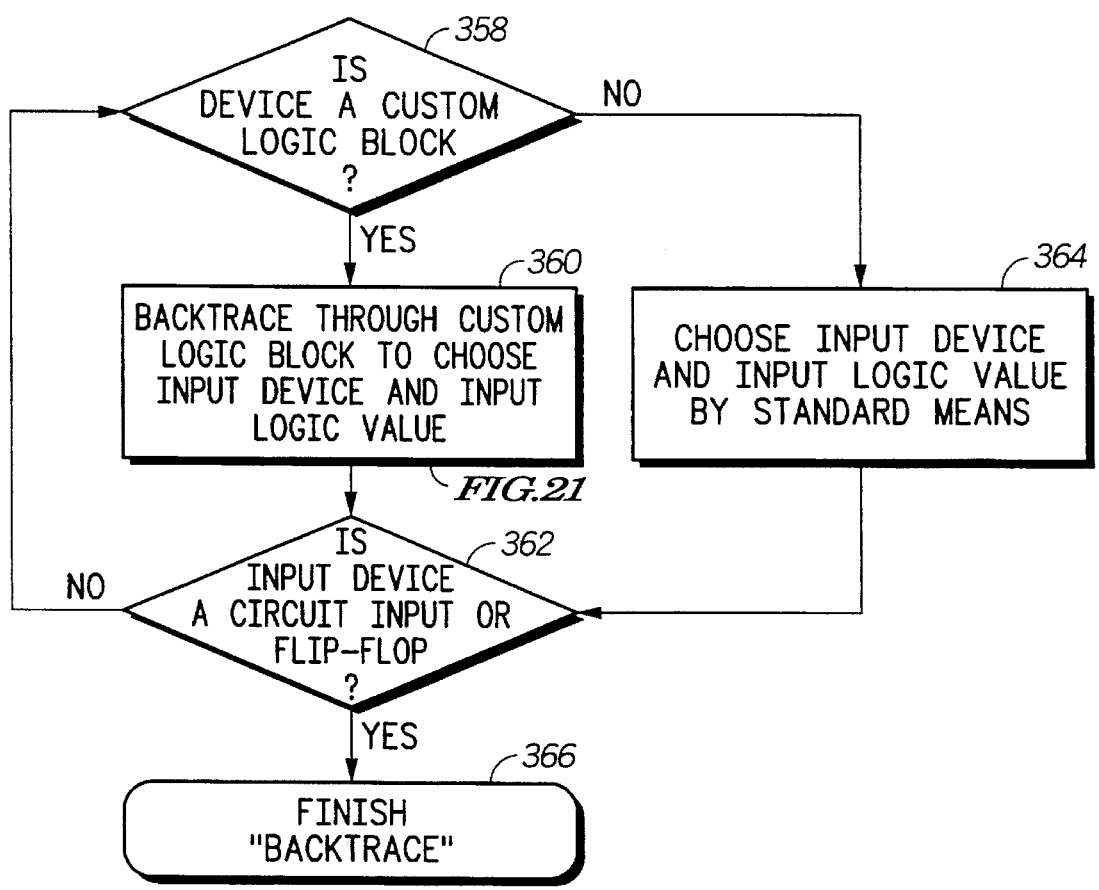
FIG. 20 illustrates, in a flowchart, several specific steps which are involved when backtracing input devices whose logic values may be set to produce the needed value back to a circuit input or memory element in accordance with the present invention.

FIG. 20 illustrates the flowchart for backtracing input devices from the step 332 in FIG. 19. A step 358 determines if the input logic device is a custom logic block. If the device is a custom logic block, then a step 360 will backtrace through a custom logic block to choose input device and input logic value, which is described in more detail in FIG. 21. If an input device is found to be a standard logic element, then a step 364 will choose the input device and input logic value by a standard means. This standard means of backtracing consists of selecting an input device whose current logic value (and logic value constraint, if any such exists for this input device) is compatible with the input logic value needed to produce the hazard-free logic value specified by the logic value constraint on the selected logic device. A step 362 examines if the input device is a circuit input or flip-flop. If the input device is not a circuit input or flip-flop, then the step 358 is called to check if the input device is a custom logic block. If the input device in the step 362 is a flip-flop or a circuit input, then the Backtrace procedure is exited in a step 366.

Figure 21:
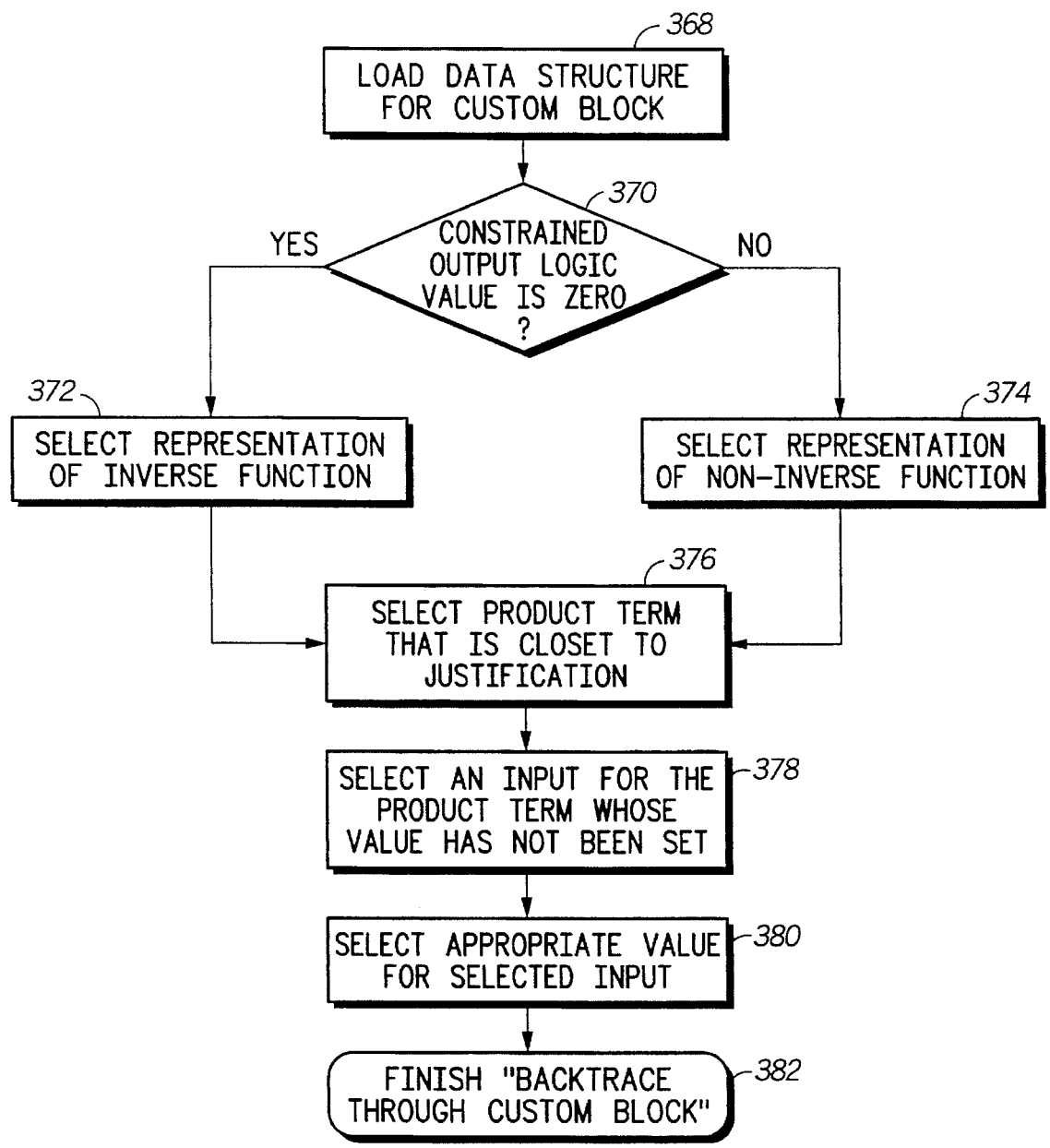
FIG. 21 illustrates, in a flowchart, several specific steps which are involved when tracing a custom logic block whose logic values may be set to produce the needed value back to a circuit input or memory element in accordance with the present invention.

FIG. 21 illustrates the procedure for backtracing through a custom logic block in the logic circuit path from the step 360 in FIG. 20. A step 368 loads the prime implicant data structure, as defined above, and a step 370 determines what is the constrained output logic value, which is either a zero or one. If the constrained logic output value is zero, then a step 372 selects the representation of the inverse function F'; else a step 374 selects the representation of the non-inverse function F. A step 376 selects the product term that is nearest justification, which means that the product term that is closest to already being set to one is selected. For example, if the inverse function is selected in the step 372, and the first product term for the inverse function is ac, whereas c has the logic value of one and a has a value that has not been set; a second product term for the inverse function is abc, whereas c has the value of one and both a and b values have not been set; since the first term can easily be set by assigning variable "a" a value of one, the product term that would be nearest justification is product term ac. A step 378 selects an input for the product term whose value has not been set; for example, if the product term is ab and the input value of b has not been set, then the input value b is selected. These selections may subsequently create a conflict and may need to be reversed and other products terms selected as taught herein. A step 380 selects the appropriate value for selected input; for example, if the product term is ab and the input value of a is one and the input value of b has not been selected, then in order to make the product term, ab, a logic one, the input value of b is assigned a logical value of one; however, if b was inverted, b', then the input value of b is assigned a logical value of zero. The Backtrace Through Custom Block procedure is exited in a step 382.

Figure 22:
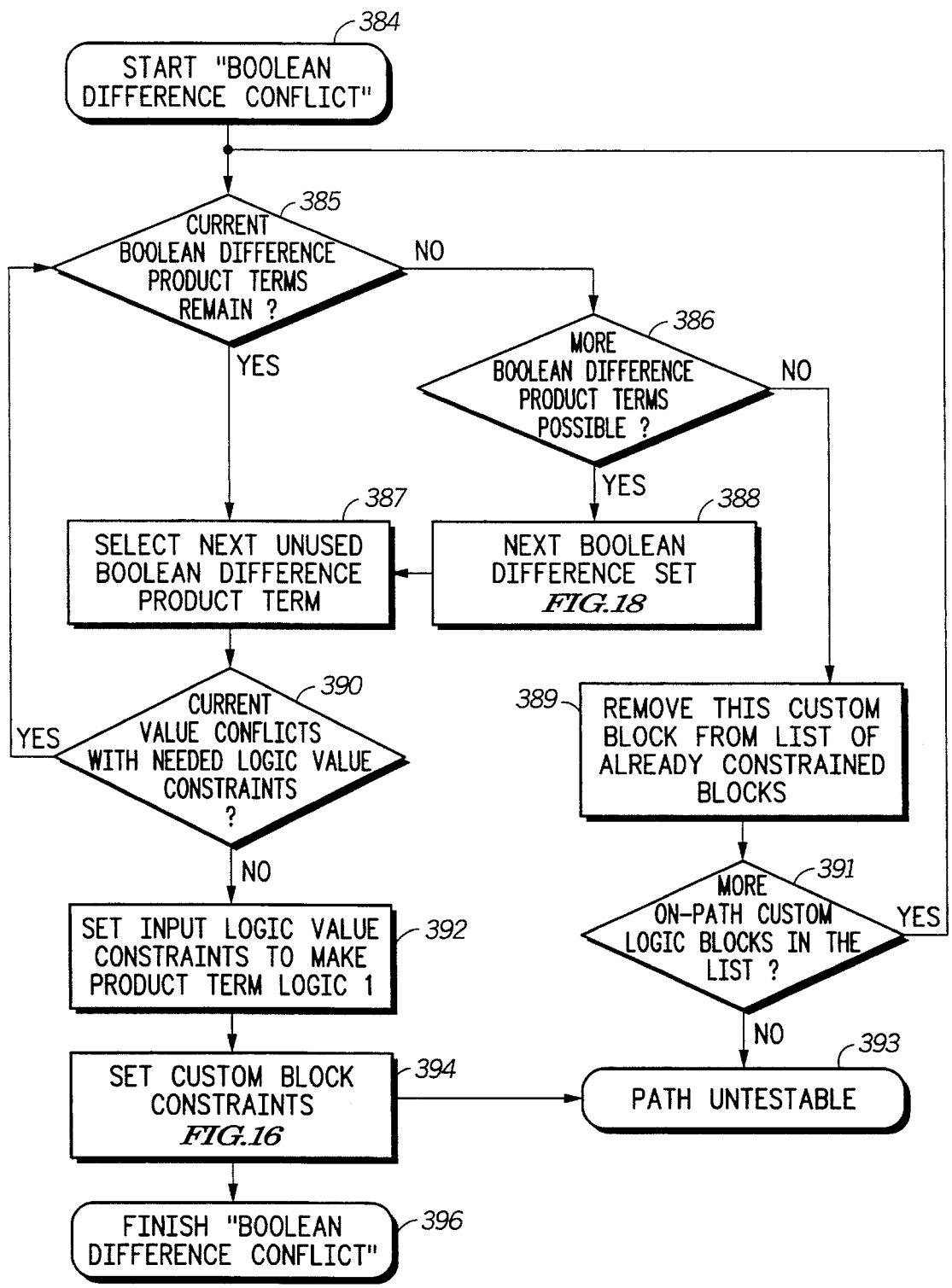
FIG. 22 illustrates, in a flowchart, several specific steps that describe how to handle a Boolean difference conflict in accordance with the preset invention.

FIG. 22 illustrates the flowchart that describes how to handle a Boolean difference conflict of the step 356 in FIG. 19. A step 384 begins the Boolean Difference Conflict procedure. A step 385 checks if there are any product terms remaining in Boolean difference set, and if there are product terms remaining, then flow i) continues to a step 387; if no product terms are remaining, then flow continues to a step 386. A step 386 checks if there are more possible Boolean difference product terms, and if there are more possible product terms, flow continues to a step 388, which will get the next Boolean difference set, which is found via FIG. 18. If there are no more Boolean difference product terms possible in the step 386, then a step 389 removes the custom block selected on the path from the list of already constrained custom logic blocks defined in the step 278 of FIG. 16.

A step 391 checks for more custom logic blocks in the list of constrained custom logic blocks; if there are more custom logic blocks in the list of constrained custom logic blocks, then go back to the step 384; if there are no more custom logic blocks in the list of constrained custom logic blocks, then the flow continues to a step 393, which indicates that the path is untestable. A step 390 checks if the current logic value constraints, set on the Boolean difference product term, conflicts with the needed logic value constraints. If there is a conflict with the current logic value constraints with the needed logic value constraints in the step 390, then flow continues back to the step 385; else flow continues to a step 392. A step 392 sets the input logic value constraints to make the product term logic one, in order to justify the input values, which will sensitize the path. A step 394 calls the Set Custom Block Constraints procedure in order to add and set constraints on the custom logic blocks that were removed in the step 389, which is described in more detail in FIG. 16. If the path is found to be untestable in the step 394, then the path is declared untestable in the step 393; else the Boolean Difference Conflict procedure is exited in a step 396.

Figure 23:
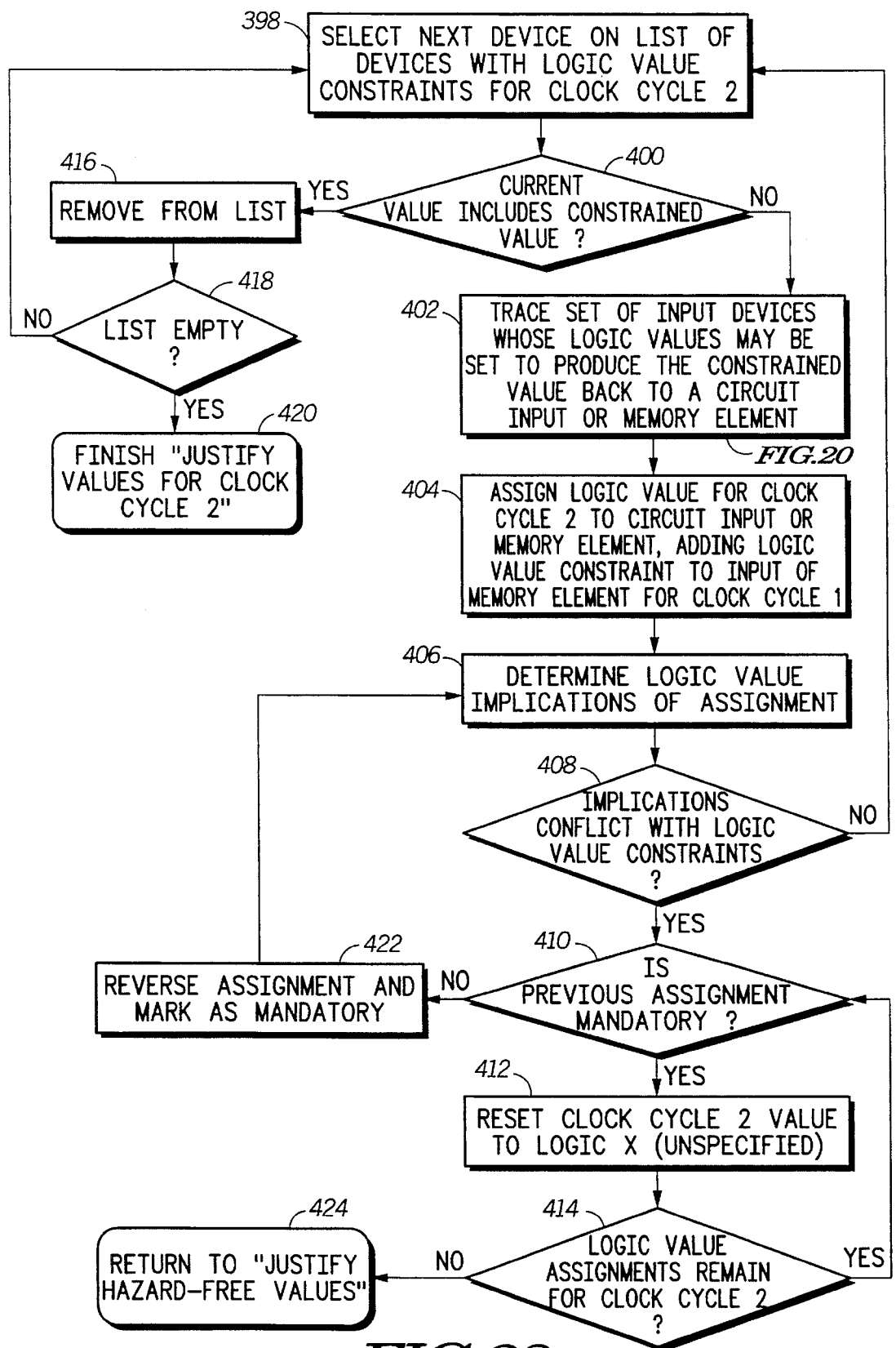
FIG. 23 illustrates, in a flowchart, several specific steps which are involved when justifying values for a second clock cycle as illustrated in FIG. 15 in accordance with the present invention.

FIG. 23 illustrates the flowchart for the step 260 in FIG. 15. A step 398 selects the next circuit device on the list of devices with logic value constraints for the second clock cycle. A step 400 examines the selected circuit device to see if its current logic value includes the logic value required by the logic value constraint. A first logic value is said to include a second logic value if all the requirements for the second logic value are also met by the first logic value. If the current logic value does not include the logic value required by the logic value constraint, then a step 402 initiates a process of backtracing from the input devices of the selected circuit device is initiated. The backtracing process in the step 402 is illustrated in more detail in FIG. 20. The logic value that is needed to assist in producing the value required by the logic value constraint for the second clock cycle on the initially selected circuit device is assigned to the circuit input terminal or scannable flip-flop in a step 404. A step 406 performs a logic simulation to determine the logic value implications of the logic value assignment made in the step 404.

Circuit devices that are simulated are checked for conflict with their logic value constraints in a step 408. If no conflict is determined in the step 408, the flow returns to the step 398. If there is conflict between the current logic value and the logic value constraint for some circuit element in the step 408, a step 410 examines the previous logic value assignment to see if it is a mandatory assignment, i.e., an assignment that is either required to have its present value by some logic value constraint in the circuit model or has already had the inverse value for the second clock cycle simulated and found to cause conflict. If the previous assignment is not mandatory, then its logic value assignment is inverted and marked as mandatory in a step 422 and flow returns to the step 406. If the previous assignment is mandatory in the step 410, then a step 412 returns the circuit input terminal or scannable flip-flop to which the previous logic value assignment had been made to an unspecified state (logic value X) for the second clock cycle and the record of the previous logic value assignment is removed from the list of such records.

A step 414 examines the list of records of logic value assignments to see if more records remain on the list. If there are more records on the list, flow returns to the step 410. If there are no more records of logic value assignments on the list, then all possible logic value assignments for the second clock cycle have been tried and found to produce conflict with required logic value constraints, so some of the hazard-free assignments made in the step 258 of FIG. 15 have made it impossible to complete the generation of the test vector, so a step 424 returns to the step 258 of FIG. 15 to attempt to find a different assignment of hazard-free values that will allow the successful generation of a test vector. If the step 400 reveals that the current logic value does include the logic value required by the logic value constraint, a step 416 removes the selected logic device from the list of devices with logic value constraints for the second clock cycle.

A step 418 examines the list of circuit devices with logic value constraints for the second clock cycle to see if the list is empty. If the step 418 reveals that the list of circuit devices with logic value constraints for the second clock cycle is not empty, then flow returns to the step 398. If the step 418 reveals that the list of circuit devices with logic value constraints for the second clock cycle is empty, then the Justify Values For Clock Cycle 2 procedure is exited in a step 420.

Figure 24:
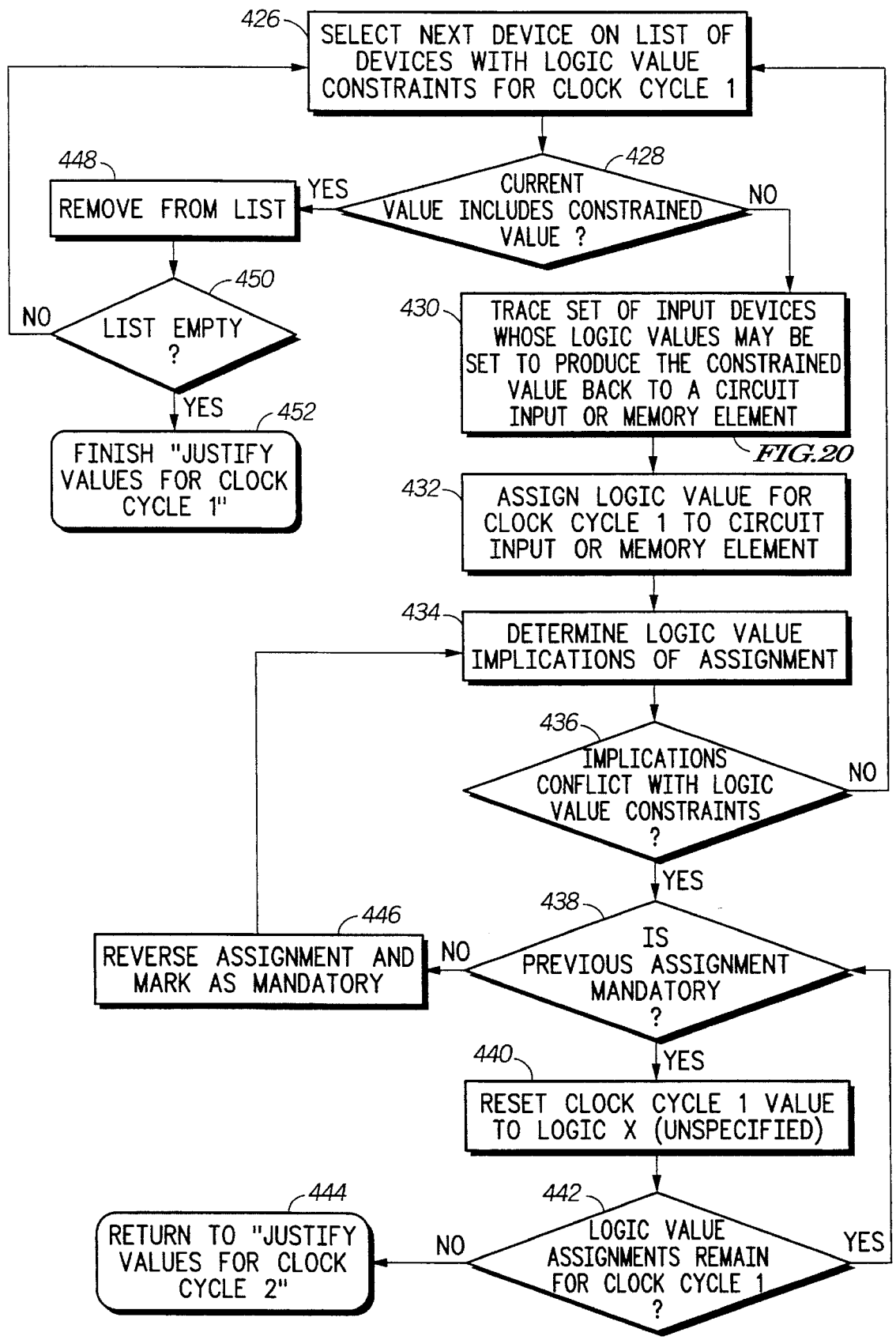
FIG. 24 illustrates, in a flowchart, several specific steps which are involved when justifying values for a first clock cycle as illustrated in FIG. 15 in accordance with the present invention.

FIG. 24 illustrates the flowchart for the step 262 in FIG. 15. A step 426 selects the next circuit device on the list of devices with logic value constraints for the first clock cycle. A step 428 examines the selected circuit device to see if its current logic value includes the logic value required by the logic value constraint. If the current logic value does not include the logic value required by the logic value constraint, then a step 430 initiates a process of backtracing from the input devices of the selected circuit device is initiated. The backtracing process in the step 430 is illustrated in more detail in FIG. 20. The logic value that is needed to assist in producing the logic value required by the logic value constraint for the first clock cycle on the initially selected circuit device is assigned to the circuit input terminal or scannable flip-flop in a step 432. A step 434 performs a logic simulation to determine the logic value implications of the logic value assignment made in the step 432.

Circuit devices that are simulated are checked for conflict with their logic value constraints in a step 436. If no conflict is determined in the step 436, the flow returns to the step 426. If there is conflict between the current logic value and the logic value constraint for some circuit element in the step 436, a step 438 examines the previous logic value assignment to see if it is a mandatory assignment, i.e., an assignment that is either required to have its present value by some logic value constraint in the circuit model or has already had the inverse logic value for the first clock cycle simulated and found to cause conflict. If the previous assignment is not mandatory, then its logic value assignment for the first clock cycle is inverted and marked as mandatory in a step 446 and flow returns to the step 434. If the previous assignment is mandatory, then the circuit input terminal or scannable flip-flop to which the previous assignment had been made is returned to an unspecified state (logic value X) for the first clock cycle and the record of the previous logic value assignment is removed from the list of such records in a step 440.

A step 442 examines the list of records of logic value assignments to see if more records remain on the list. If there are more records on the list, flow returns to the step 438. If there are no more records of logic value assignments on the list, then all possible logic value assignments for the first clock cycle have been tried and found to produce conflict with requires logic value constraints, so some of the assignments for the second clock cycle made in the step 260 of FIG. 15 have made it impossible to complete the generation of the test vector and a step 444 returns to the step 260 of FIG. 15 to attempt to find a different assignment of values for the second clock cycle that will allow the successful generation of a test vector. If the examination in the step 428 reveals that the current logic value does include the logic value required by the logic value constraint, a step 448 removes the selected logic device from the list of devices with logic value constraints for the first clock cycle. A step 450 examines the list of circuit devices with logic value constraints for the first clock cycle to see if the list is empty. If the step 450 reveals that the list of circuit devices with logic value constraints for the first clock cycle is not empty, then flow returns to the step 426. If the step 450 reveals that the list of circuit devices with logic value constraints for the first clock cycle is empty, then the Justify Values For Clock Cycle 1 procedure is exited in a step 452.

The above FIGS. 1–24 illustrate one or more in which test vectors can be generated. The process of generating vectors for testing may be complex, as discussed in the methods above, or simple. In any case, engineers which design/create test vectors or program/algorithms/systems/etc. which generate test vectors may generate erroneous test vectors due to mistakes, human error, hardware "bugs", and/or computer software "bugs". Therefore, the test vectors generated or provided for testing should be verified before use. If a method A is used to generate the vectors then the method A should not be used to verify the vectors since both the generating method A and the verifying method A may contain the same error/bug. Instead, if a method A is used to generate the vectors (or if they are provided by an engineer's hand-performed calculations) then a method B should be used to verify the test vector for correctness. The chance that both method A and method B have the same error for the same input conditions is, although not impossible, highly unlikely. The verification of path delay test vectors is therefore very useful, needed in many complex designs, and described in FIGS. 25–42 below.

FIGS. 26 through 37 illustrate in block diagrams a specific circuit, which is also the same specific circuit described in FIGS. 2 through 5, to illustrate how path delay test vectors are verified for correct functionality. The specific circuit in FIGS. 26 through 37 is used to describe how the simulation/verification process is performed on a circuit.

One or more test vector patterns generated from the test vector generator 164 in FIG. 11 (or any test vector(s) generated/provided in any manner) are copied into a pattern array data structure, which stores the input bit values for the first and second clock cycle of each circuit path delay test vector in the following manner (the following example will be termed Example H):

Example H

| Pattern Array Data Structure | | | | | | | |
|---|---|---|---|---|---|---|---|
| A | B | C | D | H | I | J | |
| 1 | 1 | 0 | 0 | 0 | 1 | 1 | 1st. clock cycle |
| 0 | 1 | 1 | 1 | — | — | — | 2nd. clock cycle |
| 0 | 1 | 0 | 0 | 0 | 0 | 0 | 1st. clock cycle |
| 1 | 0 | 0 | 1 | — | — | — | 2nd. clock cycle |
| 1 | 0 | 1 | 1 | 0 | 1 | 1 | 1st. clock cycle |
| 0 | 0 | 0 | 0 | — | — | — | 2nd. clock cycle |
| 1 | 1 | 1 | 0 | 1 | 0 | 1 | 1st. clock cycle |
| 1 | 0 | 1 | 0 | — | — | — | 2nd. clock cycle |

Figure 25:
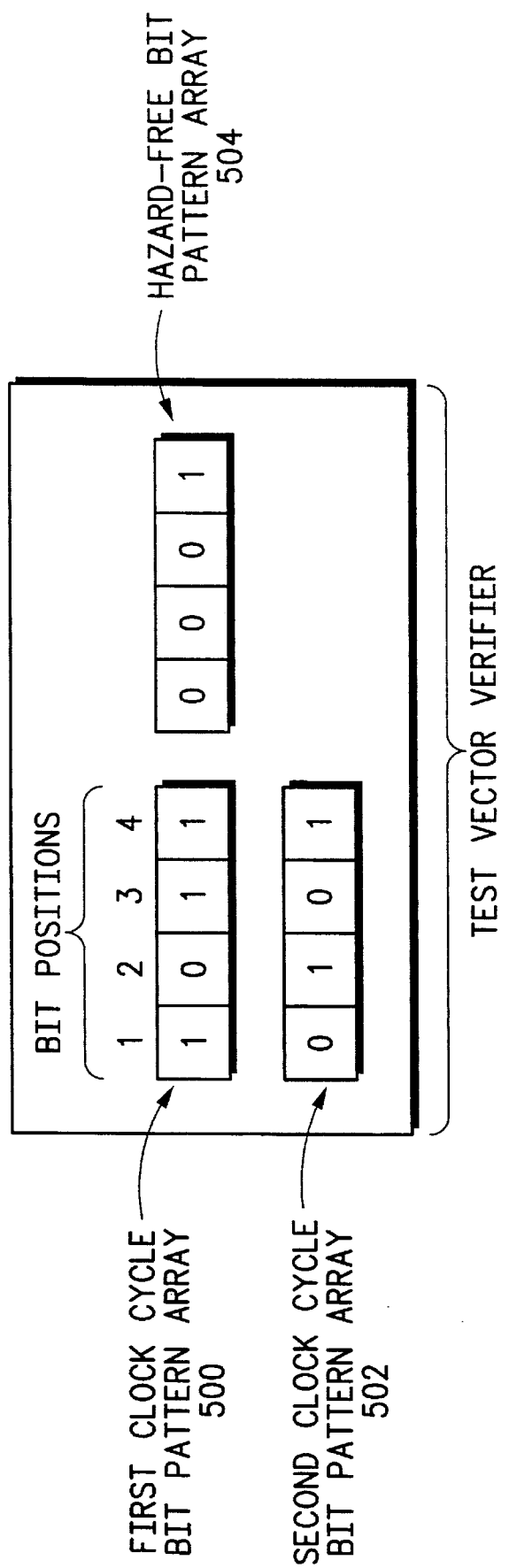
FIG. 25 diagrammatically illustrates, a bit pattern data structure for an element in accordance with the present invention.

The Example H illustrates how the bit pattern of a test vector is stored in the pattern array data structure used by test vector verifier 165. The bit values for each input are stored in a format that is a function of the specified clock cycle. The title row of the above table in Example H, labeled ABCDHIJ, illustrates that there are four inputs A, B, C, D in FIGS. 26–39 and three flip-flops H (flip-flop 526), I (flip-flop 576), and J (flip-flop 592) in FIGS. 26–39. The first data row of the above table illustrates the bit pattern 1100011, which is a test vector for the circuit of FIGS. 26–39. This test vector is used, as illustrated in FIG. 11 herein, to test a speed path of a circuit. This test pattern is loaded, in either a parallel or a serial fashion, into a bit word array that is placed within the test verifier (the bit word array format is illustrated in FIG. 25 and discussed below) for each input and flip-flop respectively for clock cycle one. For example in the bit pattern 1100011, A=1, B=1, C=0, D=0, H=0, I=1, and J=1. Therefore, the first bit in box 506 (which represent the first clock cycle data in FIG. 26) is assigned to 1 because A=1 for this first test vector. The first bit in box 512 is set to 1 because B=1. The first bit in box 540 is set to 0 because C=0 for this first test vector, and so on throughout all ABCDHIJ elements.

Figure 26:
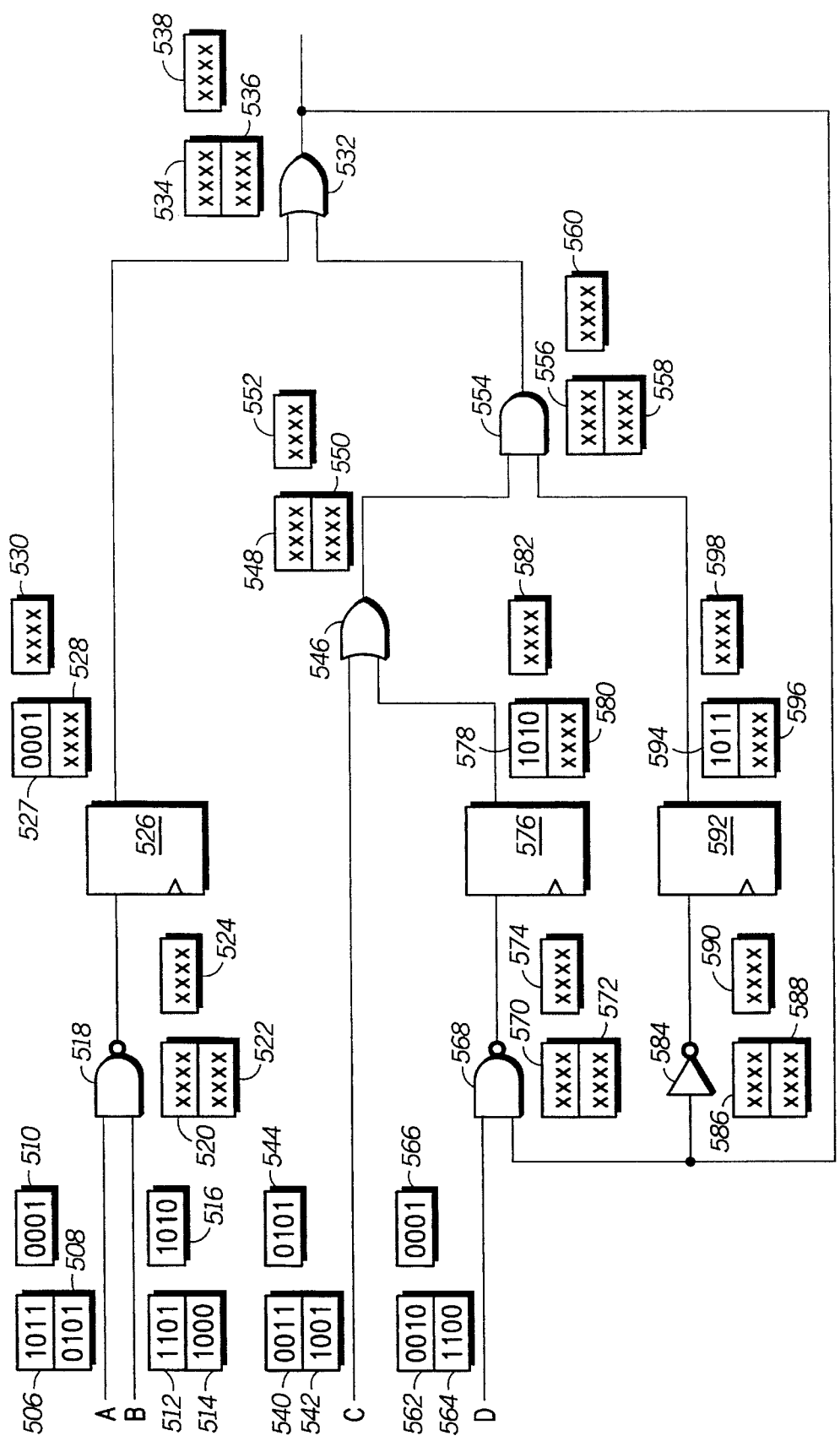
FIGS. 26–39 illustrate, in block diagrams, a specific circuit which is undergoing the test verification process by generating input and output bit patterns for all circuit elements along the specific circuit path for both the first test cycle and the second test cycle in accordance with the present invention.

The second data row of the above table illustrates the bit pattern 0111—, where '—' indicates a nonexistent bit value in the test vector. Typically, the '—' value signifies that these values are determined in the second clock cycle based upon inputs in the first clock cycle and are not required as test vector inputs. The bit pattern of the third row will be loaded into a bit word array that is placed/located within the test verifier for each input and flip-flop respectively for test clock cycle two. For example, the value A=0 for clock cycle two is placed in the first (leftmost) bit position of box 508 in FIG. 26. The bit values B=C=D=1 from row three of the above table means that the first bits (leftmost bits) in boxes 514, 542, and 564 of FIG. 26 are set to a logic 1. All of the 1st clock cycle rows of the above table will all be loaded in parallel into a bit word array that is placed within the test verifier for each input and flip-flop respectively for clock cycle one. For example, in the second bit pattern for clock cycle one which comprises a portion of a second test vector is 0100000 wherein A=0, B=1, C=0, etc. These values can be found in the second (second from the left) entry in the bit word arrays of FIG. 26 which correspond to A, B, C, D, H, I, or J for the first clock cycle. The 2nd clock cycle rows will all be loaded in parallel into a bit word array that is placed within the test verifier for each input and flip-flop respectively for clock cycle two. These values can be seen in the second bit word arrays 508, 514, 542, and 564 of FIG. 26. These values are the initial values which collectively define test vectors. In the above table, four test vectors are given, resulting in bit word array entries in FIG. 26, which are four bits wide.

FIG. 25 illustrates an example bit pattern data structure used to store one or more test vectors for verification via the test verifier 165 of FIG. 11. For simplicity, only one data structure used for one input or flip-flop is illustrated in FIG. 25. If N test vectors are to be verified in parallel, then N bits are needed in each array 500, 502, and 504 in FIG. 25. A four bit pattern data structure is illustrated in FIG. 25, however other bit sizes are allowed. The test verifier 165 has a bit pattern data structure for each input, logic element, and scannable flip-flop. The bit pattern array 500 stores the bit pattern for the first clock cycle for a specified input, logic element, or flip-flop.

For example, input A in the pattern bit array data structure of Example H has the bit values (1011) for the first clock cycle, which is stored in the first clock cycle bit array structure 500 in FIG. 25 (one bit for each of the four test vectors in Example H above). The bit word array 502 stores the bit pattern for the second clock cycle for the specified input, logic element, or flip-flop. For example, input A in the pattern bit array data structure in Example H uses the bit pattern (0101) for the second clock cycle, which is stored in the second clock cycle bit array structure 502 in FIG. 25. The bit word array 504 stores the bit pattern that indicates what bits in the bit pattern 500 and bit pattern 502 are hazard free for the specified input, logic element, or flip-flop. For example, in FIG. 25 both the bit pattern 500 and bit pattern 502 have a steady or hazard free one in bit position four. This means that in order to guarantee a robust test without error, the value of A=1 for clock cycles 1 and 2 of test vector four should be a hazard free one (i.e., free of any glitches as discussed above). In addition, the calculation process of determining hazard free values depends on whether the inputs to the element produce values which are hazard free. If an input is not hazard free, then all other values dependent upon this input may not be guaranteed as being hazard free values. This method of hazard free determination is described in more detail in FIG. 41. All bit positions for the bit pattern data structure are read from left to right.

FIG. 26 illustrates a specific circuit, whose test vector(s) were generated by the test vector generator 164 in FIG. 11. After the test vector(s) are loaded into the pattern data array structure as described in Example H above, the bit patterns are loaded into the bit pattern array structures of the test verifier 165 in a manner described in the FIG. 25. While each of the bit pattern data structures in FIG. 26 can only hold four pattern bits, the maximum number of pattern bits that the bit pattern array can hold is dependent on the word size of the machine. Typically, a larger size which cannot easily be illustrated, such as 32-bits, is used. All of the bit patterns in FIG. 26 which are not defined via the input test pattern are first initialized to a value of 'x', where the 'x' means that no binary value has been assigned yet. The bit pattern array 506 of input A (for the first clock cycle) obtains the bit pattern by using the bit values in Example H from column A data row one (bit value 1), column A data row four(bit value 0), column A data row seven(bit value 1), and column A data row ten (bit value 1) to form a bit pattern ('1011'). The bit pattern array 508 of input A (for the second clock cycle) obtains the bit pattern, '0101', by using the bit values in Example H from column A data row two (bit value 0), column A data row five (bit value 1), column A data row eight(bit value 0), and column A data row eleven (bit value 1) to form a bit pattern ('0101'). The hazard free bit array 510 of input A obtains the bit pattern, '0001', by using the bit patterns of both 506 and 508 and checking for a hazard free value in a manner as described in FIGS. 25 and 41.

The bit pattern array 512 of input B (for the first clock cycle) obtains the bit pattern, '1101', by using the bit values in Example H from column B row one ( bit value 1), column B row four(bit value 1), column B row seven(bit value 0), and column B row ten (bit value 1) to form a bit pattern ('1101'). The bit pattern array 514 of input B (for the second clock cycle) obtains the bit pattern, '1000', by using the bit values in Example H from column B row two (bit value 1), column B row five (bit value 0), column B row eight(bit value 0), and column B row eleven (bit value 0) to form a bit pattern ('1000'). The hazard free bit array 516 of input B obtains the bit pattern, '1010', by using the bit patterns of both 512 and 514 and checking for a hazard free value in a manner as described in FIGS. 25 and 41. This assigning of bits to the data structure is continued until all the bits from Example H are entered into a data structure corresponding to the elements in FIG. 26.

The bit pattern array 520 of NAND gate 518 (output of NAND gate 518 for the first test clock cycle) has a bit pattern of 'xxxx', which indicates that a bit pattern has yet to be determined. Also, the bit pattern array 522 of NAND gate 518 (output of NAND gate 518 for the second clock cycle) has a pattern of 'xxxx', which indicates that a pattern has also yet to be determined. Since, the bit patterns for both bit pattern arrays 520 and 522 have not been determined, the hazard free bit array pattern 524 has also not been determined at this point in time.

The bit pattern array 527 of flip-flop 526 (for the first clock cycle) obtains the bit pattern by using the bit values in Example H from column H row one ( bit value 0), column H row four(bit value column H row seven(bit value 0), and column H row ten (bit value 1) to form a bit pattern ('0001'). The bit pattern array 528 of flip-flop 526 (for the second clock cycle) does not have any bit values, as shown in Example H via the '—' symbol, to form a bit pattern. Therefore, no hazard free bit pattern can be determined for the hazard free bit array 530.

The bit pattern array 534 of OR gate 532 (output for the first clock cycle) has a bit pattern of 'xxxx', which indicates that a pattern has yet to be determined. Also, the bit pattern array 536 of OR gate 532(output for the second clock cycle) has a pattern of 'xxxx', which indicates that a pattern has yet to be determined. Since, the bit patterns for both bit pattern arrays 534 and 536 have not been determined, the hazard free bit array pattern 538 has also yet to be determined.

The bit pattern array 540 of input C (for the first clock cycle) obtains the bit pattern by using the bit values in Example H from column C row one (bit value 0), column C row four(bit value 0), column C row seven(bit value 1), and column C row ten (bit value 1) to form a bit pattern ('0011'). The bit pattern array 542 of input C (for the second clock cycle) obtains the bit pattern, '1001', by using the bit values in Example H from column C row two (bit value 1), column C row five (bit value 0), column C row eight(bit value 0), and column C row eleven (bit value 1) to form a bit pattern ('1001'). The hazard free bit array 544 of input C obtains the bit pattern, '0101', by using the bit patterns of both 540 and 542 and checking for a hazard free value in a manner as described in FIGS. 25 and 41. Specifically, the constant zero in position two of arrays 540 and 542 and the constant one in position four of arrays 540 and 542 has been determined to be a hazard-free zero and a hazard-free one, respectively.

The bit pattern array 548 of OR gate 546 (output for the first clock cycle) has a bit pattern of 'xxxx', which indicates that a pattern has yet to be determined. Also, the bit pattern array 550 of OR gate 546(output for the second clock cycle) has a pattern of 'xxxx', which indicates that a pattern has yet to be determined. Since, the bit patterns for both bit pattern arrays 548 and 550 have not been determined, the hazard free bit array pattern 552 has also yet to be determined.

The bit pattern array 556 of AND gate 554 (output for the first clock cycle) has a bit pattern of 'xxxx', which indicates that a pattern has yet to be determined. Also, the bit pattern array 558 of AND gate 554(output for the second clock cycle) has a pattern of 'xxxx', which indicates that a pattern has yet to be determined. Since, the bit patterns for both bit pattern arrays 556 and 558 have not been determined, the hazard free bit array pattern 560 has also yet to be determined.

The bit pattern array 562 of input D (for the first clock cycle) obtains the bit pattern, '0010', by using the bit values in Example H from column D row one (bit value 0), column D row four(bit value 0), column D row seven(bit value 1), and column D row ten (bit value 0) to form a bit pattern ('0010'). The bit pattern array 564 of input D for the second clock cycle) obtains the bit pattern, '1100', by using the bit values in Example H from column D row two (bit value 1), column D row five (bit value 1), column D row eight(bit value 0), and column D row eleven (bit value 0) to form a bit pattern ('1100'). The hazard free bit array 566 of input D obtains the bit pattern, '0001', by using the bit patterns of both 562 and 564 and checking for a hazard free value in a manner as described in FIGS. 25 and 41*s*.

The bit pattern array 570 of NAND gate 568 (output for the first clock cycle) has a bit pattern of 'xxxx', which indicates that a pattern has yet to be determined. Also, the bit pattern array 572 of NAND gate 568(output for the second clock cycle) has a pattern of 'xxxx', which indicates that a pattern has yet to be determined. Since, the bit patterns for both bit pattern arrays 570 and 572 have not been determined, the hazard free bit array pattern 574 has also yet to be determined.

The bit pattern array 578 of flip-flop 576 (output for the first clock cycle) obtains the bit pattern by using the bit values in Example H from column I row one (bit value=1), column I row four(bit value=0), column I row seven(bit value=1), and column I row ten (bit value=0) to form a bit pattern ('1010'). The bit pattern array 580 of flip-flop 576 (for the second clock cycle) does not have any bit values, as shown in Example H, to form a bit pattern. Therefore, no hazard free bit pattern can be determined for the hazard free bit array 582.

The bit pattern array 586 of inverter 584 (output for the first clock cycle) has a bit pattern of 'xxxx', which indicates that a pattern has yet to be determined. Also, the bit pattern array 588 of inverter 584(output for the second clock cycle) has a pattern of 'xxxx', which indicates that a pattern has yet to be determined. Since, the bit patterns for both bit pattern arrays 586 and 588 have not been determined, the hazard free bit array pattern 590 has also yet to be determined.

The bit pattern array 594 of flip-flop 592 (output for the first clock cycle) obtains the bit pattern by using the bit values in Example H from column J row one (bit value=1), column J row four(bit value=0), column J row seven(bit value=1), and column J row ten (bit value=1) to form a bit pattern ('1011'). The bit pattern array 596 of flip-flop 592 (for the second clock cycle) does not have any bit values, as shown in Example H, to form a bit pattern. Therefore, no hazard free bit pattern can be determined for the hazard free bit array 598.

Once these initial conditions (i.e., initial test vector values) are set in the data structure for a circuit from circuit model 160, then the test vectors are verified as discussed below in FIGS. 27–39.

Figure 27:
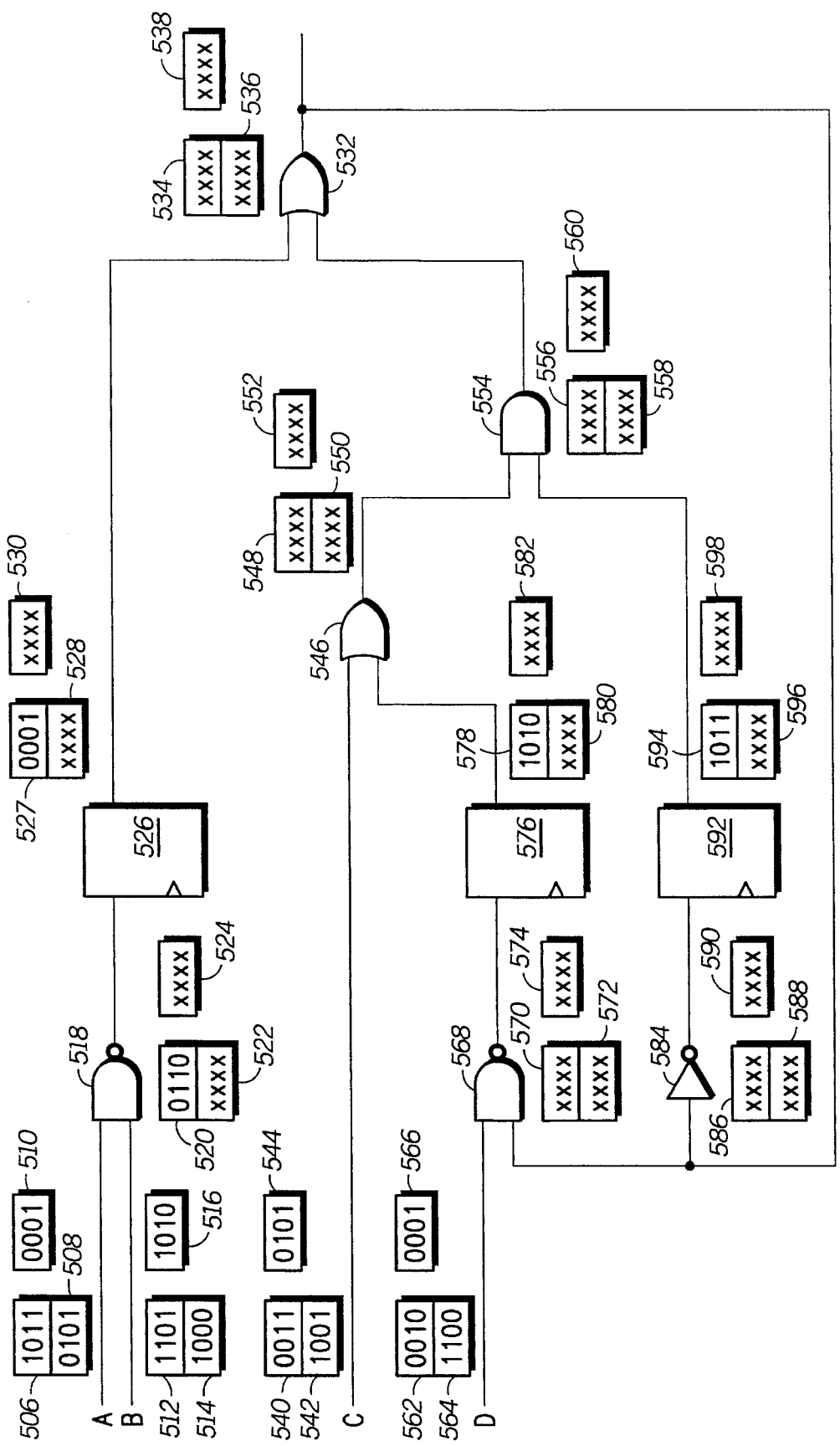

FIG. 27 is a further illustration of the test verification process for the specific circuit in FIG. 26. The bit pattern array 520 of NAND 518 (for the first clock cycle) has changed from a bit pattern of 'xxxx' (as shown in FIG. 26) to a bit pattern of '0110' by NANDing the bit pattern 506 ('1011') and the bit pattern 512 ('1101'). In other words, in order to calculate the first clock cycle for the output of the NAND gate 518, the first clock cycles for the inputs of the NAND gate must be NANDed together. The NAND gate produces the same result as an inverted AND gate. Therefore, the bit pattern 506('1011') is ANDed with bit pattern 512 ('1101'), which produces the bit pattern ('1001'), and the bit pattern ('1001') is inverted, which produces the final bit pattern ('0110') for the bit pattern 520.

Figure 28:
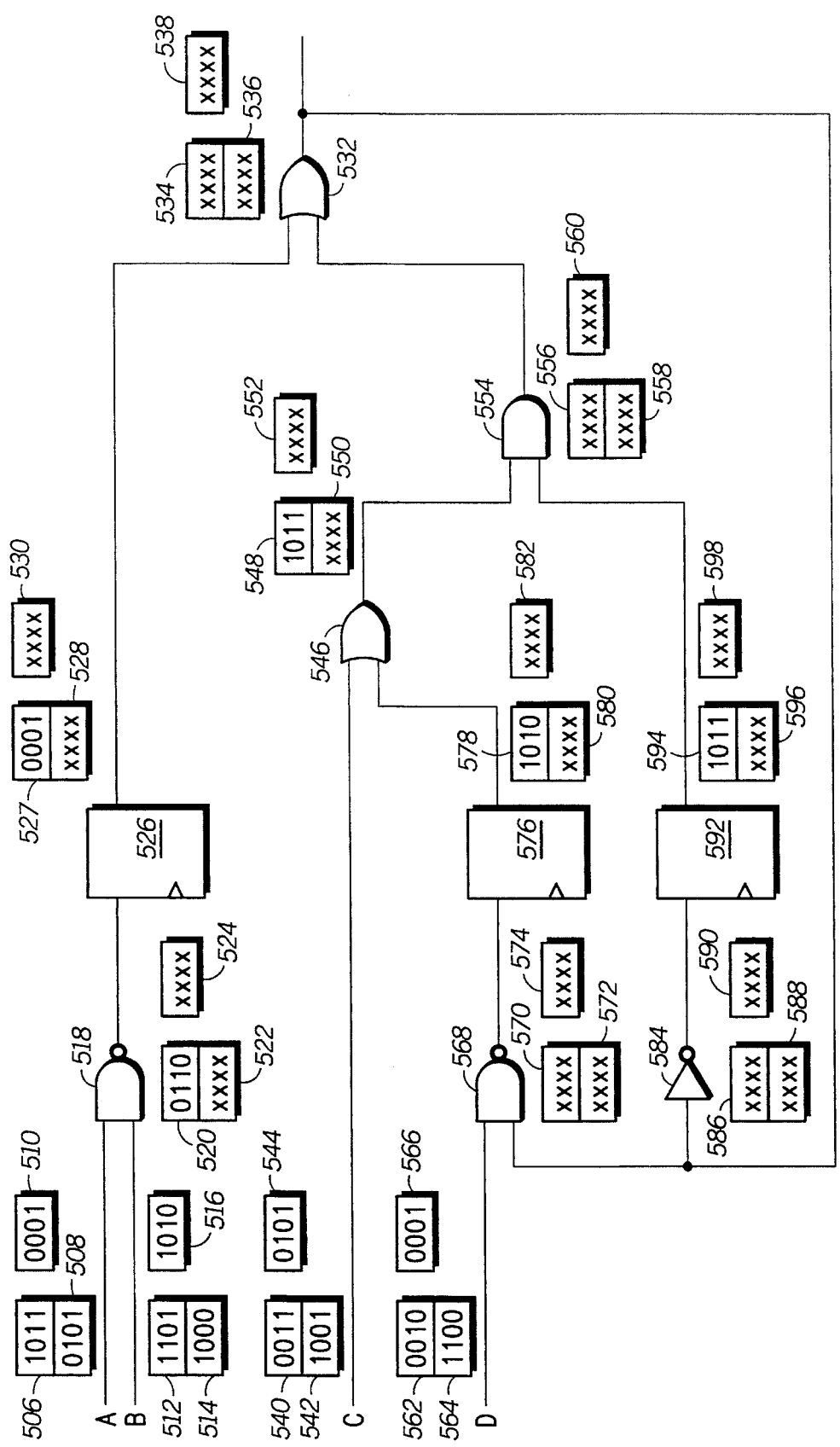

FIG. 28 is a further illustration of the test verification process for the specific circuit in FIG. 27. The bit pattern array 548 of OR gate 546 (for the first clock cycle) has changed from a bit pattern of 'xxxx' (as shown in FIG. 27) to a bit pattern of '1011' by ORing the bit pattern 540 ('0011') and the bit pattern 578 ('1010'). In other words, in order to calculate the first clock cycle output for the OR gate 546, the first clock cycles for the inputs of the OR gate must be ORed. Therefore, the bit pattern 540 ('0011') is ORed with bit pattern 578 ('1010'), which produces the final bit pattern ('1011') for the bit pattern 548.

Figure 29:
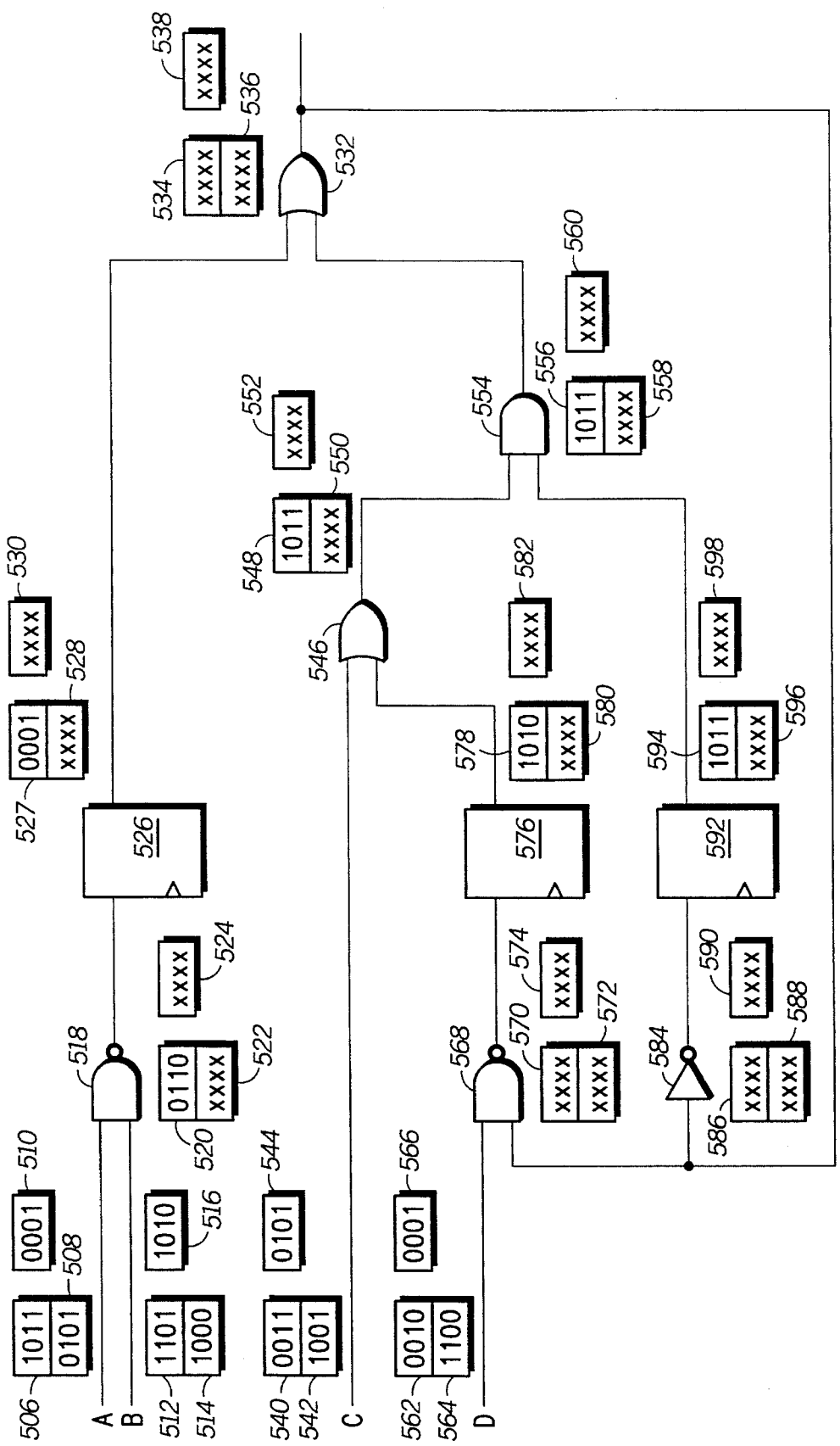

FIG. 29 is a further illustration of the test verification process for the specific circuit in FIG. 28. The bit pattern array 556 of AND gate 554 (for the first clock cycle) has changed from a bit pattern of 'xxxx' (as shown in FIG. 28) to a bit pattern of '1011' by ANDing the bit pattern 548 ('1011') and the bit pattern 594 ('1011'). In other words, in order to calculate the first clock cycle for the AND gate 554, the first clock cycles for the inputs of the AND gate must be ANDed. Therefore, the bit pattern 548 ('1011') is ANDed with bit pattern 594 ('1011'), which produces the final bit pattern ('1011') for the bit pattern 556.

Figure 30:
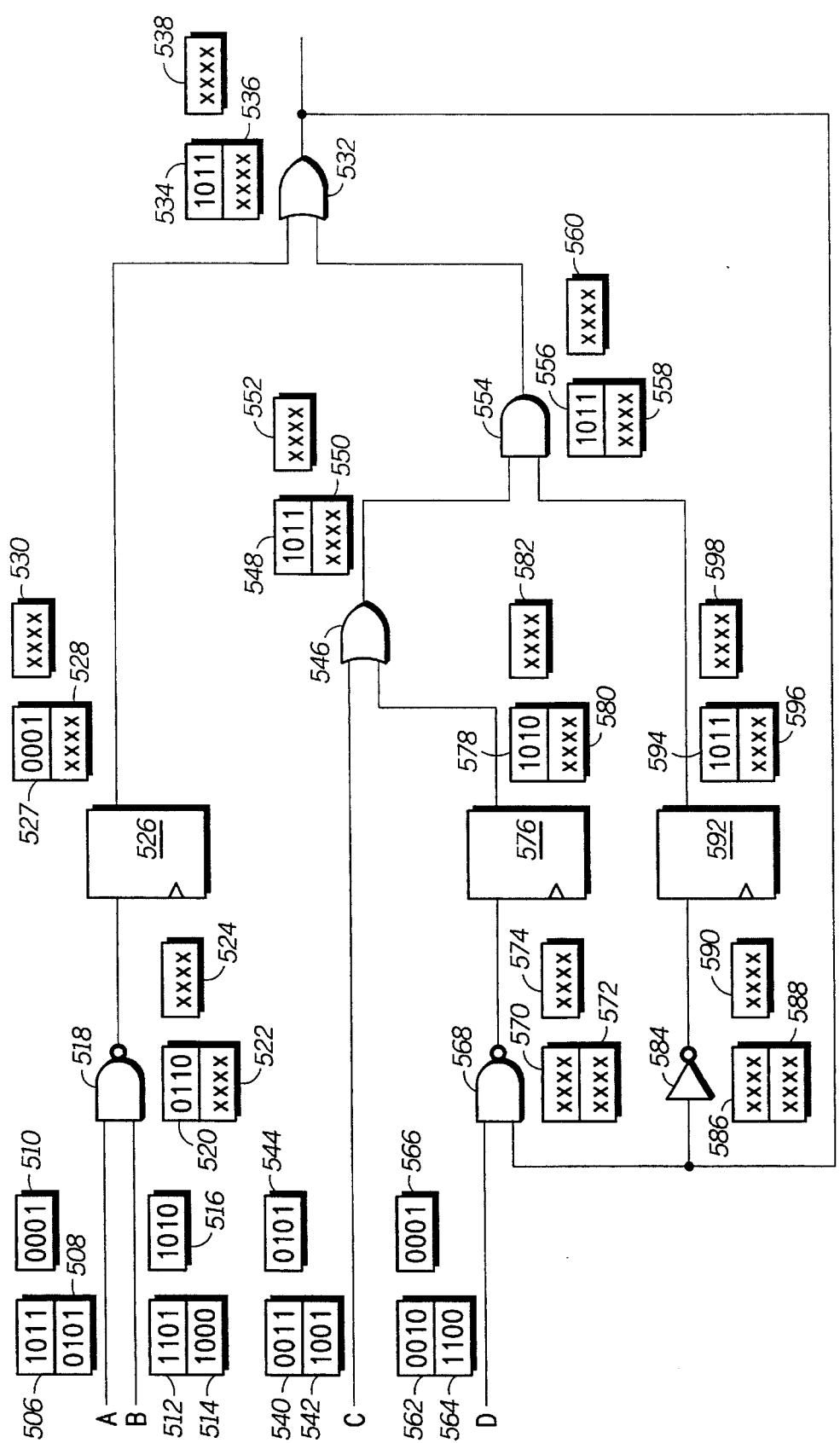

FIG. 30 is a further illustration of the test verification process for the specific circuit in FIG. 29. The bit pattern array 534 of OR gate 532 (for the first clock cycle) has changed from a bit pattern of 'xxxx' (as shown in FIG. 29) to a bit pattern of '1011' by ORing the bit pattern 527 ('0001') and the bit pattern 556 ('1011'). In other words, in order to calculate the first clock cycle for the OR gate 532, the first clock cycles for the inputs of the OR gate must be ORed. Therefore, the bit pattern 527 ('0001') is ORed with bit pattern 556 ('1011'), which produces the final bit pattern ('1011') for the bit pattern 534.

Figure 31:
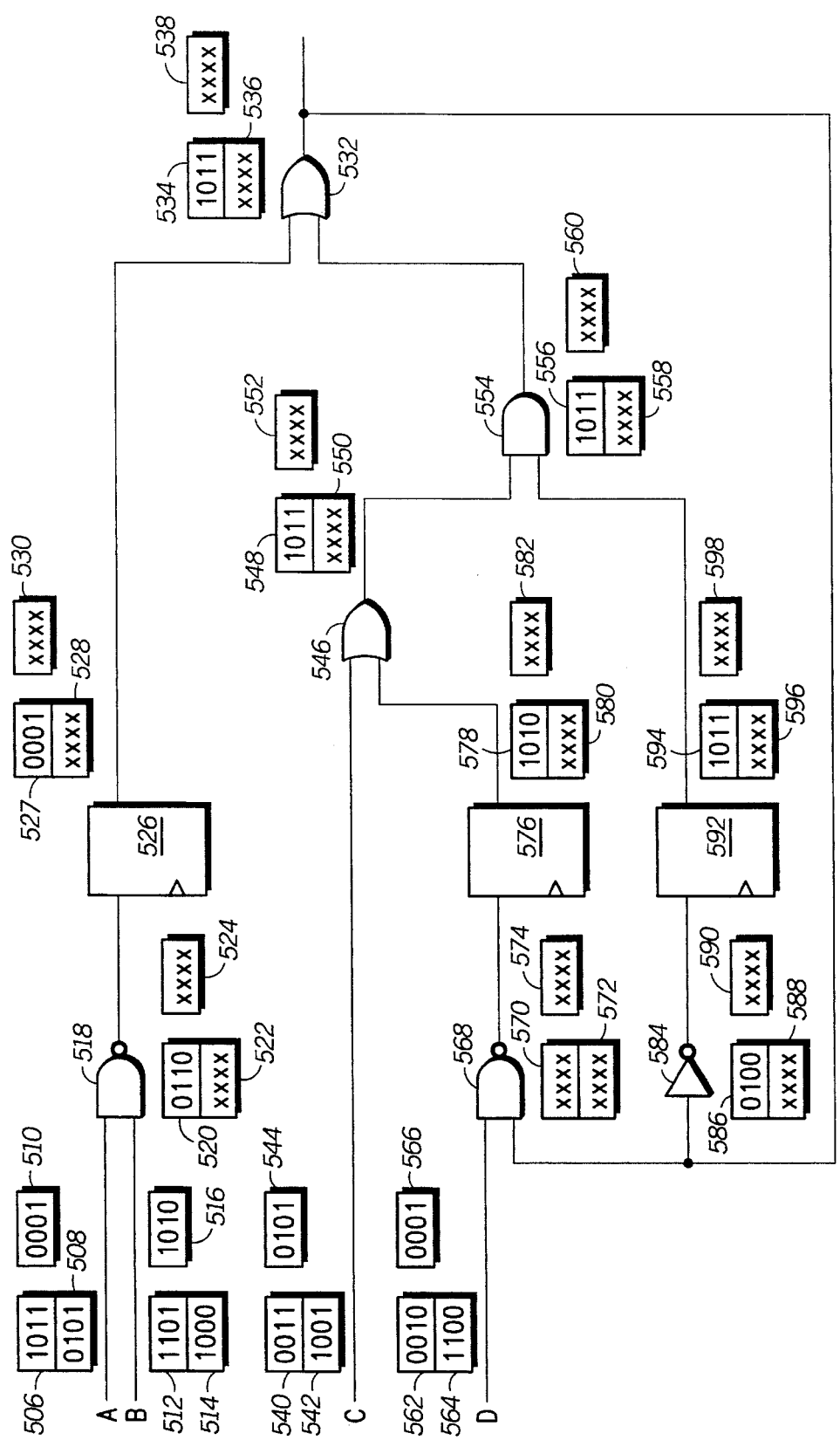

FIG. 31 is a further illustration of the test verification process for the specific circuit in FIG. 30. The bit pattern array 586 of the inverter gate 584 (for the first clock cycle) has changed from a bit pattern of 'xxxx' (as shown in FIG. 30) to a bit pattern of '0100' by inverting the bit pattern 534 ('1011'). In other words, in order to calculate the first clock cycle output for the inverter 584, the first clock cycles for the inputs of the inverter must be inverted. Therefore, the bit pattern 534 ('1011') is inverted, which produces the final bit pattern ('0100') for the bit pattern 586.

Figure 32:
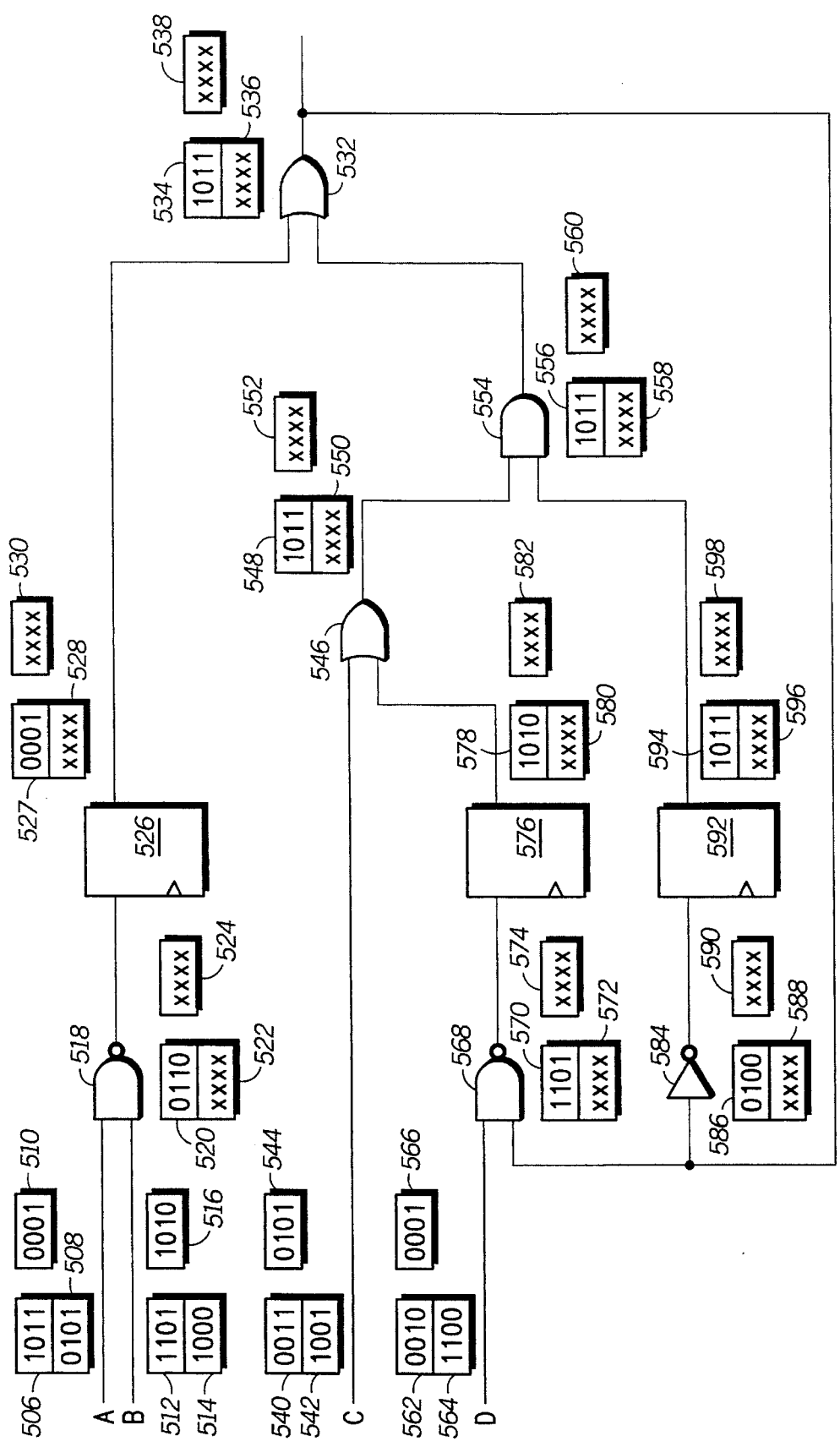

FIG. 32 is a further illustration of the test verification process for the specific circuit in FIG. 31. The bit pattern array 570 of NAND 568 (for the first clock cycle) has changed from a bit pattern of 'xxxx' (as shown in FIG. 31) to a bit pattern of '1101' by NANDing the bit pattern 562 ('0010') and the bit pattern 534 ('1011'). In other words, in order to calculate the first clock cycle for the NAND gate 568, the first clock cycles for the inputs of the NAND gate must be NANDed. The NAND gate produces the same result as an inverted AND gate. Therefore, the bit pattern 562 ('0010') is ANDed with bit pattern 534 ('1011'), which produces the bit pattern ('0010'), and the bit pattern ('0010') is inverted, which produces the final bit pattern ('1101') for the bit pattern 570.

Figure 33:
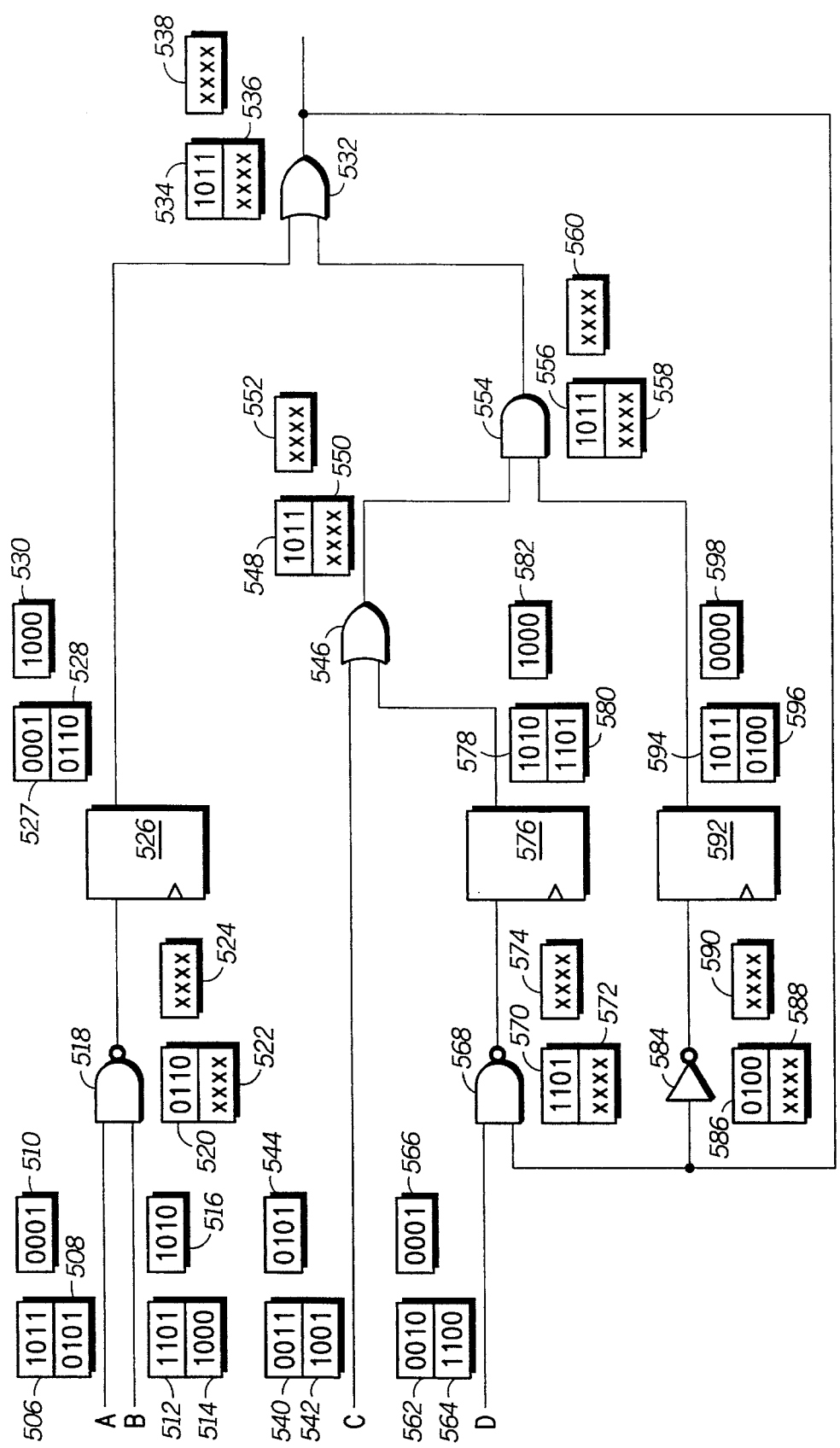

FIG. 33 is a further illustration of the test verification process for the specific circuit in FIG. 32. The bit pattern array 528 of flip-flop 526 (for the second clock cycle) has changed from a bit pattern of 'xxxx' (as shown in FIG. 32) to a bit pattern of '0110' by copying the bit pattern of the bit pattern array 520 ('0110') into the bit pattern array 528. Since, the flip-flop 526 objective is to store bit values of the previous clock cycle (i.e. D flip-flop), the bit pattern output for the second clock cycle of the flip-flip 526 is the same as the bit pattern output from the first clock cycle of the NAND gate 518. This methodology will change slightly in order to implement other flip-flops such as a T flip-flop, etc. The bit pattern of the hazard free bit array 530 is calculated in a similar manner as described in the FIG. 25. Thus, the bit pattern of the hazard free bit array 530 has a bit pattern of '1000'.

Also, in FIG. 33, the bit pattern array 580 of flip-flop 576 (for the second clock cycle) has changed from a bit pattern of 'xxxx' (as shown in FIG. 32) to a bit pattern of '1101' by copying the bit pattern of the bit pattern array 570 ('1101') into the bit pattern array 580. Since, the flip-flop 576 objective is to store bit values of the previous clock cycle (i.e. D flip-flop), the bit pattern output for the second clock cycle of the flip-flop 576 is the same as the bit pattern output from the first clock cycle of the NAND gate 568. The bit pattern of the hazard free bit array 582 is calculated in a similar manner as described in the FIG. 25. Thus, the bit pattern of the hazard free bit array 582 has a bit pattern of 1000.

Finally, the bit pattern array 596 of flip-flop 592 (for the second clock cycle) has changed from a bit pattern of 'xxxx' (as shown in FIG. 32) to a bit pattern of '0100' by copying the bit pattern of the bit pattern array 586 ('0100') into the bit pattern array 596. Since, the flip-flop 592 objective is to store bit values of the previous clock cycle (i.e. D flip-flop), the bit pattern output for the second clock cycle of the flip-flop 592 is the same as the bit pattern output from the first clock cycle of the inverter 584. The bit pattern of the hazard free bit array 598 is calculated in a similar manner as described in the FIG. 25. Thus, the bit pattern of the hazard free bit array 598 has a bit pattern of '0000'.

Figure 34:
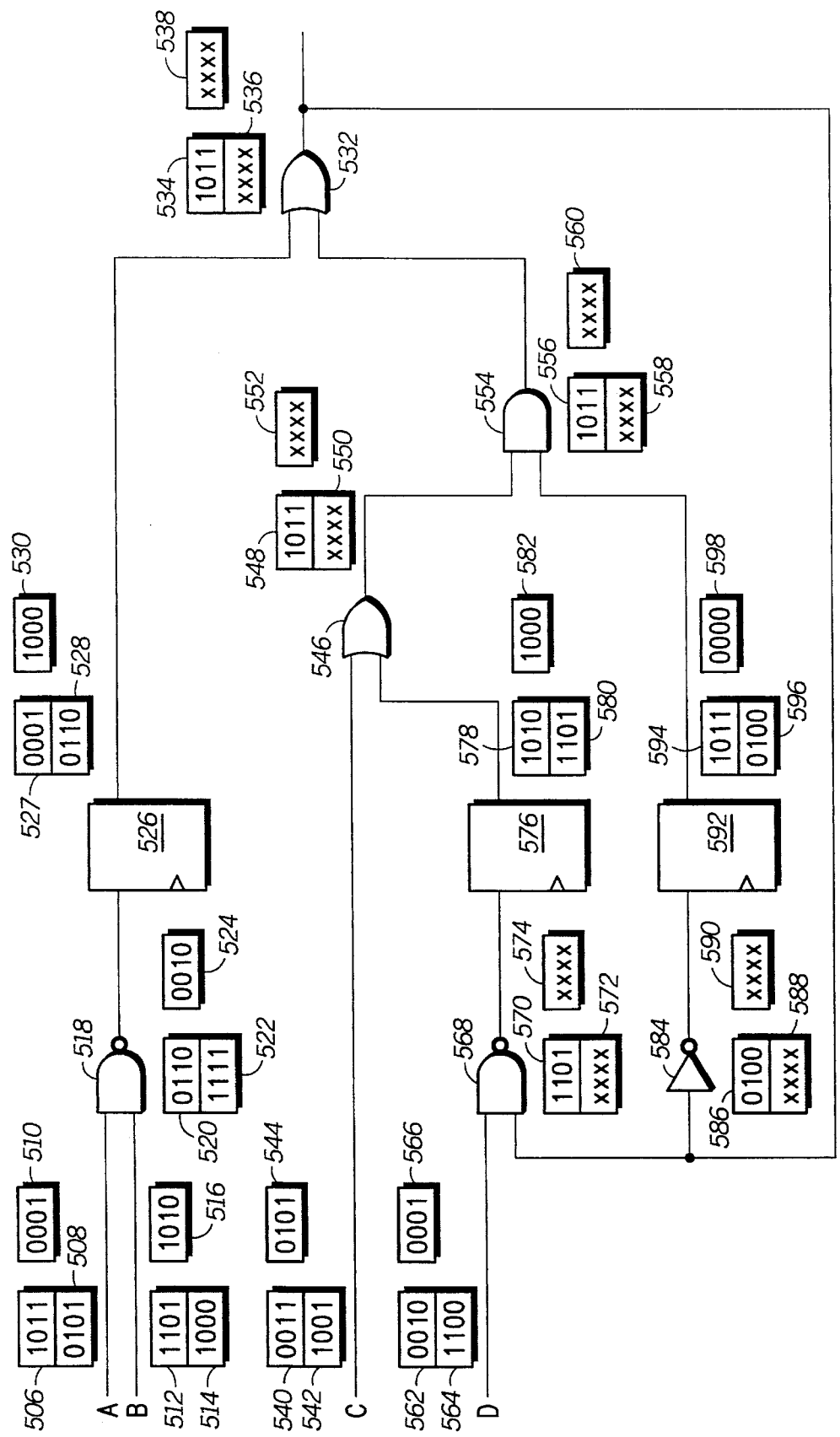

FIG. 34 is a further illustration of the test verification process for the specific circuit in FIG. 33. The bit pattern array 522 of NAND 518 (output for the second clock cycle) has changed from a bit pattern of 'xxxx' (as shown in FIG. 33) to a bit pattern of '1111' by NANDing the bit pattern 508 ('0101') and the bit pattern 514 ('1000'). In other words, in order to calculate the second clock cycle output for the NAND gate 518, the second clock cycles for the inputs of the NAND gate must be NANDed. Therefore, the bit pattern 508 ('0101') is ANDed with bit pattern 514 ('1000'), which produces the bit pattern ('0000'), and the bit pattern ('0000') is inverted, which produces the final bit pattern ('1111') for the bit pattern 520. Since, the bit patterns 510 and 516 are known, the bit pattern of the hazard free bit array 524 is calculated. Thus, the bit pattern of the hazard free bit array 524 has a bit pattern of '0010'.

The hazard free bit array of an element is not derived from the output logic values of the element, but from fan-in logic values and fan-in hazard free bit arrays. It is the function of fan-in logic values and fan-in hazard free bit arrays and it can be computed using bit-wise parallel operations just like the evaluation of the circuit elements.

Figure 35:
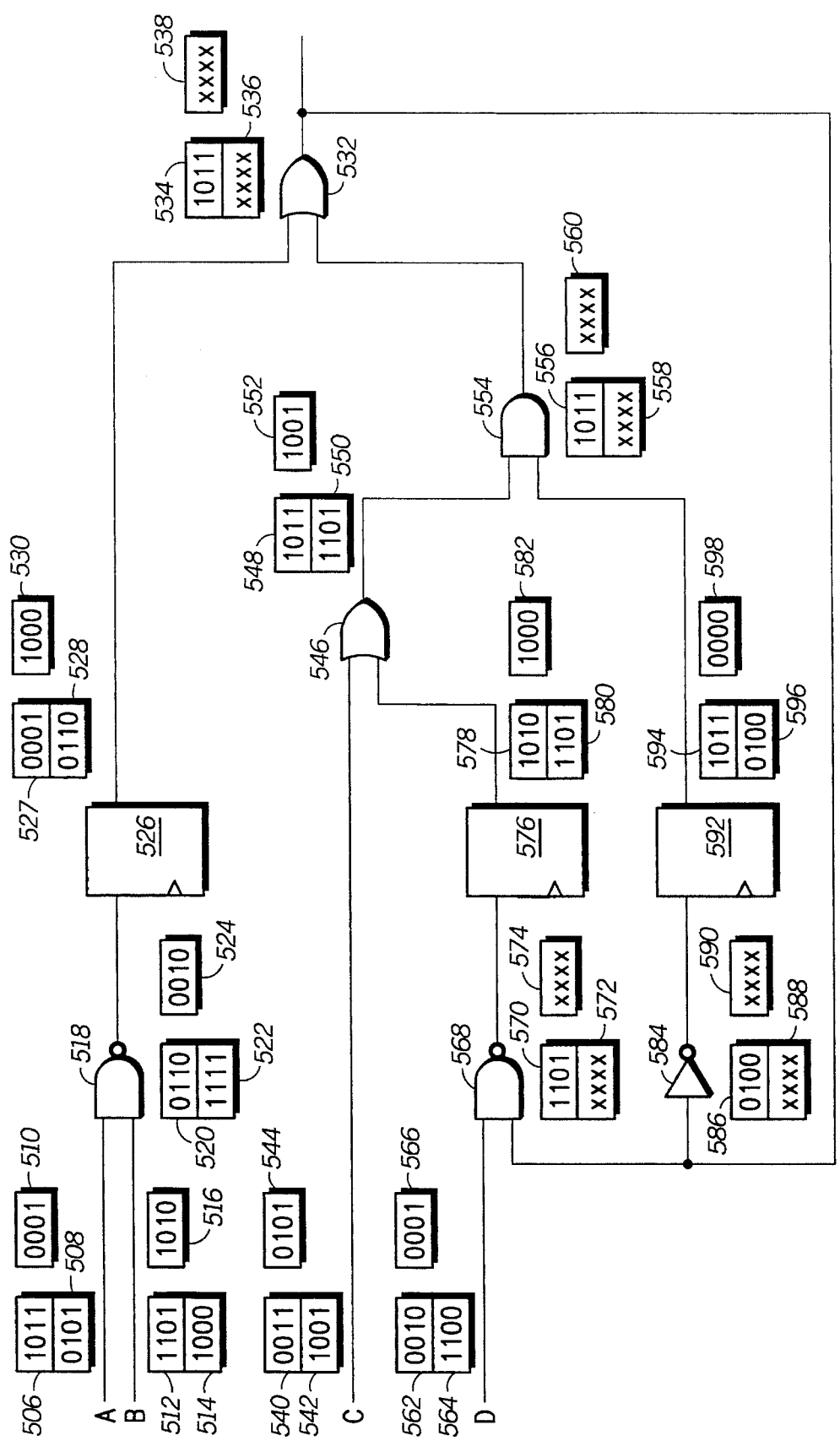

FIG. 35 is a further illustration of the test verification process for the specific circuit in FIG. 34. The bit pattern array 550 of OR gate 546 (output for the second clock cycle) has changed from a bit pattern of 'xxxx' (as shown in FIG. 34) to a bit pattern of '1101' by ORing the bit pattern 542 ('1001') and the bit pattern 580 ('1101'). In other words, in order to calculate the second clock cycle output for the OR gate 546, the second clock cycles for the inputs of the OR gate must be ORed. Therefore, the bit pattern 542('1001') is ORed with bit pattern 580 ('1101'), which produces the final bit pattern ('1101') for the bit pattern 550. Since, the bit patterns 544 and 582 are known, the bit pattern of the hazard free bit array 552 is calculated in a similar manner as described in the FIG. 34. Thus, the bit pattern of the hazard free bit array 552 has a bit pattern of '1001'.

Figure 36:
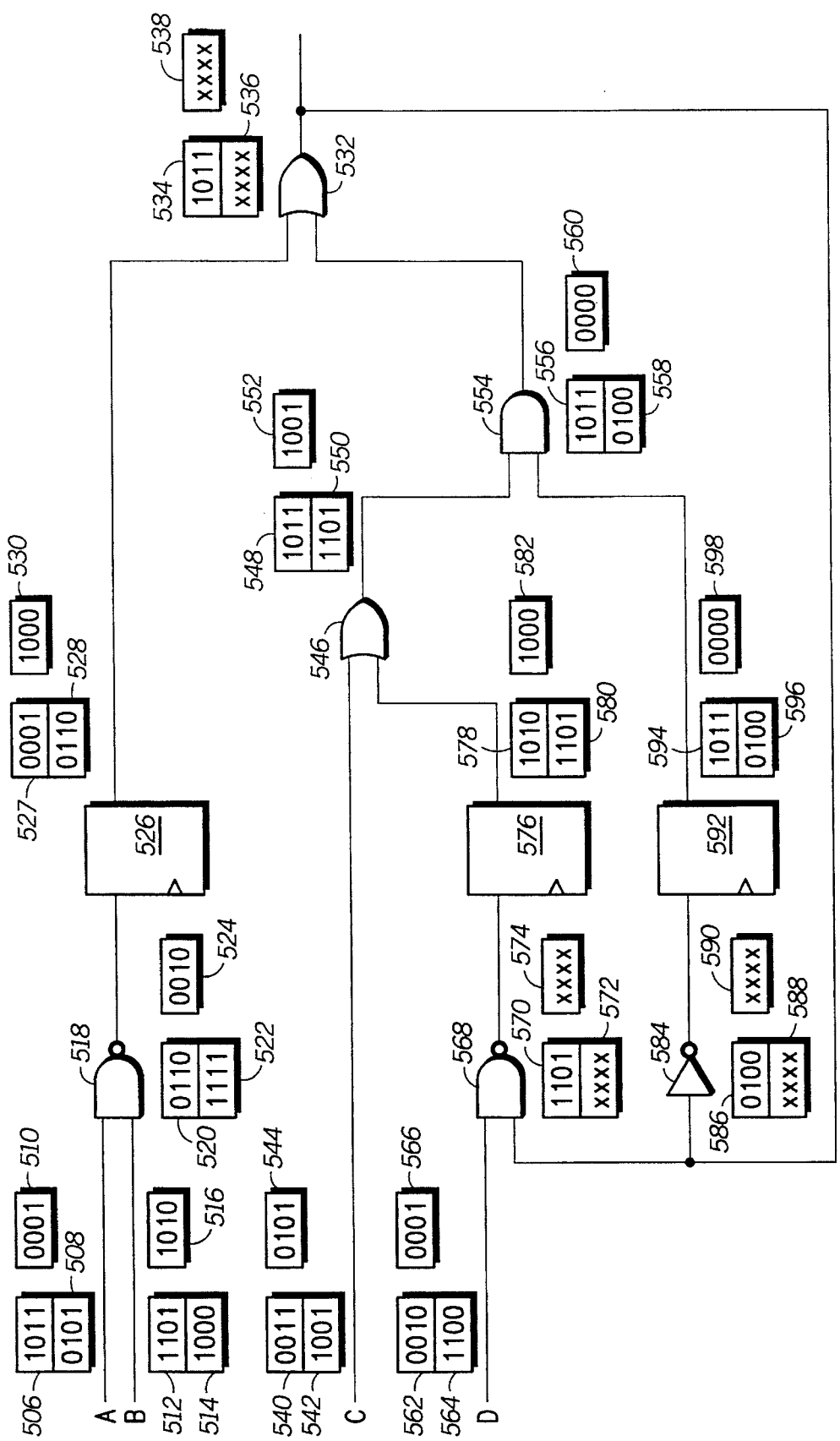

FIG. 36 is a further illustration of the test verification process for the specific circuit in FIG. 35. The bit pattern array 558 of AND gate 554 (output for the second clock cycle) has changed from a bit pattern of 'xxxx' (as shown in FIG. 35) to a bit pattern of '0100' by ANDing the bit pattern 550 ('1101') and the bit pattern 596 ('0100'). In other words, in order to calculate the second clock cycle output for the AND gate 554, the second clock cycles for the inputs of the AND gate must be ANDed. Therefore, the bit pattern 550('1101') is ANDed with bit pattern 596 ('0100'), which produces the final bit pattern ('0100') for the bit pattern 558. Since, the bit patterns 550, 552, 596, and 598 are known, the bit pattern of the hazard free bit array 560 is calculated. Thus, the bit pattern of the hazard free bit array 560 has a bit pattern of '0000'.

Figure 37:
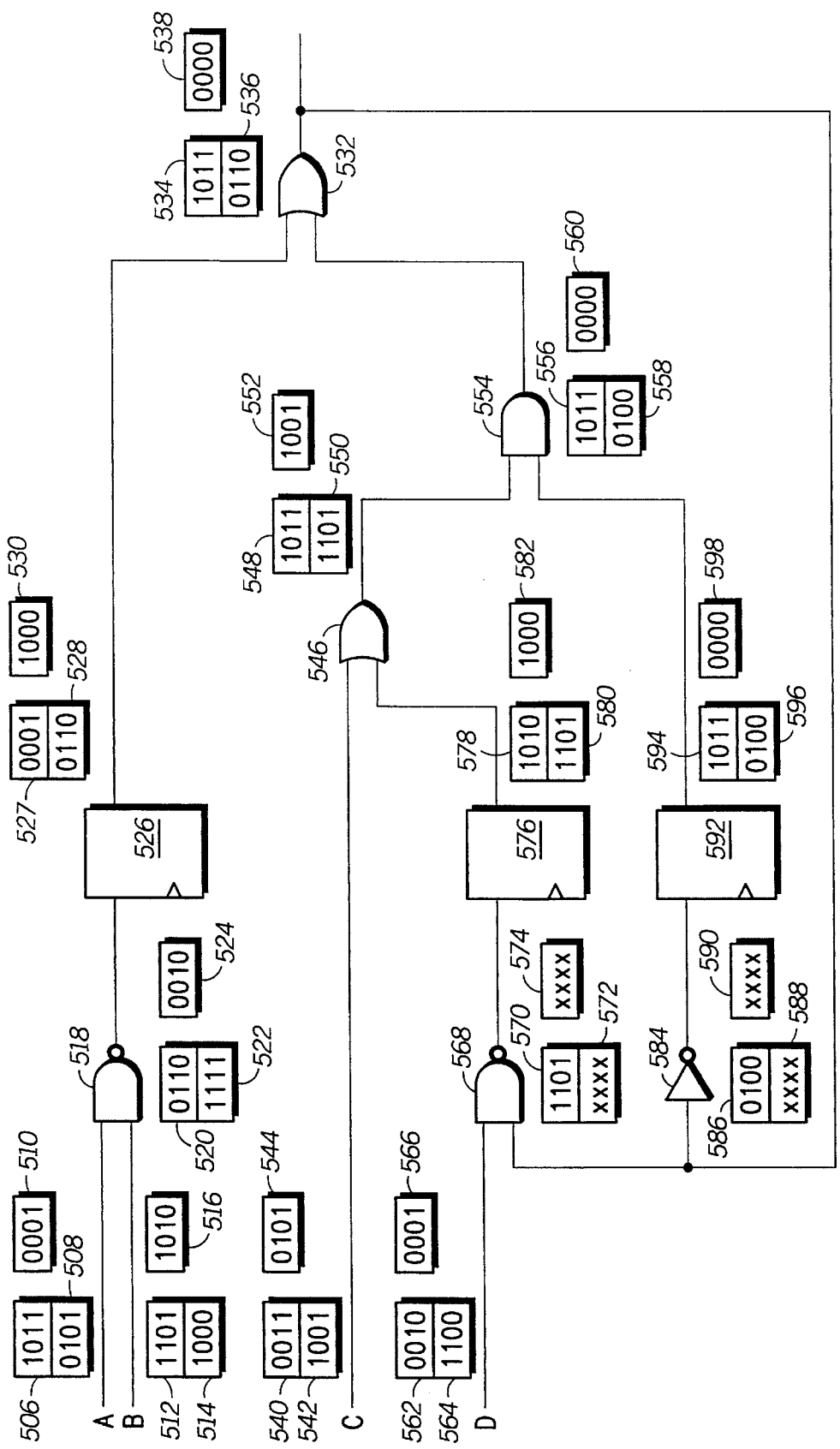

FIG. 37 is a further illustration of the test verification process for the specific circuit in FIG. 36. The bit pattern array 536 of OR gate 532 (output for the second clock cycle) has changed from a bit pattern of 'xxxx' (as shown in FIG. 36) to a bit pattern of '0110' by ORing the bit pattern 528 ('0110') and the bit pattern 558 ('0100'). In other words, in order to calculate the second clock cycle output for the OR gate 532, the second clock cycles for the inputs of the OR gate must be ORed. Therefore, the bit pattern 528 ('0110') is ORed with bit pattern 558 ('0100'), which produces the final bit pattern ('0110') for the bit pattern 534. Since, the bit patterns 528, 530, 558, 560 are known, the bit pattern of the hazard free bit array 538 is calculated in a similar manner as described in the FIG. 34. Thus, the bit pattern of the hazard free bit array 538 has a bit pattern of '0000'.

Figure 38:
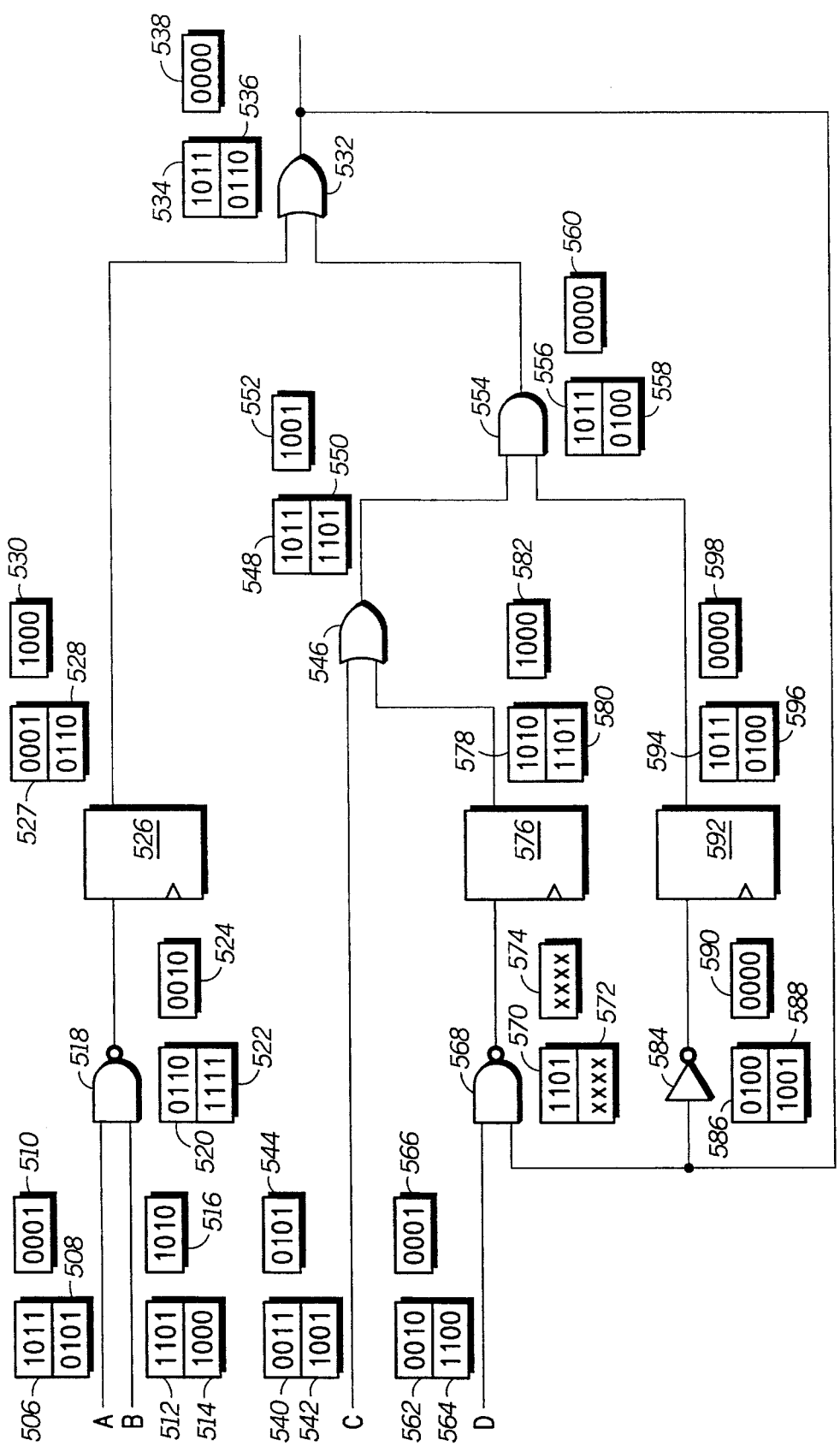

FIG. 38 is a further illustration of the test verification process for the specific circuit in FIG. 37. The bit pattern array 588 of the inverter gate 584 (output for the second clock cycle) has changed from a bit pattern of 'xxxx' (as shown in FIG. 37) to a bit pattern of '1001' by inverting the bit pattern 536('0110'). In other words, in order to calculate the second clock cycle output for the inverter 584, the second clock cycles for the inputs of the inverter must be inverted. Therefore, the bit pattern 536 ('0110') is inverted, which produces the final bit pattern ('1001') for the bit pattern 588. Since, the bit patterns 536 and 538 are known, the bit pattern of the hazard free bit array 590 is calculated in a similar manner as described in the FIG. 34. Thus, the bit pattern of the hazard free bit array 590 has a bit pattern of '0000'.

Figure 39:
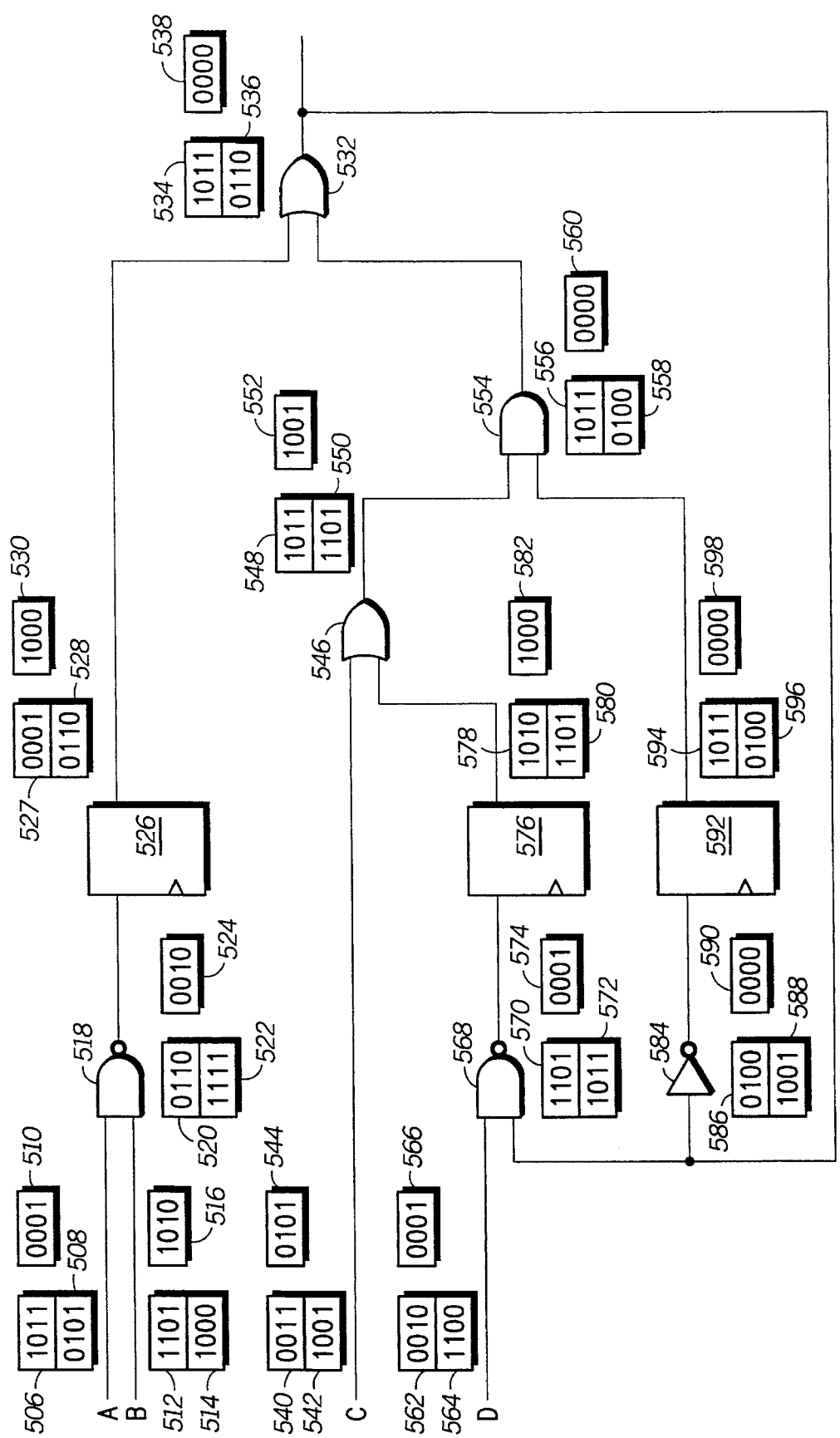

FIG. 39 is a further illustration of the test verification process for the specific circuit in FIG. 38. The bit pattern array 572 of NAND 568 (output for the second clock cycle) has changed from a bit pattern of 'xxxx' (as shown in FIG. 38) to a bit pattern of '1011' by NANDing the bit pattern 564 ('1100') and the bit pattern 536 ('0110'). In other words, in order to calculate the second clock cycle output for the NAND gate 568, the second clock cycles for the inputs of the NAND gate must be NANDed. Therefore, the bit pattern 564 ('1100') is ANDed with bit pattern 536 ('0110'), which produces the bit pattern ('0100'), and the bit pattern ('0100') is inverted, which produces the final bit pattern ('1011') for the bit pattern 572. Since, the bit patterns 536, 538, 564, and 566 are known, the bit pattern of the hazard free bit array 574 is calculated in a similar manner as described in the FIG. 34. Thus, the bit pattern of the hazard free bit array 574 has a bit pattern of '0001'.

In general, the algorithm for setting up the data structure used to perform test verification is as described above wherein: (1) inputs from test vectors are loaded/defined; (2) first clock cycle values are calculated; (3) second clock cycle values are calculated; and (4) hazard-free values are identified.

Figure 40:
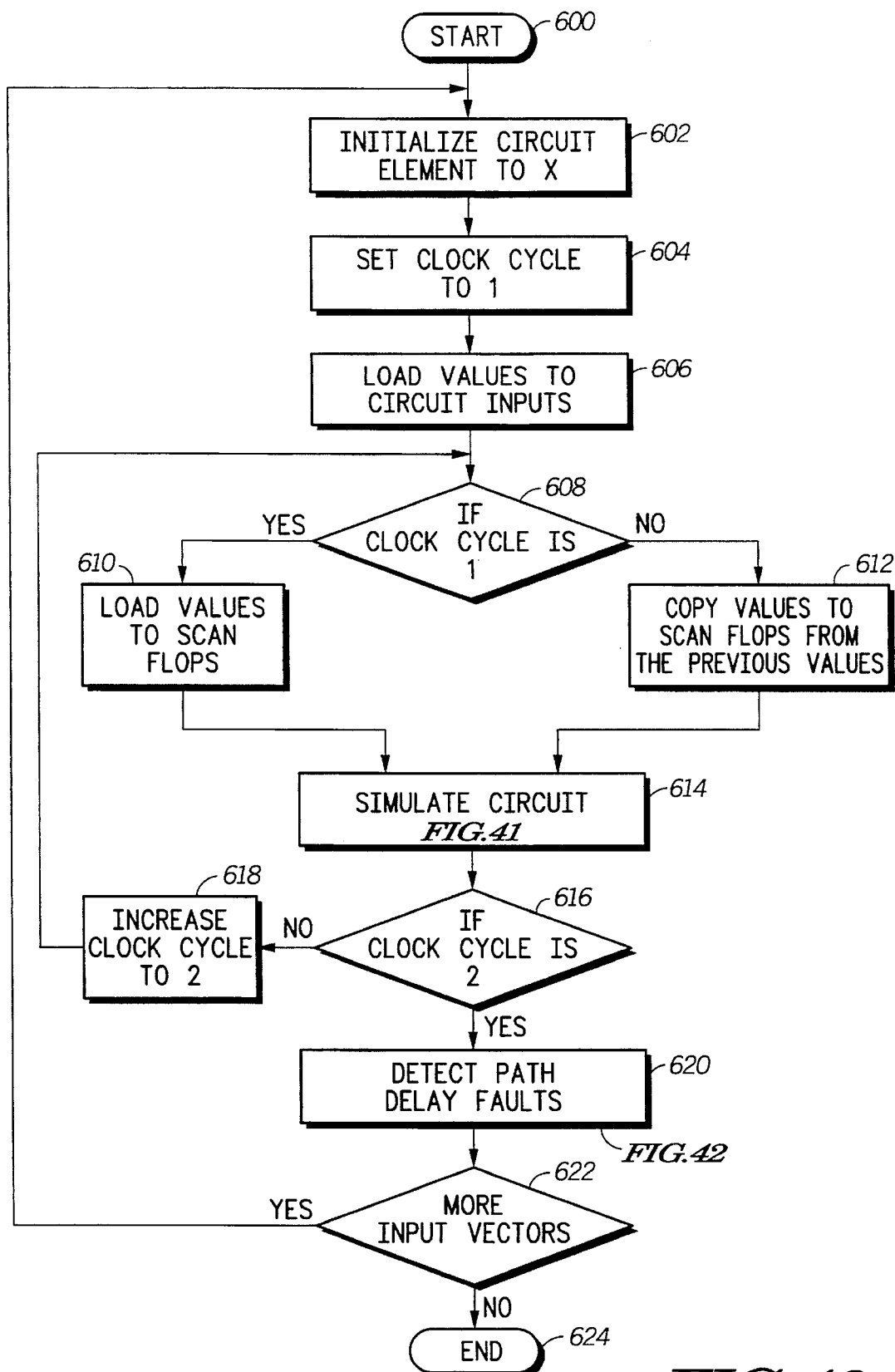
FIG. 40 illustrates, in a flowchart, several specific steps which describe the process for performing a test verification process in accordance with the present invention.
Figure 41:
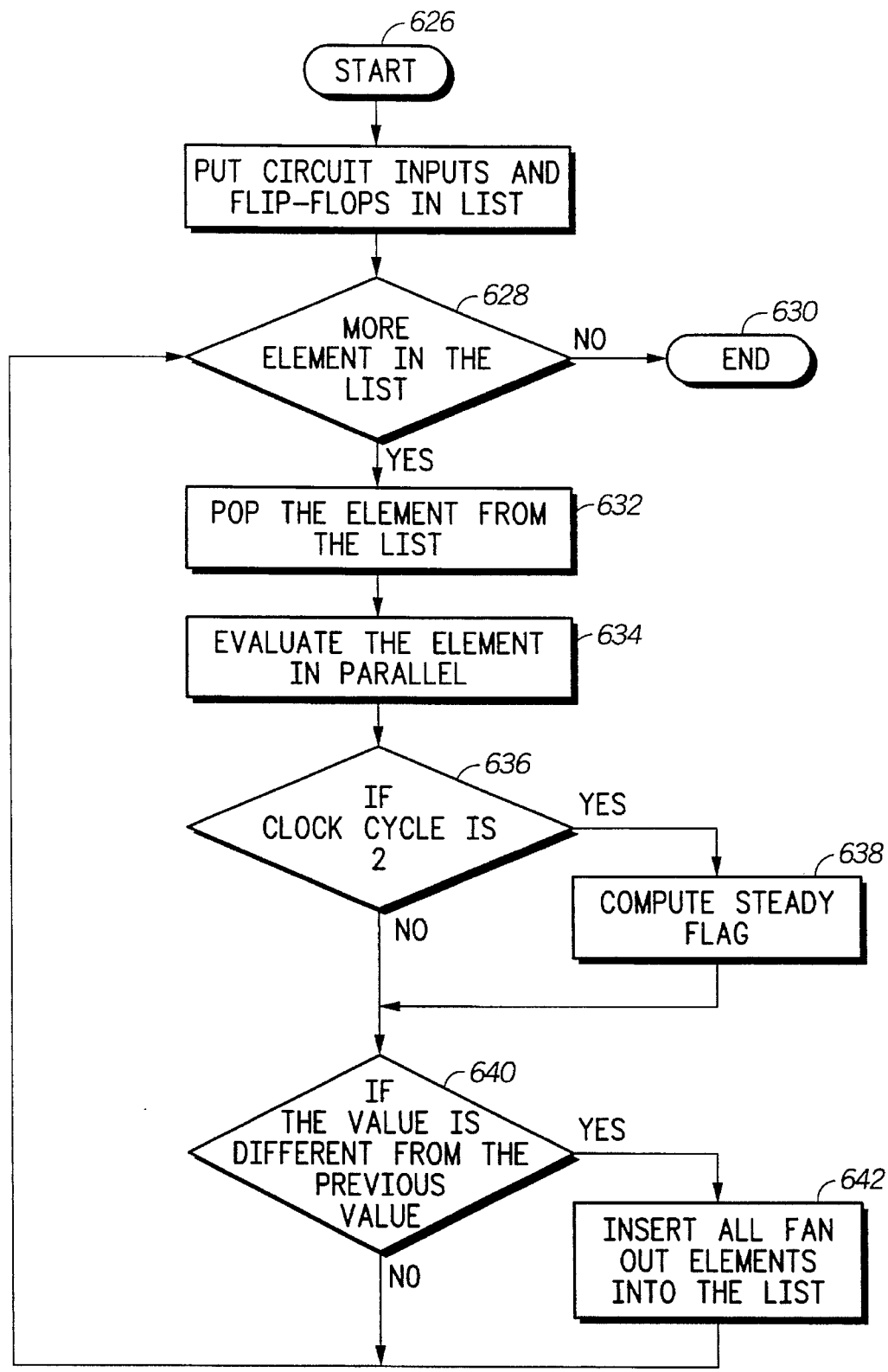
FIG. 41 illustrates, in a flowchart, several specific steps which describe in more detail the process of simulating the test circuit as illustrated in FIG. 40 in accordance with the present invention.
Figure 42:
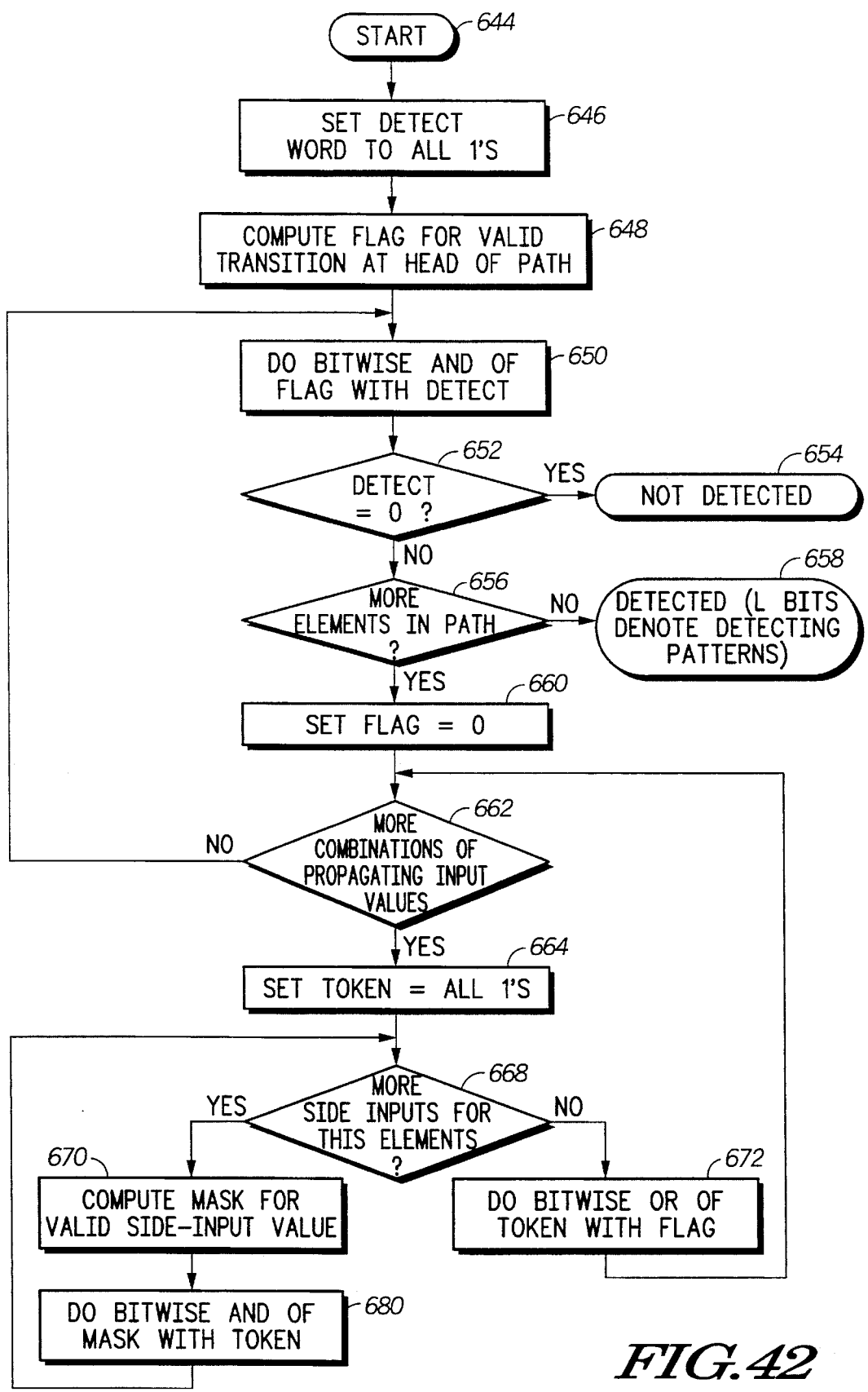
FIG. 42 illustrates, in a flowchart, several specific steps which describe in more detail process for determining which patterns provide robust tests for detecting path delay faults in a given circuit path as illustrated in FIG. 40 in accordance with the present invention.

While FIGS. 26 through 39 illustrate an example circuit undergoing the simulation/verification process, FIGS. 40 through 42 illustrate the detail steps used to perform the test verification process for test vectors generated for a specified circuit (including simulating the circuit and verifying the detection of path delay faults). FIG. 40 illustrates the overall process for performing the test verification process on a specified circuit. A step 600 begins the test verification process. A step 602 initializes the individual bits within the bit pattern array structures for the circuit elements in the test verifier to a value of "x". The initialization process in the step 602 is needed in order to determine if bit patterns have been assigned to the circuit elements. For example, in FIG. 25 all of the pattern bit arrays were assigned a value of "x" before the patterns were loaded into the pattern bit arrays for the specified circuit elements.

A step 604 sets the clock cycle to a value of one, so the bit patterns can be loaded for clock cycle one. A step 606 loads the input bit patterns from the pattern bit array structure into the pattern bit arrays for the external pins or terminals of the integrated circuit, as described in the FIG. 26. A step 608 checks if the clock cycle has a value of one. If the clock cycle in the step 608 has a value of one, then a step 610 is executed, else a step 612 is performed. The step 610 loads the bit patterns into the bit pattern arrays for the scan flip-flops as described in the FIG. 26 for clock cycle one. The step 612 copies the bit patterns of the previous input into the scan flip-flops as described in the FIG. 33. After the bit patterns for that specified clock cycle are loaded into the bit pattern arrays of the circuit elements, then a step 614 performs the simulation/verification process of replacing all "x" data values with binary values of either 1 or 0, which is described in more detail in FIG. 41.

A step 616 checks if the clock cycle is equal to two. If the clock cycle is two in the step 616, then a step 620 is executed, else a step 618 is performed. The step 618 increases the clock cycle to two, so the bit patterns for clock cycle two can be loaded/determined and then the step 608 is performed. The step 620 performs logical functions for a specified path (selected from the list of circuit paths 162 in FIG. 11), in order to detect which patterns/vectors for the specified path provide path-delay tests for detecting path delay faults within the specified test circuit. The step 620 is described in more detail in FIG. 42. The step 622 checks if more input test vectors need to be verified. If there are no more input test vectors in the step 622, then a step 624 is executed, else the step 602 is performed. The step 624 exits the test verification process. In general, thousands or more test vectors can be manipulated, verified, and corrected given what is taught herein.

The FIG. 41 illustrates the process of simulating (changing all "x" states to "0" or "1" states) of the circuit (see FIGS. 26–39). The process of simulating the specified circuit is part of the test verification process. A step 626 begins the specified circuit simulation process. A step 628 checks for elements within the list of devices from the circuit model 160 in FIG. 11. If there is no more elements within the list, then a step 630 exits the simulation process, else a step 632 is performed. The step 632 pops the element from the list of devices and a step 634 evaluates the element that was popped from the list in parallel, where parallel means that all of the individual bits within the bit pattern for a specified element is evaluated for a specified clock cycle. For example, in FIG. 27 the bit pattern array 520 for the element 518 was evaluated for the first clock cycle by NANDing all (parallel) of the pattern bits for the bit pattern array 506 ('1011') and the bit pattern array 512 ('1101') and producing the result of '0110' for the bit pattern array 520. In general, if a processor allows 32-bit or 64-bit logic operations (XOR, NAND, NOR, OR, AND, complement, etc.) then multiple vectors are easily processed in a parallel manner.

A step 636 checks if the clock cycle is two. If the clock cycle in the step 636 is two, then a step 638 is executed, else a step 640 is performed. The step 638 computes the steady hazard free flag(s), of which an example is given in the FIG. 34 for element 518. As stated above in reference to FIG. 25, the calculation process of determining output hazard free values depends on whether the inputs to the elements are values which are hazard free. For example, in FIG. 34 the second bit (when reading left to right) in the bit pattern array 520 (bit value=1) for element 518 is the same as the second bit (when reading left to right) in the bit pattern array 528 (bit value=1) for element 518. However, even though the second bit of both bit patterns (520 and 522) match, that does not mean that a hazard free flag should be set for the second bit position of bit pattern array 524. Due to the fact that the inputs to element 518 only produce values that are themselves hazard free for the first, third, and fourth bit positions, the second bit position cannot be guaranteed to be hazard free or to have a steady value.

The step 640 checks if the bit pattern that is currently in the bit pattern array is different from the new bit pattern that is being loaded into the same bit pattern array. For example, in the FIG. 27 the bit pattern array 520 of NAND 518 (for the first clock cycle) has changed from a bit pattern of 'xxxx' (as shown in FIG. 26) to a bit pattern of '0110' by NANDing the bit pattern 506 ('1011') and the bit pattern 512 ('1101'). Thus, the bit pattern array 520 changed from an undetermined bit pattern of 'xxxx' to a bit pattern of '0110'. If the bit patterns in the step 640 are different, then a step 642 is executed, else the step 628 is performed. If the bit pattern in the bit pattern array of step 640 is different from the original bit pattern in the bit pattern array, then all of the elements that are connected to the output of the element whose bit pattern array has changed must be updated, because the input to all those elements has changed. The fan-out elements, which are the elements that are connected to the output of the gate being evaluated, are inserted onto the list of devices. For example, in FIG. 28 the fan-out for element 546 is element 554. Thus, when the bit pattern array 548 of OR gate 546 changed from 'xxxx' to '1011', the bit pattern array 556 of the fan-out element (AND gate 554) must also change, which is illustrated in FIG. 29.

FIG. 42 illustrates a more detail process for determining which patterns provide tests for detecting path delay faults in a given circuit path. A step 644 begins the process for detecting path faults in a given circuit path, which is selected from the list of circuit paths 162 in FIG. 11. An Example I below will use an example path (flip-flop 592 which has a falling transition, AND gate 554 which has a falling transition, OR gate 532 which has a falling transition) from the circuit in FIG. 39 to illustrate in more detail how the steps in FIG. 42 are used to perform the detection of path delay faults in a given circuit path. The following example will be termed Example I:

Example I

---

'&' means the ANDing function
'+' means the ORing function
Checking for test path:
Flip-flop 592 falling, AND gate 554 falling, OR gate 532 falling
Section One Flip-flop 592 Evaluation:
DETECT='1111'   FLAG='1011'
FLAG('1011') & DETECT('1111') = DETECT('1011')
Section Two AND gate 554 Evaluation:
FLAG='0000'   TOKEN='1111'
Side Input: OR gate 546 must be hazard free 1
MASK='1001'
MASK('1001') & TOKEN('1111') = TOKEN('1001')
TOKEN('1001') + FLAG('0000') = FLAG('1001')
FLAG('1001') & DETECT('1011') = DETECT('1001')
Section Three OR gate 532 Evaluation:
FLAG='0000'   TOKEN='1111'
Side Input: Flip-flop 526 must be X0
MASK='1001'
MASK('1001) & TOKEN('1111')=TOKEN('1001')
TOKEN('1001') + FLAG('0000')=FLAG('1001')
FLAG('1001') & DETECT('1001')=DETECT('1001')

---

Section Four

The final bit pattern for DETECT('1001') indicates that the first and last pattern provide robust test for the given path wherein Flip-flop 592 is undergoing a falling transition, AND gate 554 is undergoing a falling transition, and OR gate 532 is undergoing a falling transition.

---

Therefore, in order to properly path delay test the path between flip-flop 592 and OR gate 532 through AND 554, for a falling edge transition along the entire path, only the first and fourth test vectors in Example H above (which were further illustrated in FIGS. 26–39) should be used. The two middle test vectors in Example H may be useful for other purposes but will not allow for robust testing of the path between flip-flop 592 and OR gate 532 through AND 554 for a falling edge transition along the entire path.

The above example is now further discussed. A step 646 sets the detection word (DETECT), which is a bit pattern word array, to a bit pattern of '1111'. Even though the detection word only illustrates four bits in this example, the number of bits that a bit pattern array can contain is dependent on the machine word size. A step 648 computes the bit pattern of the FLAG, which is a bit pattern word array, for a valid transition at the head of the path. In Example I (Section One), the DETECT and FLAG are assigned bit patterns for the flip-flop 592. The head of the path in Example I is the flip-flop 592. Therefore, to compute a valid falling transition for flip-flop 592, the bit pattern array 594 and the bit pattern array 596 are evaluated for the falling transition (i.e. logic 1 in clock cycle one and a logic 0 in clock cycle two). The bit positions (reading left to right) one, three and four in bit pattern arrays 594 and 596 indicate a falling transition (the bit value in the first clock cycle is one and the bit value in the second cycle is a zero). Therefore, in Example I (Section One), FLAG='1011'. This flag of '1011' means that bit position two does not satisfy the falling transition constraint and is therefore flagged with a zero. A step 650 performs a bitwise ANDing of the FLAG from the step 648 and the detection word from the step 646 and stores the resulting bit pattern, '1011', back into the detection word, which is also illustrated in Example I (Section One).

A step 652 checks if the detection word calculated in the step 650 is equal to zero. If the detection word is equal to zero, then a step 654 indicates that the path cannot be tested given the current input test vectors. For example, in the step 648, if no falling transition was found, then FLAG would equal '0000'. The '0000' means no falling transition criterion was met, and the path is therefore untestable, for a falling transition on flip-flop 592, given the current test vectors (four vectors in the above example). If the detection word (DETECT) is not equal to zero then a step 656 checks if more elements are on the path by popping the next element of the path list, which for this example would be element 554 in FIG. 39. If there is no more elements in the path, then a step 658 is executed which indicates that at least one test vector in the set will function to test the given circuit path properly, else a step 660 is performed.

The step 660 sets the FLAG to a bit pattern of '0000', which is illustrated in Example I (Section Two). A step 662 checks if there are combinations of propagating inputs values, which usually refers to custom logic blocks (discussed above), where due to propagating input values, other input elements can affect the output of an element being evaluated. The AND gate 554 is not a custom logic block, however the OR gate 546 is an input to the AND gate 554.

A step 664 sets the TOKEN, which is a bit pattern word array, to a bit pattern of '1111', which is illustrated in Example I (Section Two). A step 668 checks for side-inputs for the element being evaluated, where side-inputs are other inputs that are not directly on the path, but affect the path. For example, the output of OR gate 546 is a side-input for AND gate 554, where the AND gate 554 is the gate being evaluated. A step 670 computes the MASK for the valid side-input value. The MASK calculation is dependent on the transition of the side-input element. For example, in Example I (Section Two), since the AND gate 554 has a falling transition. The only bits for the OR gate 546 that can guarantee a hazard free value are bit positions (reading left to right) one and four (which is bit pattern array 552). The bit positions, one and four, in bit pattern array 552 are hazard free ones. Therefore, MASK is equal to bit pattern '1001', for only the first and fourth bit (and not the third bit) in the MASK can guarantee a falling transition for the output of AND gate 554. A step 680 performs a bitwise AND with the MASK in the step 670 and the TOKEN in the step 664, and stores the result into TOKEN, which is illustrated in Example I (Section Two). The procedure in the step 680 is performed in order to detect which bits are valid for the transition of the side-input. For example, the MASK calculated in the step 670 for the side-input, OR gate 546, is '1001'. When the MASK from the step 670 is ANDed with the TOKEN ('1111') from the step 664, the result '1001' is stored into TOKEN. Thus, replacing the old pattern bit ('1111') with the new pattern bit ('1001'), where the new pattern ('1001') indicates that the bit positions (reading left to right) one and four are valid side-input bit positions for the falling transition.

If there are no more side-inputs found in the step 668, then a step 672 performs a bitwise OR with the TOKEN calculated in the step 680 and the FLAG calculated in the step 660, and stores the result into FLAG. For example, in Example I the MASK for side-input Flip-flop 526 is calculated in the step 670, and TOKEN ('1001'), which was calculated in the step 680 is ANDed with the FLAG ('0000'), which was assigned in the step 660, produces a result ('1001'), which is assigned to FLAG. Thus, replacing the old pattern bit ('0000') of FLAG with the new pattern bit ('1001'), where the new pattern ('1001') indicates that the bit positions (reading left to right) one and four are valid for the falling transition of AND gate 554. The procedure in the step 672 is performed in order to update the bit pattern of FLAG, which indicates which bits are valid for the transition of the current element being evaluated. Once no more combinations of propagating input values exist (step 662), then the FLAG calculated in the step 672 is again ANDed with the detection word and the result is stored back into the detection word. In Example I (Section Two), the FLAG('1001') is ANDed with the DETECT('1011') and the result ('1001') is stored back into the DETECT. In other words, a test vector for the falling edge transition on an AND gate passes if one input goes from a logic 1 to a logic zero and all other inputs are hazard-free logic ones. Therefore, only inputs matter and the inputs can be used to determine if the proper output is achieved.

If there are no more elements in the path found in the step 656, then the step 658 uses the bit pattern in the detection word, which was calculated in the step 650, to indicate which patterns provide robust tests for the given path. For example, in Example I(Section Three) the next element (OR gate 532) is evaluated in the same manner as AND gate 554. However, when evaluating the side-input, flip-flop 526, the value must be a 'X0', which means that the bit value in the first clock cycle is a don't care (since the other input value which is on the delay test circuit path is a logic one and will maintain the output at a logic one regardless of the logic value for the side-input and the bit value for the second cycle must be a zero. The value for the side-input, flip-flop 526 must be 'X0', due to the reason that the OR gate 532 is going through a falling transition, which means that the bit value for the first clock cycle is an one and the bit value for the second clock cycle is a zero. In order to test for a falling transition for the OR gate 532, the flip-flop 526 must be a 'X0'. As a result of evaluating the bit pattern arrays 527 and 528 for the flip-flop 526, the flip-flop 526 has an 'X0' value in bit position (reading from left to right) one and four since only bits one and four are zero for the second clock cycle (bit array 528). Therefore, the bit pattern of the MASK for the flip-flop 526 is '1001' as illustrated in Example I (Section Three). Also, in Example I (Section Three), the bit pattern assignments for the TOKEN and FLAG are done in a similar manner as described for both Section One and Section Two. However, in Example I, when the FLAG('1001') is ANDed with the DETECT('1001') and the result ('1001') is stored back into DETECT, there are no more elements in the path. Thus, as stated in Example I (Section Four), the final bit pattern for DETECT('1001') indicates that the first and last patterns from Example H provide a robust delay test for the given circuit path. In other words, in Example H, the first pattern (bit patterns of the second and third rows) and the last pattern (bit patterns of the eleventh and twelfth rows) provide robust path delay fault tests for the given path and the other two tests in Example H do not test the path from flip-flop 592 to OR gate 532 in FIG. 39.

In general, the following table gives the proper input conditions for widely used logic gates when testing a certain transition (either rising or falling transition).

| Gate | Input on test path | | All side-inputs | | Output |
|---|---|---|---|---|---|
| | CLK1 | CLK2 | CLK1 | CLK2 | Transition |
| inverter | trivial, only one input | | | | |
| buffer | trivial, only one input | | | | |
| OR | 0 | 1 | 0 -steady- | 0 | rising edge |
| OR | 1 | 0 | X | 0 | falling edge |
| NOR | 0 | 1 | 0 -steady- | 0 | falling edge |
| NOR | 1 | 0 | X | 0 | rising edge |
| AND | 0 | 1 | X | 1 | rising edge |
| AND | 1 | 0 | 1 -steady- | 1 | falling edge |
| NAND | 0 | 1 | X | 1 | falling edge |
| NAND | 1 | 0 | 0 -steady- | 0 | rising edge |
| XOR | 0 | 1 | 0 -steady- | 0 | rising edge |
| XOR | 0 | 1 | 1 -steady- | 1 | falling edge |
| XOR | 1 | 0 | 0 -steady- | 0 | falling edge |
| XOR | 1 | 0 | 1 -steady- | 1 | rising edge |
| XNOR | 0 | 1 | 0 -steady- | 0 | falling edge |
| XNOR | 0 | 1 | 1 -steady- | 1 | rising edge |
| XNOR | 1 | 0 | 0 -steady- | 0 | rising edge |
| XNOR | 1 | 0 | 1 -steady- | 1 | falling edge | wherein all XNORs and XORs above are two-input gates. wherein—steady—indicates a hazard free value between clock cycle one (CLK1) and clock cycle two (CLK2).

The software illustrated herein (such as the elements 160, 162, 164, and 165 in FIG. 11) is stored on one of either a magnetic media (a disk, a compact disk (CD), a tape, a drum, a ferromagnetic device), electrical storage such as random access memory (RAM), static random access memory (SRAM), fast static random access memory (FSRAM), dynamic random access memory (DRAM), flash devices, read only memory (ROM), electrically programmable read only memory (EPROM), electrically erasable read only memory (EEPROM), ferroelectric memory, or like memory media for binary data, source code, object code, or like computer data. The instructions in a computer program may be viewed as English-type instruction on paper or binary/ASCII values stored in either memory cells or magnetic media.

While the present invention has been shown and described with reference to specific embodiments, further modifications and improvements will occur to those skilled in the art. For example, the test vector verifier 165 in FIG. 11 could also exist as a separate entity on another system. Also the transfer of the generated test vectors to the test vector verifier 165 in FIG. 11 could be done by other means, such as tape or floppy disk, rather than by a bus. The method for the testing of test vectors in a specified path can be evaluated in any order. In addition, the test vector verifier 165 could also accept test vectors from other means rather than the test vector generator 164 in FIG. 11. In addition, the test vector verifier 165 could be used to check the test vectors from a source other than the test vector generator 164. Plurality as used herein is intended to mean any number greater than one and should not be limited to any particular sub-range or constant. It is to be understood, therefore, that this invention is not limited to the particular forms illustrated and that it is intended in the appended claims to cover all modifications that do not depart from the spirit and scope of this invention.

What is claimed is:

1. A method for verifying a test vector, the method comprising the steps of:

providing the test vector to a test verifier wherein the test vector is generated to test a specific circuit path within an electrical circuit, the testing of the specific circuit path giving electrical propagation time delay information for the specific circuit path, the test vector defining input values which logically affect the specific circuit path for a first test clock cycle and identifying input values which logically affect the specific circuit path for a second test clock cycle;

providing to the test verifier a circuit model which models the operation of the electrical circuit;

generating input values and output values for all circuit elements along the specific circuit path for both the first test clock cycle and the second test clock cycle by accessing the circuit model and the test vector; and performing logical operations on the input and output values of the circuit elements along the specific circuit path to determine whether the test vector, as input to the test verifier, correctly tests the specific speed path.

2. The method of claim 1 wherein the step of providing the test vector to the verifier comprises:

providing a plurality of test vectors to the test verifier for verification in a parallel manner.

3. The method of claim 1 wherein the step of providing the test vector to the verifier comprises:

providing a plurality of test vectors to the test verifier for verification in a parallel manner wherein each test vector in the plurality of test vectors defines input values to the circuit model for both the first test clock cycle and the second test clock cycle which affect the specific path, the test vectors being stored in data arrays by the test verifier and being verified in parallel.

4. The method of claim 1 wherein the step of providing the test vector comprises:

providing a test vector which defines at least one logic value in at least one flip-flip, storage device, input terminal, input pin, or latch device which affects the specific circuit path.

5. The method of claim 1 wherein the step of providing the test vector comprises:

providing N test vectors to the test verifier wherein N is a finite integer greater than zero;

providing a first memory data array for the first test clock cycle for each flip-flip, storage device, logic gate, custom logic block, input terminal, input pin, or latch device which affects the specific circuit path, the first memory array having at least N bit positions;

providing a second memory data array for the second test clock cycle for each flip-flip, storage device, logic gate, custom logic block, input terminal, input pin, or latch device which affects the specific circuit path, the second memory array having at least N bit positions;

providing a third memory data array to store hazard-free value status for each flip-flip, storage device, logic gate, custom logic block, input terminal, input pin, or latch device which affects the specific circuit path, the third memory array having at least N bit positions; and using the first, second, and third memory data arrays for verifying the N test vectors in a parallel manner.

6. The method of claim 1 wherein the specific circuit path is tested for at least one transition selected from the group consisting of: input rising output falling, input rising output rising, input falling output falling, input falling output rising, output rising edge transition, and output falling edge transition.

7. The method of claim 1 wherein the specific circuit path passes through a plurality of logic gates and the step of generating input and output values comprises:

simulating the specific path using the circuit model to determine all logic values along the specific circuit path for each logic gate in the plurality of logic gates as a function of the test vector input.

8. The method of claim 7 wherein the step of simulating comprises:

determining a logic value for all inputs of each logic gate in the plurality of logic gates and an output value of each logic gate in the plurality of logic gates.

9. The method of claim 7 wherein the step of performing logical operations comprises:

performing at least one operation selected from the group consisting of: AND operation, OR operation, NAND operation, XOR operation, XNOR operation, NOT operation, and NOR operation, of the logic values which are defined for each logic gate in the plurality of logic gates along the selected circuit path in order to determine if the test vector properly test the specific circuit path for a given specific circuit path logical transition.

10. The method of claim 9 wherein the step of performing at least one operation comprises:

performing at least one operation selected from the group consisting of: AND operation, OR operation, NAND operation, XOR operation, XNOR operation, NOT operation, and NOR operation, on at least one hazard-free status value which is defined for at least one logic gate in the plurality of logic gates along the selected circuit path in order to determine if the test vector properly tests the specific circuit path for a given specific circuit path logical transition.

11. The method of claim 1 wherein the step of generating comprises:

using the input values to determine a hazard-free status for a selected input which affects the specific logic path, the hazard-free states being asserted if the selected input is guaranteed to be electrically glitch free in logic value and being deasserted if the selected input cannot be guaranteed to be electrically glitch free in logic value for the first and second clock test clock cycles.

12. A method for verifying a plurality of test vectors, the method comprising the steps of:

providing, to a test verifier, access to an electrical circuit model which models the operation of an electrical circuit;

identifying at least one circuit path in the circuit model which is to be path delay tested, a plurality of circuit elements residing along the at least one circuit path providing the plurality of test vectors to the test verifier wherein the test verifier places the test vectors into an array structure, the array structure having a first array, a second array, and a third array for each input and output of each circuit element in the plurality of circuit elements, the first array storing first test clock cycle logic values from the plurality of test vectors for each circuit element in the plurality of circuit elements, the second array storing second test clock cycle logic values from the plurality of test vectors for each circuit element in the plurality of circuit elements, the third array being used to store hazard-free status values as a function of the first and second arrays, the plurality of test vectors is generated to test the least one circuit path within the electrical circuit model, each test vector in the plurality of test vectors defines logical input values which logically affect a state of the specific circuit path for both a first test clock cycle and a second test clock cycle;

generating input values and output values for the plurality of circuit elements for both the first test clock cycle and the second test clock cycle for each test vector in the plurality of test vectors, the generating being performed by logically operating on the first and second arrays for each input and output of each circuit element in the plurality of circuit elements;

determining, via the first and second array, which input values and output values along the specific path are to be hazard-free wherein hazard-free signals are inputs or outputs to at least on circuit element in the plurality of circuit elements wherein electrical glitching is not significant enough to alter a selected logic state of the respective inputs or outputs, the determination of hazard free values being represented in the third array; and performing logical AND/OR operations on the input values of the circuit elements, the output values of the circuit elements, and the hazard free values along the specific circuit path to determine whether each test vector in the plurality of test vectors, as input to the test verifier, correctly tests the at least one circuit path.

13. The method of claim 12 wherein the step of providing the plurality of test vectors to the verifier comprises:

providing the plurality of test vectors to the test verifier for verification in a parallel manner wherein each test vector in the plurality of test vectors defines input values to the circuit model which affect the specific path for both the first test clock cycle and the second test clock cycle, the test vectors being stored in data arrays by the test verifier and being verified in parallel.

14. The method of claim 12 wherein the step of providing the plurality of test vector comprises:

providing a plurality of test vectors wherein each test vector defines at least one logic value in at least one flip-flip, storage device, input terminal, input pin, or latch device which affects the specific circuit path.

15. The method of claim 12 wherein the step of providing the plurality of test vectors comprises:

providing N test vectors, as the plurality of test vectors, to the test verifier wherein N is a finite integer greater than zero;

providing a first memory data array for the first test clock cycle for each flip-flip, storage device, logic gate, custom logic block, input terminal, input pin, or latch device which affects the specific circuit path, the first memory array having at least N bit positions;

providing a second memory data array for the second test clock cycle for each flip-flip, storage device, logic gate, custom logic block, input terminal, input pin, or latch device which affects the specific circuit path, the second memory array having at least N bit positions;

providing a third memory data array to store hazard-free value status for each flip-flip, storage device, logic gate, custom logic block, input terminal, input pin, or latch device which affects the specific circuit path, the third memory array having at least N bit positions; and using the first, second, and third memory data arrays for verifying the N test vectors in a parallel manner.

16. A test system for generating and verifying the functionality of a speed path test vector, the test system comprising:

means for modeling the operation of an electrical circuit having a circuit path;

means for providing a test vector for testing a propagation speed of the circuit path, the test vector defining input values and output values along the circuit path defined via the means for modeling, the input and output values having a first set of values defined for a first test clock cycle and a second set of values defined for a second test clock cycle, the test vector being generated by a first process within the means for providing; and means for verifying the test vector receiving the test vector from the means for providing, the means for verifying accessing the circuit model and simulating the test vector within a portion of the circuit model to verify that the test vector correctly tests the circuit path for the propagation speed, the verification using a second process which is different from the first process.

17. The test system of claim 16 wherein the means for providing a test vector provides a plurality of test vectors to the test verifier, the test verifier processing the plurality of test vectors in parallel.

18. The test system of claim 16 wherein the means for providing a test vector provides N test vectors to the test verifier wherein N is a finite integer grater than zero, and the means for verifying (1) generates a first memory data array for the first test clock cycle for each flip-flip, storage device, logic gate, custom logic block, input terminal, input pin, or latch device which affects the specific circuit path, the first memory array having at least N bit positions; (2) generates a second memory data array for the second test clock cycle for each flip-flip, storage device, logic gate, custom logic block, input terminal, input pin, or latch device which affects the specific circuit path, the second memory array having at least N bit positions; and (3) generates a third memory data array to store hazard-free value status for each flip-flip, storage device, logic gate, custom logic block, input terminal, input pin, or latch device which affects the specific circuit path, the third memory array having at least N bit positions, the means for verifying using the first, second, and third memory data arrays for verifying the N test vectors in a parallel manner.

19. The test system of claim 16 wherein the means for verifying a test vector evaluates the circuit elements in the circuit model for clock cycle one and clock cycle two to obtain input and output values, the means for verifying performing logical operations on the input and output values of the circuit elements along the specific circuit path to determine whether the input and output values have valid input and output values for a predetermined logic transition of the specific circuit path, and identifying the logic path as being untestable if no test vector, which is in accordance with the test condition, correctly tests the specific speed path.

20. A method for testing test vectors, the method comprising the steps of:
(a) initializing an array structure for the test vectors which test a specified circuit, wherein the array structure has a first array, a second array, and a third array for each input and output of each circuit element in the specified circuit, the first array storing first test clock cycle logic values from the test vectors for each circuit element in the plurality of circuit elements, the second array storing second test clock cycle logic values from the test vectors for each circuit element in the plurality of circuit elements, the third array being used to store hazard-free status values as a function of the first and second arrays;
(b) setting a test clock cycle value to one;
(c) loading the test vectors into the array structure for each input and output of each circuit element in the plurality of elements;
(d) loading the values of the test vectors into the first, second, and third arrays for each circuit element which is a scan flip-flop if the test clock cycle has a value of one;
(e) copying the input values stored in the first array of each circuit element which is coupled to the input of the each scan flip-flop to the second array of each of the respective scan flip-flops;
(f) simulating the specified circuit to obtain logic values for the first clock cycle which are stored in the first array;
(g) increasing the test clock cycle value to a value of two;
(h) simulating the specified circuit to obtain logic values for the second clock cycle which are stored in the second array;
(i) detecting path delay information for the specified circuit using the first and second arrays; and
(j) checking for more input test vectors which test the specified circuit, repeating steps (a) through (j) until no test vectors remain to be verified.

21. The method of claim 20 wherein the step (f) circuit further comprises:
checking for the circuit elements within a list of circuit elements for the specified circuit;
popping at least one circuit element from the list of circuit elements for the specified circuit; and
evaluating the at least one circuit element by performing at least one logical operation on at least one first array to form new input and output values for the first array;
comparing previous input and output values in the first array with the new input and output values in the first array structure; and
inserting all fan-out elements into the list of circuit elements for the specified circuit, the fan-out elements being all circuit elements coupled to the output to the at least one circuit element.

22. The method of claim 21 wherein the step (h) circuit further comprises:
checking for the circuit elements within a list of circuit elements for the specified circuit;
popping at least one circuit element from the list of circuit elements for the specified circuit; and
evaluating the at least one circuit element by performing at least one logical operation on at least one second array to form new input and output values for the second array;
comparing previous input and output values in the second array structures with the new input and output values in the second array structures; and
inserting all fan-out elements into the list of circuit elements for the specified circuit, the fan-out elements being all circuit elements coupled to the output of the at least one circuit element.

23. The method of claim 22 further comprising:
computing steady flags from the first and second arrays which are stored in the third array for the at least one circuit element.

24. The method of claim 20 wherein the step (i) further comprises:
(k) setting a detection word to a value of all ones;
(l) computing a FLAG word for detecting a valid transition at a head of a circuit path;
(m) performing bitwise ANDing of the FLAG word with the detection word to get a result and storing the result in the detection word;
(n) checking if the detection word has a value of zero to determine if the path in the specified circuit is untestable;
(o) checking for more circuit elements in the circuit path, and determining a selected circuit element by selecting a circuit element from the circuit path if more circuit elements are along the circuit path;
(p) setting the FLAG word to a value of zero if more circuit elements are in the circuit path to determine if an output for an element along the circuit path is valid for the circuit path;
(q) setting a TOKEN word to a value of all ones if the selected circuit element has more inputs than the input on the circuit path;
(r) checking for other inputs to the selected circuit element which are not on the circuit path;
(s) computing a MASK word for an input for the selected circuit element which is not directly on the circuit path if other inputs exists other than the input on the circuit path;
(t) performing bitwise ANDing with the MASK word and the TOKEN word;
(u) repeating steps (s) and (t) until all inputs to the selected circuit element which are not on the circuit path have been accessed;
(v) performing bitwise ORing with the TOKEN word and the FLAG word to determine if the output of the selected circuit element from the list of circuit elements is valid;
(w) repeating steps (m) through (w) until no more circuit elements are left in the list of circuit elements; and
(x) using the detection word to determine which test vectors detect path delay faults along the circuit path.

25. The method of claim 20 wherein the specific circuit contains a custom logic block which is tested by the test vectors.

* * * * *

UNITED STATES PATENT AND TRADEMARK OFFICE
CERTIFICATE OF CORRECTION

PATENT NO. : 5,600,787
DATED : February 4, 1997
INVENTOR(S) : Wilburn C. Underwood; Haluk Konuk; Wai-on Law; Sungho Kang It is certified that error appears in the above-indentified patent and that said Letters Patent is hereby corrected as shown below:

Column 42, line 52: Change "grater" to --greater--

Signed and Sealed this

Twenty-third Day of September, 1997

Attest:

BRUCE LEHMAN

*Attesting Officer*  *Commissioner of Patents and Trademarks*